(12) United States Patent
Terada et al.

(10) Patent No.: US 9,924,202 B2
(45) Date of Patent: Mar. 20, 2018

(54) IMAGE CODING METHOD, IMAGE DECODING METHOD, IMAGE CODING APPARATUS, IMAGE DECODING APPARATUS, AND IMAGE CODING AND DECODING APPARATUS

(71) Applicant: Velos Media, LLC, Plano, TX (US)

(72) Inventors: Kengo Terada, Osaka (JP); Takahiro Nishi, Nara (JP); Youji Shibahara, Tokyo (JP); Kyoko Tanikawa, Osaka (JP); Hisao Sasai, Osaka (JP); Toshiyasu Sugio, Osaka (JP); Toru Matsunobu, Osaka (JP)

(73) Assignee: VELOS MEDIA, LLC, Plano, TX (US)

( * ) Notice: Subject to any disclaimer, the term of this patent is extended or adjusted under 35 U.S.C. 154(b) by 0 days.

(21) Appl. No.: 15/373,818

(22) Filed: Dec. 9, 2016

(65) Prior Publication Data

US 2017/0094318 A1 Mar. 30, 2017

Related U.S. Application Data

(60) Continuation of application No. 14/927,961, filed on Oct. 30, 2015, now Pat. No. 9,596,487, which is a
(Continued)

(51) Int. Cl.
*H04N 7/18* (2006.01)
*H04N 19/91* (2014.01)
(Continued)

(52) U.S. Cl.
CPC .......... *H04N 19/91* (2014.11); *H03M 7/4006* (2013.01); *H04N 19/176* (2014.11);
(Continued)

(58) Field of Classification Search
CPC ....................................................... H04N 7/18
(Continued)

(56) References Cited

U.S. PATENT DOCUMENTS

2013/0170556 A1* 7/2013 Li .......................... H04N 19/61
375/240.23

FOREIGN PATENT DOCUMENTS

JP 2007-142637 6/2007
JP 2012-023613 2/2012

OTHER PUBLICATIONS

Benjamin Bross et al., "High efficiency video coding (HEVC) text specification draft 7", Joint Collaborative Team on Video Coding (JCT-VC) of ITU-T SG16 WP3 and ISO/IEC JTC1/SC29/WG11, JCTVC-I1003_d4, Ver.5, 9th Meeting: Geneva, CH, Apr. 27-May 7, 2012.
(Continued)

*Primary Examiner* — Andy Rao
(74) *Attorney, Agent, or Firm* — Nixon & Vanderhye P.C.

(57) ABSTRACT

An image coding method using arithmetic coding. The method includes: performing arithmetic coding on a first flag that indicates whether or not an absolute value of a target coefficient in a target coefficient block is greater than 1; and performing arithmetic coding on a second flag that indicates whether or not the absolute value is greater than 2. In the arithmetic coding on the first flag and the arithmetic coding on the second flag, it is determined whether or not an immediately-prior coefficient block that has been coded immediately prior to the target coefficient block includes a coefficient having an absolute value greater than a threshold value. Based on a result of the determination, respective contexts to be used in the arithmetic coding on the first and second flags are selected.

7 Claims, 59 Drawing Sheets

Related U.S. Application Data division of application No. 13/921,257, filed on Jun. 19, 2013, now Pat. No. 9,264,712.

(60) Provisional application No. 61/663,121, filed on Jun. 22, 2012.

(51) Int. Cl.

| | | |
|---|---|---|
| *H04N 19/463* | (2014.01) | |
| *H03M 7/40* | (2006.01) | |
| *H04N 19/60* | (2014.01) | |
| *H04N 19/176* | (2014.01) | |
| *H04N 19/18* | (2014.01) | |
| *H04N 19/46* | (2014.01) | |
| *H04N 19/61* | (2014.01) | |
| *H04N 19/172* | (2014.01) | |

(52) U.S. Cl.
CPC ............. *H04N 19/18* (2014.11); *H04N 19/46* (2014.11); *H04N 19/463* (2014.11); *H04N 19/60* (2014.11); *H04N 19/61* (2014.11); *H04N 19/172* (2014.11)

(58) Field of Classification Search
USPC .......................................... 375/240.2–240.29
See application file for complete search history.

(56) References Cited

OTHER PUBLICATIONS

International Search Report dated Sep. 3, 2013 in International (PCT) Application No. PCT/JP2013/003607.

K. Sharman et al., "CABAC with Arithmetic Context Variables", Joint Collaborative Team on Video Coding (JCT-VC) of ITU-T SG16 WP3 and ISO/IEC JTC1/SC29/WG11, JCTVC-G501, 7th Meeting: Geneva, CH, Nov. 21-30, 2011, pp. 1-9.

Extended European Search Report dated May 28, 2015 in European Application No. 13807769.8.

Nguyen Nguyen et al., "Context Set Selection for Coefficient Level Coding", Joint Collaborative Team on Video Coding (JCT-VC) of ITU-T SG16 WP3 and ISO/IEC JTC1/SC29/WG11, JCTVC-H0404, 8th Meeting: San Jose, CA, USA, Feb. 1-10, 2012, XP030111431.

Chanyul Kim et al., "Simplify Golomb-Rice Parameter Update", Joint Collaborative Team on Video Coding (JCT-VC) of ITU-T SG16 WP3 and ISO/IEC JTC1/SC29/WG11, JCTVC-I0124, 9th Meeting: Geneva, CH, Apr. 27-May 7, 2012, XP030111887.

Wei-Jung Chien et al., "On coefficient level remaining coding", Joint Collaborative Team on Video Coding (JCT-VC) of ITU-T SG16 WP3 and ISO/IEC JTC1/SC29/WG11, JCTVC-I0487, 9th Meeting: Geneva, CH, Apr. 27-May 7, 2012, XP030112250.

Kengo Terada et al., "AhG5: Unification of transformed coefficient counter", Joint Collaborative Team on Video Coding (JCT-VC) of ITU-T SG16 WP3 and ISO/IEC JTC1/SC29/WG11, JCTVC-J0228, WG11 Number: m25554, 10th Meeting: Stockholm, SE, Jul. 11-20, 2012, XP030112590.

Patent Examination Report No. 1 dated Jun. 23, 2016 in Australian Patent Application No. 2013278760.

Office Action dated Aug. 22, 2016 in European Patent Application No. 13807769.8.

Chanyul Kim, "JCTVC-I0124+487_r4_DraftChange," No. JCTVC-I0124, May 11, 2012, XP055295098.

\* cited by examiner

FIG. 12

| Context Set Number | 0 | | | | 1 | | | | 2 | | | | 3 | | | |
|---|---|---|---|---|---|---|---|---|---|---|---|---|---|---|---|---|
| Context Offset | 0 | 1 | 2 | 3 | 0 | 1 | 2 | 3 | 0 | 1 | 2 | 3 | 0 | 1 | 2 | 3 |
| Context Number | 0 | 1 | 2 | 3 | 4 | 5 | 6 | 7 | 8 | 9 | 10 | 11 | 12 | 13 | 14 | 15 |

FIG. 15A

| remaining | cParam 0 Prefix | cParam 0 Suffix | cParam 0 bin length | cParam 1 Prefix | cParam 1 Suffix | cParam 1 bin length |
|---|---|---|---|---|---|---|
| 0 | 0 | | 1 | 0 | 0 | 2 |
| 1 | 10 | | 2 | 0 | 1 | 2 |
| 2 | 110 | | 3 | 10 | 0 | 3 |
| 3 | 1110 | | 4 | 10 | 1 | 3 |
| 4 | 11110 | | 5 | 110 | 0 | 4 |
| 5 | 111110 | | 6 | 110 | 1 | 4 |
| 6 | 1111110 | | 7 | 1110 | 0 | 5 |
| 7 | 11111110 | | 8 | 1110 | 1 | 5 |
| 8 | 111111110 | | 9 | 11110 | 0 | 6 |
| 9 | 1111111110 | 0 | 11 | 11110 | 1 | 6 |
| 10 | 1111111110 | 1 | 11 | 111110 | 0 | 7 |
| 11 | 11111111110 | 0 | 13 | 111110 | 1 | 7 |
| 12 | 11111111110 | 0 | 13 | 1111110 | 0 | 8 |
| 13 | 11111111110 | 10 | 13 | 1111110 | 1 | 8 |
| 14 | 11111111110 | 11 | 13 | 11111110 | 0 | 9 |
| 15 | 111111111110 | 000 | 15 | 11111110 | 1 | 9 |
| 16 | 111111111110 | 001 | 15 | 111111110 | 0 | 10 |
| 17 | 111111111110 | 010 | 15 | 111111110 | 1 | 10 |
| 18 | 111111111110 | 011 | 15 | 1111111110 | 0 | 12 |
| 19 | 111111111110 | 100 | 15 | 1111111110 | 0 | 12 |
| 20 | 111111111110 | 101 | 15 | 1111111110 | 10 | 12 |
| 21 | 111111111110 | 110 | 15 | 1111111110 | 11 | 12 |
| 22 | 111111111110 | 111 | 15 | 11111111110 | 000 | 14 |
| 23 | 1111111111110 | 0000 | 17 | 11111111110 | 001 | 14 |
| 24 | 1111111111110 | 0001 | 17 | 11111111110 | 010 | 14 |
| 25 | 1111111111110 | 0010 | 17 | 11111111110 | 011 | 14 |
| 26 | 1111111111110 | 0011 | 17 | 11111111110 | 100 | 14 |
| 27 | 1111111111110 | 0100 | 17 | 11111111110 | 101 | 14 |
| 28 | 1111111111110 | 0101 | 17 | 11111111110 | 110 | 14 |
| 29 | 1111111111110 | 0110 | 17 | 11111111110 | 111 | 14 |
| 30 | 1111111111110 | 0111 | 17 | 111111111110 | 0000 | 16 |
| 31 | 1111111111110 | 1000 | 17 | 111111111110 | 0001 | 16 |
| 32 | 1111111111110 | 1001 | 17 | 111111111110 | 0010 | 16 |
| 33 | 1111111111110 | 1010 | 17 | 111111111110 | 0011 | 16 |
| 34 | 1111111111110 | 1011 | 17 | 111111111110 | 0100 | 16 |
| 35 | 1111111111110 | 1100 | 17 | 111111111110 | 0101 | 16 |
| 36 | 1111111111110 | 1101 | 17 | 111111111110 | 0110 | 16 |
| 37 | 1111111111110 | 1110 | 17 | 111111111110 | 0111 | 16 |
| 38 | 1111111111110 | 1111 | 17 | 111111111110 | 1000 | 16 |
| 39 | 11111111111110 | 00000 | 19 | 111111111110 | 1001 | 16 |
| 40 | 11111111111110 | 00001 | 19 | 111111111110 | 1010 | 16 |
| 41 | 11111111111110 | 00010 | 19 | 111111111110 | 1011 | 16 |
| 42 | 11111111111110 | 00011 | 19 | 111111111110 | 1100 | 16 |
| 43 | 11111111111110 | 00100 | 19 | 111111111110 | 1101 | 16 |
| 44 | 11111111111110 | 00101 | 19 | 111111111110 | 1110 | 16 |
| 45 | 11111111111110 | 00110 | 19 | 111111111110 | 1111 | 16 |
| 46 | 11111111111110 | 00111 | 19 | 1111111111110 | 00000 | 18 |
| 47 | 11111111111110 | 01000 | 19 | 1111111111110 | 00001 | 18 |
| 48 | 11111111111110 | 01001 | 19 | 1111111111110 | 00010 | 18 |

| remaining | cParam 2 | | | cParam 3 | | |
|---|---|---|---|---|---|---|
| | Prefix | Suffix | bin length | Prefix | Suffix | bin length |
| 0 | 0 | 00 | 3 | 0 | 000 | 4 |
| 1 | 0 | 01 | 3 | 0 | 001 | 4 |
| 2 | 0 | 10 | 3 | 0 | 010 | 4 |
| 3 | 0 | 11 | 3 | 0 | 011 | 4 |
| 4 | 10 | 00 | 4 | 0 | 100 | 4 |
| 5 | 10 | 01 | 4 | 0 | 101 | 4 |
| 6 | 10 | 10 | 4 | 0 | 110 | 4 |
| 7 | 10 | 11 | 4 | 0 | 111 | 4 |
| 8 | 110 | 00 | 5 | 10 | 000 | 5 |
| 9 | 110 | 01 | 5 | 10 | 001 | 5 |
| 10 | 110 | 10 | 5 | 10 | 010 | 5 |
| 11 | 110 | 11 | 5 | 10 | 011 | 5 |
| 12 | 1110 | 00 | 6 | 10 | 100 | 5 |
| 13 | 1110 | 01 | 6 | 10 | 101 | 5 |
| 14 | 1110 | 10 | 6 | 10 | 110 | 5 |
| 15 | 1110 | 11 | 6 | 10 | 111 | 5 |
| 16 | 11110 | 00 | 7 | 110 | 000 | 6 |
| 17 | 11110 | 01 | 7 | 110 | 001 | 6 |
| 18 | 11110 | 10 | 7 | 110 | 010 | 6 |
| 19 | 11110 | 11 | 7 | 110 | 011 | 6 |
| 20 | 111110 | 00 | 8 | 110 | 100 | 6 |
| 21 | 111110 | 01 | 8 | 110 | 101 | 6 |
| 22 | 111110 | 10 | 8 | 110 | 110 | 6 |
| 23 | 111110 | 11 | 8 | 110 | 111 | 6 |
| 24 | 1111110 | 00 | 9 | 1110 | 000 | 7 |
| 25 | 1111110 | 01 | 9 | 1110 | 001 | 7 |
| 26 | 1111110 | 10 | 9 | 1110 | 010 | 7 |
| 27 | 1111110 | 11 | 9 | 1110 | 011 | 7 |
| 28 | 11111110 | 00 | 10 | 1110 | 100 | 7 |
| 29 | 11111110 | 01 | 10 | 1110 | 101 | 7 |
| 30 | 11111110 | 10 | 10 | 1110 | 110 | 7 |
| 31 | 11111110 | 11 | 10 | 1110 | 111 | 7 |
| 32 | 111111110 | 00 | 11 | 11110 | 000 | 8 |
| 33 | 111111110 | 01 | 11 | 11110 | 001 | 8 |
| 34 | 111111110 | 10 | 11 | 11110 | 010 | 8 |
| 35 | 111111110 | 11 | 11 | 11110 | 011 | 8 |
| 36 | 1111111110 | 000 | 13 | 11110 | 100 | 8 |
| 37 | 1111111110 | 001 | 13 | 11110 | 101 | 8 |
| 38 | 1111111110 | 010 | 13 | 11110 | 110 | 8 |
| 39 | 1111111110 | 011 | 13 | 11110 | 111 | 8 |
| 40 | 1111111110 | 100 | 13 | 111110 | 000 | 9 |
| 41 | 1111111110 | 101 | 13 | 111110 | 001 | 9 |
| 42 | 1111111110 | 110 | 13 | 111110 | 010 | 9 |
| 43 | 1111111110 | 111 | 13 | 111110 | 011 | 9 |
| 44 | 11111111110 | 0000 | 15 | 111110 | 100 | 9 |
| 45 | 11111111110 | 0001 | 15 | 111110 | 101 | 9 |
| 46 | 11111111110 | 0010 | 15 | 111110 | 110 | 9 |
| 47 | 11111111110 | 0011 | 15 | 111110 | 111 | 9 |
| 48 | 11111111110 | 0100 | 15 | 1111110 | 100 | 10 |
| ⋮ | | | | | | |

FIG. 15C

| remaining | cParam 4 Prefix | Suffix | bin length |
|---|---|---|---|
| 0 | 0 | 000 | 5 |
| 1 | 0 | 0001 | 5 |
| 2 | 0 | 0010 | 5 |
| 3 | 0 | 0011 | 5 |
| 4 | 0 | 0100 | 5 |
| 5 | 0 | 0101 | 5 |
| 6 | 0 | 0110 | 5 |
| 7 | 0 | 0111 | 5 |
| 8 | 0 | 1000 | 5 |
| 9 | 0 | 1001 | 5 |
| 10 | 0 | 1010 | 5 |
| 11 | 0 | 1011 | 5 |
| 12 | 0 | 1100 | 5 |
| 13 | 0 | 1101 | 5 |
| 14 | 0 | 1110 | 5 |
| 15 | 0 | 1111 | 5 |
| 16 | 10 | 0000 | 6 |
| 17 | 10 | 0001 | 6 |
| 18 | 10 | 0010 | 6 |
| 19 | 10 | 0011 | 6 |
| 20 | 10 | 0100 | 6 |
| 21 | 10 | 0101 | 6 |
| 22 | 10 | 0110 | 6 |
| 23 | 10 | 0111 | 6 |
| 24 | 10 | 1000 | 6 |
| 25 | 10 | 1001 | 6 |
| 26 | 10 | 1010 | 6 |
| 27 | 10 | 1011 | 6 |
| 28 | 10 | 1100 | 6 |
| 29 | 10 | 1101 | 6 |
| 30 | 10 | 1110 | 6 |
| 31 | 10 | 1111 | 6 |
| 32 | 110 | 0000 | 7 |
| 33 | 110 | 0001 | 7 |
| 34 | 110 | 0010 | 7 |
| 35 | 110 | 0011 | 7 |
| 36 | 110 | 0100 | 7 |
| 37 | 110 | 0101 | 7 |
| 38 | 110 | 0110 | 7 |
| 39 | 110 | 0111 | 7 |
| 40 | 110 | 1000 | 7 |
| 41 | 110 | 1001 | 7 |
| 42 | 110 | 1010 | 7 |
| 43 | 110 | 1011 | 7 |
| 44 | 110 | 1100 | 7 |
| 45 | 110 | 1101 | 7 |
| 46 | 110 | 1110 | 7 |
| 47 | 110 | 1111 | 7 |
| 48 | 1110 | 0000 | 8 |
| ⋮ | | | |

FIG. 19

|  | Main | | | HE10 | | |
|---|---|---|---|---|---|---|
|  | AI | RA | LB | AI | RA | LB |
| Embodiment 1 | 0.03 | 0.02 | -0.01 | 0.03 | 0.03 | -0.01 |

|  | Main | | | HE10 | | |
|---|---|---|---|---|---|---|
|  | AI | RA | LB | AI | RA | LB |
| Embodiment 3 | 0.06 | 0.04 | 0.00 | 0.04 | 0.01 | 0.00 |

FIG. 46

| |
|---|
| Video stream (PID=0x1011, Primary video) |
| Audio stream (PID=0x1100) |
| Audio stream (PID=0x1101) |
| Presentation graphics stream (PID=0x1200) |
| Presentation graphics stream (PID=0x1201) |
| Interactive graphics stream (PID=0x1400) |
| Video stream (PID=0x1B00, Secondary video) |
| Video stream (PID=0x1B01, Secondary video) |

FIG. 57

| Corresponding standard | Driving frequency |
|---|---|
| MPEG-4 AVC | 500 MHz |
| MPEG-2 | 350 MHz |
| ⋮ | ⋮ |

IMAGE CODING METHOD, IMAGE DECODING METHOD, IMAGE CODING APPARATUS, IMAGE DECODING APPARATUS, AND IMAGE CODING AND DECODING APPARATUS

FIELD

One or more exemplary embodiments disclosed herein relate to image coding methods and image decoding methods.

BACKGROUND

In recent years, with the rapid advance of digital video apparatus technologies, there have been more opportunities for compression-coding video signals (time-series moving pictures) and recording the resulting video signals to a recording medium such as a Digital Versatile Disc (DVD) or a hard disk or distributing them on the net. An example of image coding standards is H.264/AVC (MPEG-4 AVC). High Efficiency Video Coding (HEVC) standard has recently been examined as a new-generation standard (see Non Patent Literature 1, for example).

CITATION LIST

Non Patent Literature

[Non Patent Literature 1] Joint Collaborative Team on Video Coding (JCT-VC) of ITU-T SG16 WP3 and ISO/IEC JTC1/SC29/WG11 9th Meeting: Geneva, CH, 27 Apr.-7 May 2012 JCTVC-I1003_d4.doc, High efficiency video coding (HEVC) text specification draft 7 http://phenix.it-sudparis.eu/jct/doc_end_user/documents/9_Geneva/wg11/JCTVC-I1003-v5.zip

SUMMARY

Technical Problem

For such image coding method and image decoding method, it has been demanded to reduce a processing amount while suppressing deterioration of coding efficiency.

One non-limiting and exemplary embodiment provides an image coding method and an image decoding method each capable of reducing a processing amount while suppressing deterioration of coding efficiency.

Solution to Problem

In one general aspect, the techniques disclosed here feature an image coding method using arithmetic coding, the image coding method including: performing arithmetic coding on a first flag that indicates whether or not an absolute value of a target coefficient in a target coefficient block is greater than 1; and performing arithmetic coding on a second flag that indicates whether or not the absolute value is greater than 2, wherein, in the performing of the arithmetic coding on the first flag and the performing of the arithmetic coding on the second flag, it is determined whether or not an immediately-prior coefficient block that has been coded immediately prior to the target coefficient block includes a coefficient having an absolute value greater than a threshold value, and a context to be used in the arithmetic coding on the first flag and a context to be used in the arithmetic coding on the second flag are selected based on a result of the determination.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

One non-limiting and exemplary embodiment provides an image coding method and an image decoding method each capable of reducing a processing amount while suppressing deterioration of coding efficiency.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 12 is a table showing an example of context numbers according to Embodiment 1.

FIG. 15A is a table showing an example of correspondence relationships between remaining, prefix, and suffix bin, according to Embodiment 1.

FIG. 15B is a table showing an example of correspondence relationships between remaining, prefix, and suffix bin, according to Embodiment 1.

FIG. 15C is a table showing an example of correspondence relationships between remaining, prefix, and suffix bin, according to Embodiment 1.

FIG. 19 is a table showing evaluation results of the image coding method according to Embodiment 1.

FIG. 46 illustrates a structure of multiplexed data.

FIG. 57 shows an example of a look-up table in which video data standards are associated with driving frequencies.

DESCRIPTION OF EMBODIMENT(S)

Figure 1:
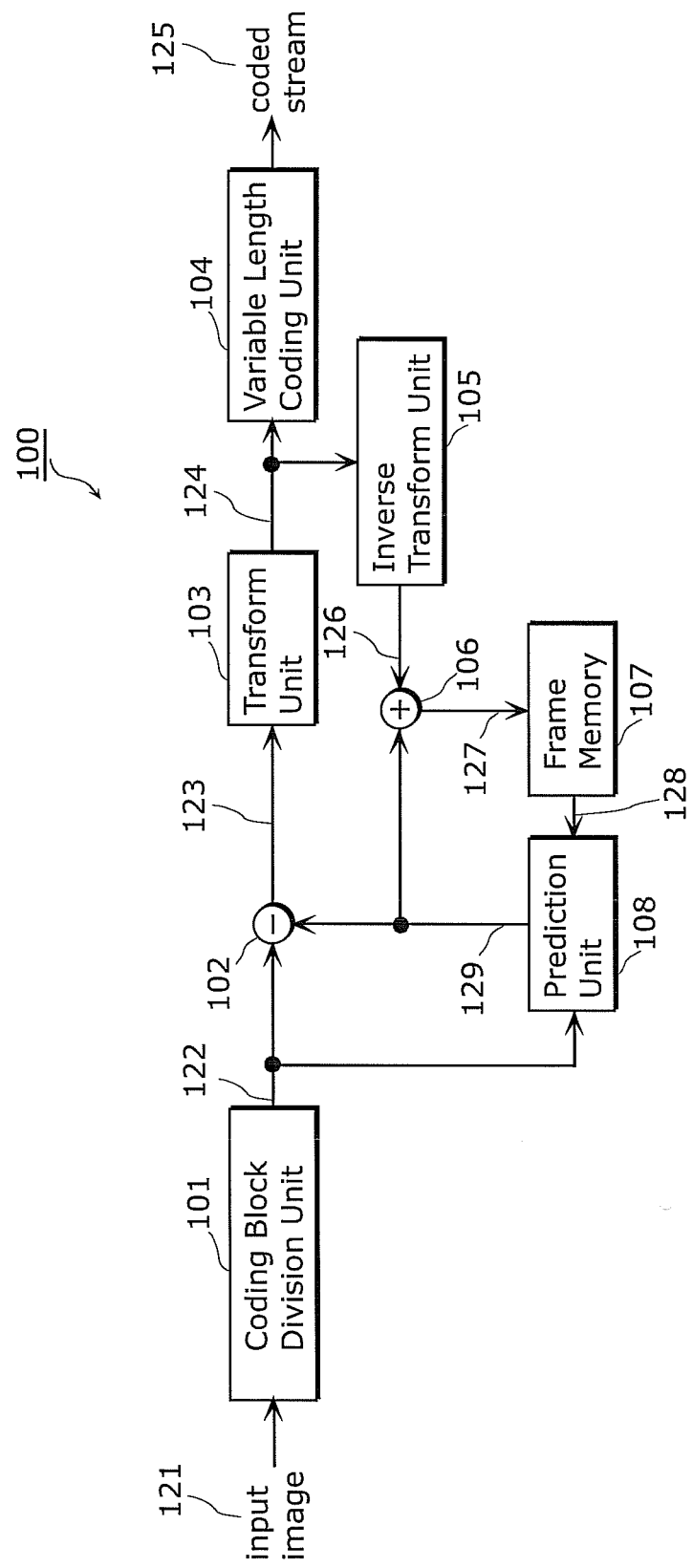
FIG. 1 is a block diagram of an image coding apparatus according to Embodiment 1.

(Underlying Knowledge Forming Basis of the Present Disclosure)

In relation to the conventional image coding method, the inventors have found the following problem.

The image coding method according to the present HEVC standard (see Non Patent Literature 1, for example) includes a step of predicting coded image, a step of calculating a difference between a prediction image and a target image, a step of transforming the resulting differential image into frequency coefficients, and a step of performing arithmetic coding on the frequency coefficients. In the arithmetic coding, coefficients in a coefficient block to be coded (coding coefficient block) are coded sequentially in an order from a higher frequency component to a lower frequency component. Here, a context is selected according to a coded coefficient, and arithmetic coding is performed on a coefficient to be coded (coding coefficient) according to a symbol occurrence probability determined based on the selected context.

In general image, a coefficient with a lower frequency component is likely to have a larger value. It is therefore possible to cause the symbol occurrence probability to have a bias by determining a context with reference to a coded coefficient (a coefficient with a higher frequency than that of the coding coefficient). For example, if a coded coefficient (a coefficient with a higher frequency than that of the coding coefficient) has a large value, there is a high probability that the coding coefficient also has a large value. Therefore, an image coding apparatus can reduce a resulting coding amount by using a context for a large value. In the present HEVC standard, the number of coded coefficients each having an absolute value of 2 or greater is counted, and a context for the coding coefficient is determined according to the number.

However, the inventors have found that the conventional image coding method needs to count the number of coded coefficients each having an absolute value of 2 or greater, and therefore needs to have processing for the counting and a resistor that stores the count value.

In order to solve the above problem, according to an exemplary embodiment disclosed herein, an image coding method using arithmetic coding, the image coding method including: performing arithmetic coding on a first flag that indicates whether or not an absolute value of a target coefficient in a target coefficient block is greater than 1; and performing arithmetic coding on a second flag that indicates whether or not the absolute value is greater than 2, wherein, in the performing of the arithmetic coding on the first flag and the performing of the arithmetic coding on the second flag, it is determined whether or not an immediately-prior coefficient block that has been coded immediately prior to the target coefficient block includes a coefficient having an absolute value greater than a threshold value, and a context to be used in the arithmetic coding on the first flag and a context to be used in the arithmetic coding on the second flag are selected based on a result of the determination.

In this way, the image coding method selects a context according to whether or not the immediately-prior coefficient block includes a coefficient having an absolute value greater than the threshold value. As a result, the image coding method can reduce a processing amount in comparison to the case where a context is selected according to the number of coefficients. In addition, the image coding method can suppress the decrease of coding efficiency and reduce a processing amount.

For example, it is possible that in the performing of the arithmetic coding on the first flag and the performing of the arithmetic coding on the second flag, the determination is made based on a variable generated in arithmetic coding on the immediately-prior coefficient block.

In this ways, the image coding method can reduce a processing amount by performing the text selection based on a variable that has been used in different processing.

For example, it is also possible that the image coding method further includes binarizing a remainder according to a transform table designated by a binarization parameter from among a plurality of transform tables, when the absolute value of the target coefficient is greater than 2, the remainder being a value obtained by subtracting 3 from the absolute value, wherein the binarization parameter is determined according to whether or not the immediately-prior coefficient block includes a coefficient having an absolute value greater than the threshold value, and wherein the variable is the binarization parameter.

For example, it is further possible that the threshold value is 1.

According to another exemplary embodiment disclosed herein, an image decoding method using arithmetic decoding, the image decoding method including: performing arithmetic decoding on a first flag that indicates whether or not an absolute value of a target coefficient in a target coefficient block is greater than 1; and performing arithmetic decoding on a second flag that indicates whether or not the absolute value is greater than 2, wherein, in the performing of the arithmetic decoding on the first flag and the performing of the arithmetic decoding on the second flag, it is determined whether or not an immediately-prior coefficient block that has been decoded immediately prior to the target coefficient block includes a coefficient having an absolute value greater than a threshold value, and a context to be used in the arithmetic decoding on the first flag and a context to be used in the arithmetic decoding on the second flag are selected based on a result of the determination.

In this way, the image decoding method selects a context according to whether or not the immediately-prior coefficient block includes a coefficient having an absolute value greater than the threshold value. As a result, the image decoding method can reduce a processing amount in comparison to the case where a context is selected according to the number of coefficients. In addition, the image decoding method can suppress the decrease of coding efficiency and reduce a processing amount.

For example, it is possible that in the performing of the arithmetic decoding on the first flag and the performing of the arithmetic decoding on the second flag, the determining is made based on a variable generated in arithmetic decoding on the immediately-prior coefficient block.

In this ways, the image decoding method can reduce a processing amount by performing the text selection based on a variable that has been used in different processing.

For example, it is also possible that the image decoding method further includes: transforming a remainder to a multivalue according to a transform table designated by a binarization parameter from among a plurality of transform tables, when the absolute value of the target coefficient is greater than 2, the remainder being a value obtained by subtracting 3 from the absolute value; and determining the binarization parameter according to whether or not the immediately-prior coefficient block includes a coefficient having an absolute value greater than the threshold value, wherein the variable is the binarization parameter.

For example, it is further possible that the threshold value is 1.

According to still another exemplary embodiment disclosed herein, an image coding apparatus that performs arithmetic coding, the image coding apparatus including: control circuitry; and storage accessible from the control circuitry, wherein the control circuitry executes the image coding method according to claim 1.

With this, the image decoding apparatus selects a context according to whether or not the immediately-prior coefficient block includes a coefficient having an absolute value greater than the threshold value. As a result, the image decoding apparatus can reduce a processing amount in comparison to the case where a context is selected according to the number of coefficients. In addition, the image coding apparatus can suppress the decrease of coding efficiency and reduce a processing amount.

According to still another exemplary embodiment disclosed herein, an image decoding apparatus that performs arithmetic decoding, the image decoding apparatus including: control circuitry; and storage accessible from the control circuitry, wherein the control circuitry executes the image decoding method according to claim 5.

With this, the image decoding apparatus selects a context according to whether or not the immediately-prior coefficient block includes a coefficient having an absolute value greater than the threshold value. As a result, the image decoding apparatus can reduce a processing amount in comparison to the case where a context is selected according to the number of coefficients. In addition, the image decoding apparatus can suppress the decrease of coding efficiency and reduce a processing amount.

According to still another exemplary embodiment disclosed herein, an image coding and decoding apparatus includes the above-described image coding apparatus and the above-described image decoding apparatus.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Hereinafter, certain exemplary embodiments of the image coding apparatus and the image decoding apparatus are described with reference to the accompanying Drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Hereinafter, coding sometimes means encoding.

Embodiment 1

In Embodiment 1, an embodiment of an image coding apparatus is described.

<Overall Structure>

FIG. 1 is a block diagram of the structure of the image coding apparatus according to Embodiment 1.

The image coding apparatus 100 shown in FIG. 1 codes input image 121 to generate a coded stream 125 (coded bitstream). The image coding apparatus 100 includes a coding block division unit 101, a subtraction unit 102, a transform unit 103, a variable length coding unit 104, an inverse transform unit 105, an addition unit 106, a frame memory 107, and a prediction unit 108.

<Processing (Overall)>

Figure 2:
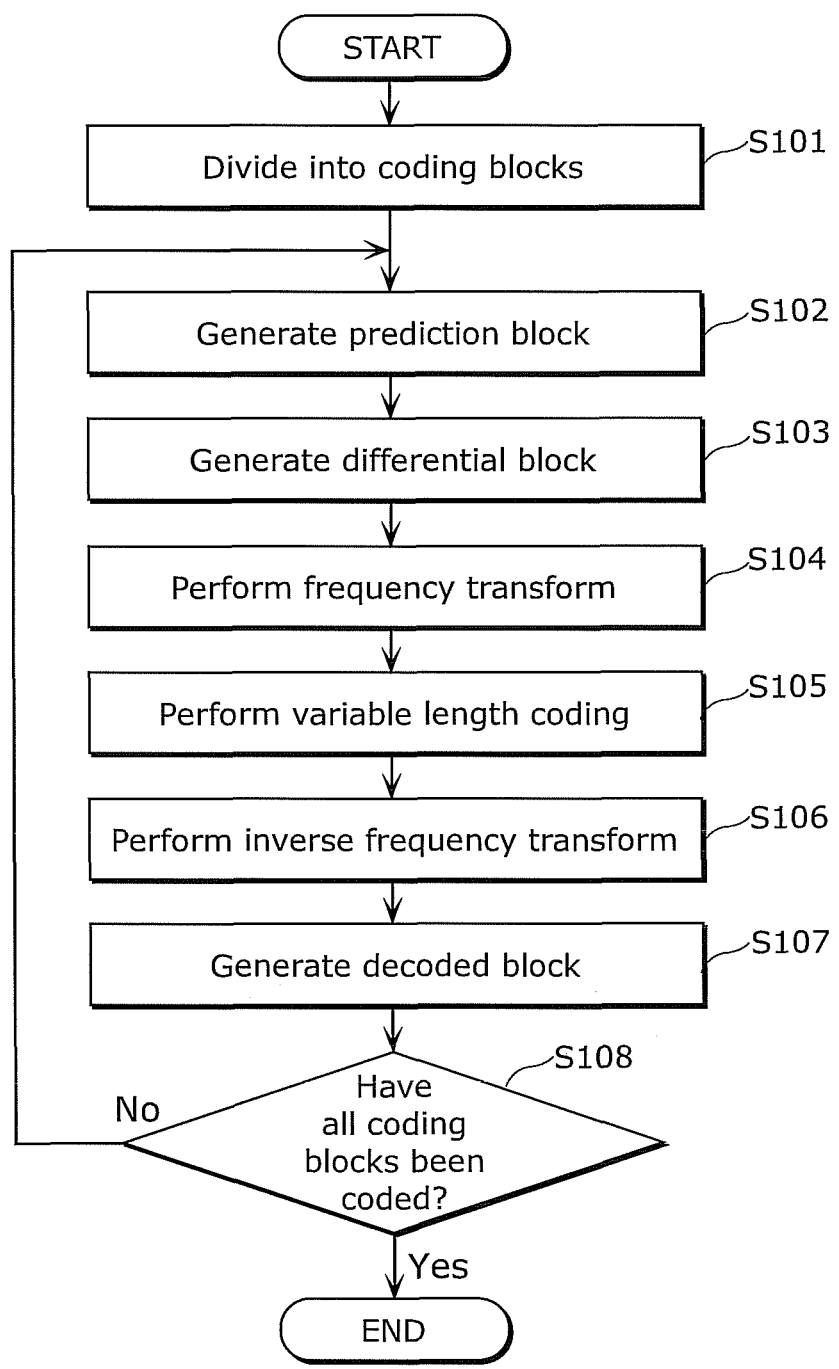
FIG. 2 is a flowchart of image coding according to Embodiment 1.

Next, referring to FIG. 2, an overall flow of the coding is described.

(Step S101)

The coding block division unit 101 divides the input image 121 into blocks to be coded (coding blocks) 122, and sequentially provides the coding blocks 122 to both the subtraction unit 102 and the prediction unit 108. Here, each of the coding blocks 122 has a variable size, and the coding block division unit 101 therefore refers to features of the input image 121 to divide the input image 121 into the coding blocks 122. For example, one coding block 122 has horizontal 4 pixels×vertical 4 pixels at minimum, and horizontal 32 pixels×vertical 32 pixels at maximum.

(Step S102)

The prediction unit 108 generates a prediction block 129 by using a coding block 122 and a decoded image 128 stored in the frame memory 107.

(Step S103)

The subtraction unit 102 generates a differential block 123 that is a difference between the coding block 122 and the prediction block 129.

(Step S104)

The transform unit 103 transforms the differential block 123 to frequency coefficients 124.

(Step S105)

The variable length coding unit 104 performs variable length coding on the frequency coefficients 124 to generate a coded stream 125.

(Step S106)

The inverse transform unit 105 transforms the frequency coefficients 124 to pixel data to reconstruct the differential block 126.

(Step S107)

The addition unit 106 adds the reconstructed differential block 126 and the prediction block 129 together to generate a decoded block 127, and stores, as a decoded image 128, the generated decoded block 127 into the frame memory 107.

(Step S108)

The processing from Step S102 to Step S107 is repeated until all the coding blocks in a target image to be coded have been coded.

The following describes the variable length coding unit 104 in more detail.

<Structure of Variable Length Coding Unit 104>

Figure 3:
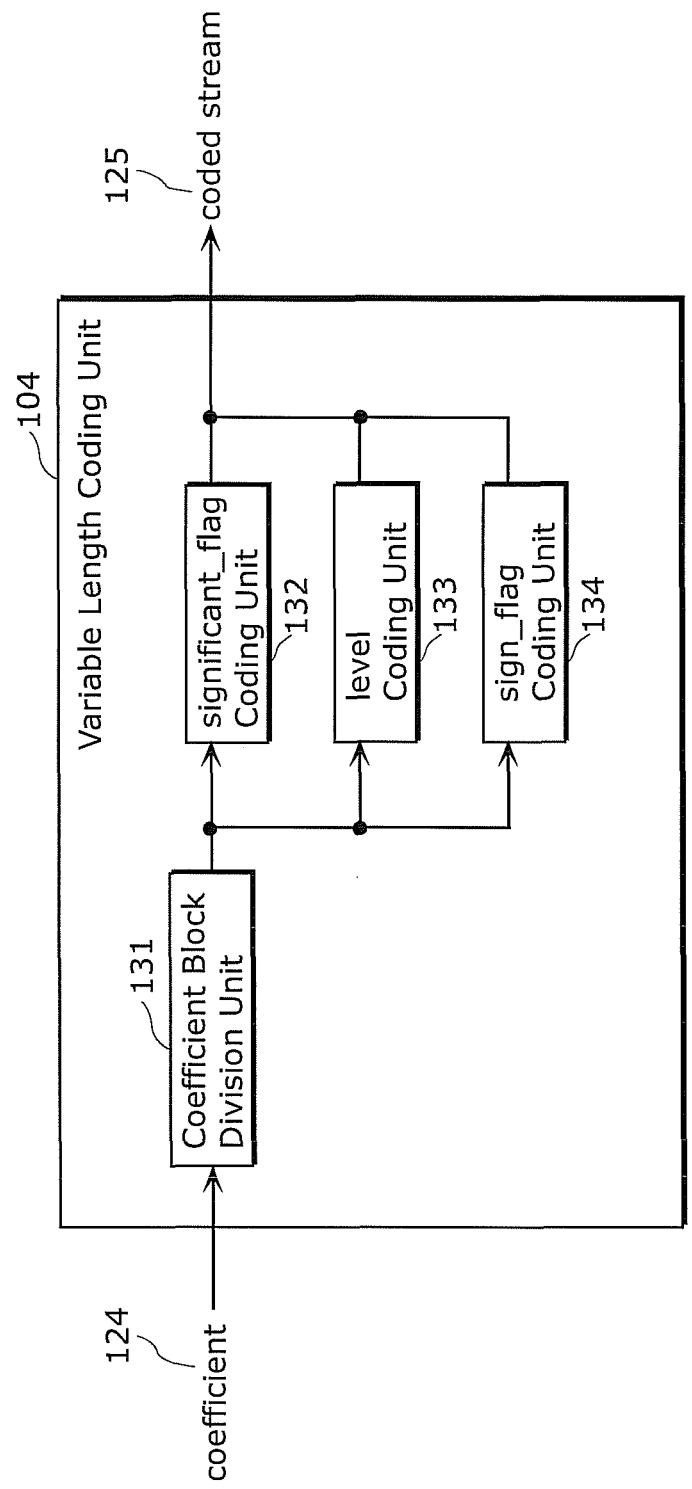
FIG. 3 is a block diagram of a variable length coding unit according to Embodiment 1.

FIG. 3 is a block diagram showing the structure of the variable length coding unit 104.

In the present embodiment, the variable length coding unit 104 codes a target frequency coefficient 124 (hereinafter, referred to also simply as a "coefficient") based on five parameters: significant_flag, greater1_flag, greater2_flag, remaining, and sign_flag.

significant_flag is a flag indicating whether or not a corresponding coefficient is 0. If significant_flag has a value of 0, it means that the coefficient is 0. If significant_flag has a value of 1, it means that the coefficient is not 0.

greater1_flag exists only when significant_flag has a value of 1 (in other words, the coefficient is not 0). greater1_flag indicates whether or not an absolute value of the coefficient is 2 or greater (in other words, greater than 1). If greater1_flag has a vale of 0, it means that the absolute value is 1. If greater1_flag has a vale of 1, it means that the absolute value is 2 or greater.

greater2_flag exists only when greater1_flag has a value of 1 (in other words, the coefficient has an absolute value of 2 or greater). greater2_flag indicates whether or not the absolute value of the coefficient is 3 or greater (in other words, greater than 2). If greater2_flag has a vale of 0, it means that the absolute value is 2. If greater2_flag has a vale of 1, it means that the absolute value is 3 or greater.

remaining exists only when greater2_flag has a value of 1 (in other words, the absolute value is 3 or greater). remaining indicates a value obtained by subtracting 3 from the absolute value.

sign_flag exists only when significant_flag has a value of 1 (in other words, the coefficient is not 0). sign_flag indicates whether or not the coefficient has a negative value (in other words, whether a value of the coefficient is negative or positive). If sign_flag has a value of 0, it means that the coefficient has a positive value. If sign_flag has a value of 1, it means that the coefficient has a negative value.

As shown in FIG. 3, the variable length coding unit 104 includes a coefficient block division unit 131, a significant_flag coding unit 132, a level coding unit 133, and a sign_flag coding unit 134.

The significant_flag coding unit 132 codes significant_flag. The level coding unit 133 codes greater1_flag, greater2_flag, and remaining. The sign_flag coding unit 134 codes sign_flag.

<Processing (Variable Length Coding)>

Figure 4:
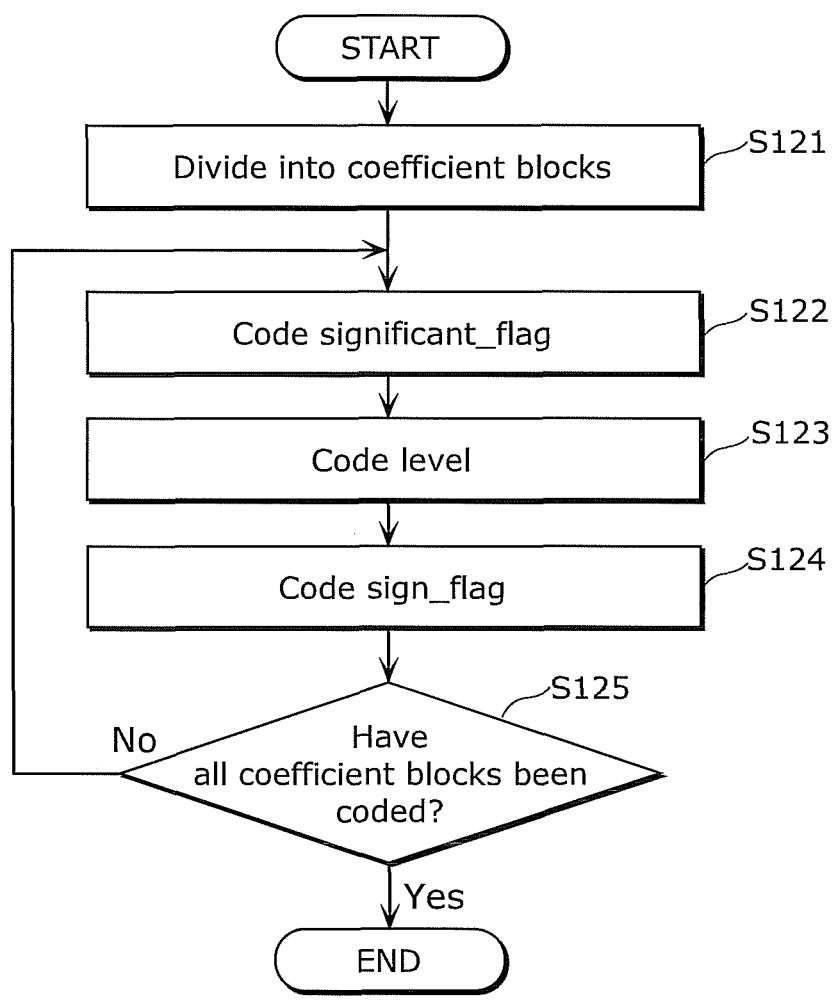
FIG. 4 is a flowchart of variable length coding according to Embodiment 1.

Next, referring to FIG. 4, a flow of variable length coding is described.

(Step S121)

The coefficient block division unit 131 divides a target coding block (frequency coefficients 124) into coefficient blocks each having 4 pixels×4 pixels (hereinafter, referred to also as "4×4 coefficient blocks".) More specifically, when a target coding block has a size of 32×32, the coefficient block division unit 131 divides it horizontally into 8 pieces and vertically into 8 pieces. When a target coding block has a size of 4×4, the coefficient block division unit 131 does not divide such a block. The following processing from Step S122 to Step S124 is performed for each of the coefficient blocks. The coefficient blocks are processed sequentially in an order from a coefficient block having a higher component to a coefficient block having a lower component.

(Step S122)

The significant_flag coding unit 132 codes significant_flag of each of coefficients included in a target coefficient block.

(Step S123)

The level coding unit 133 codes greater1_flag, greater2_flag, and remaining of each of the coefficients included in the target coefficient block.

(Step S124)

The sign_flag coding unit 134 codes sign_flag of each of the coefficients included in the target coefficient block.

(Step S125)

The processing from Step S122 to Step S124 is repeated until all the coefficient blocks in the target coding block have been processed. The following describes the level coding unit 133 in more detail.

<Structure of level Coding Unit 133>

Figure 5:
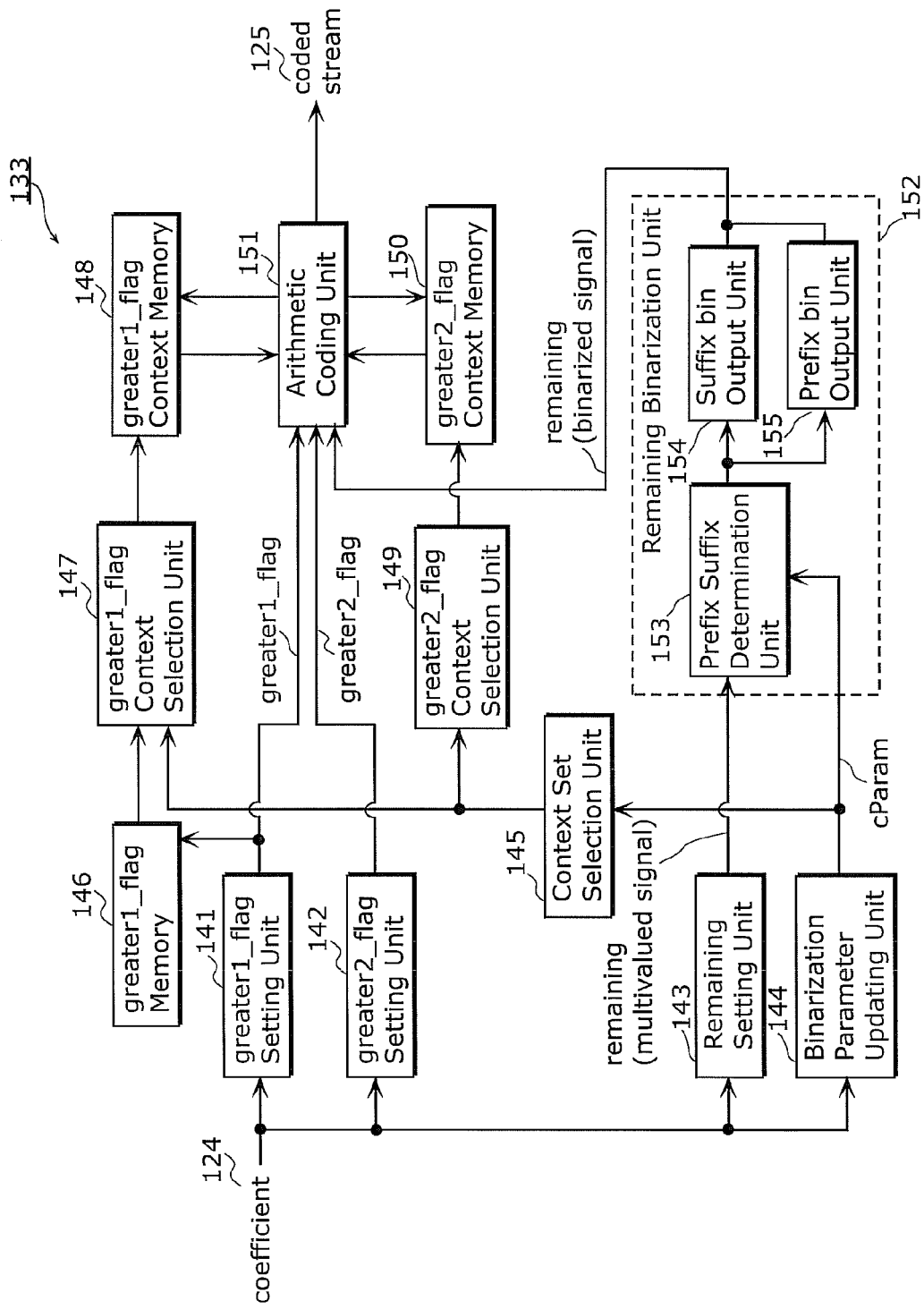
FIG. 5 is a block diagram of a level coding unit according to Embodiment 1.

FIG. 5 is a block diagram showing the structure of the level coding unit 133. As shown in FIG. 5, the level coding unit 133 includes a greater1_flag setting unit 141, a greater2_flag setting unit 142, a remaining setting unit 143, a binarization parameter updating unit 144, a context set selection unit 145, a greater1_flag memory 146, a greater1_flag context selection unit 147, a greater1_flag context memory 148, a greater2_flag context selection unit 149, a greater2_flag context memory 150, an arithmetic coding unit 151, and a remaining binarization unit 152. The remaining binarization unit 152 includes a prefix suffix determination unit 153, a suffix bin output unit 154, and a prefix bin output unit 155.

The level coding unit 133 first selects respective context sets to be used in arithmetic coding on greater1_flag and greater2_flag. Next, the level coding unit 133 codes greater1_flag, greater2_flag, and remaining sequentially in order. Prior to the arithmetic coding, the level coding unit 133 transforms remaining from a multivalued signal to a binarized signal (bin). Here, the level coding unit 133 adaptively changes a length of the binarized signal (bin) based on a binarization parameter (cParam). The level coding unit 133 uses this binarization parameter also to adaptively select the context sets.

<Processing (Level Coding)>

Figure 6:
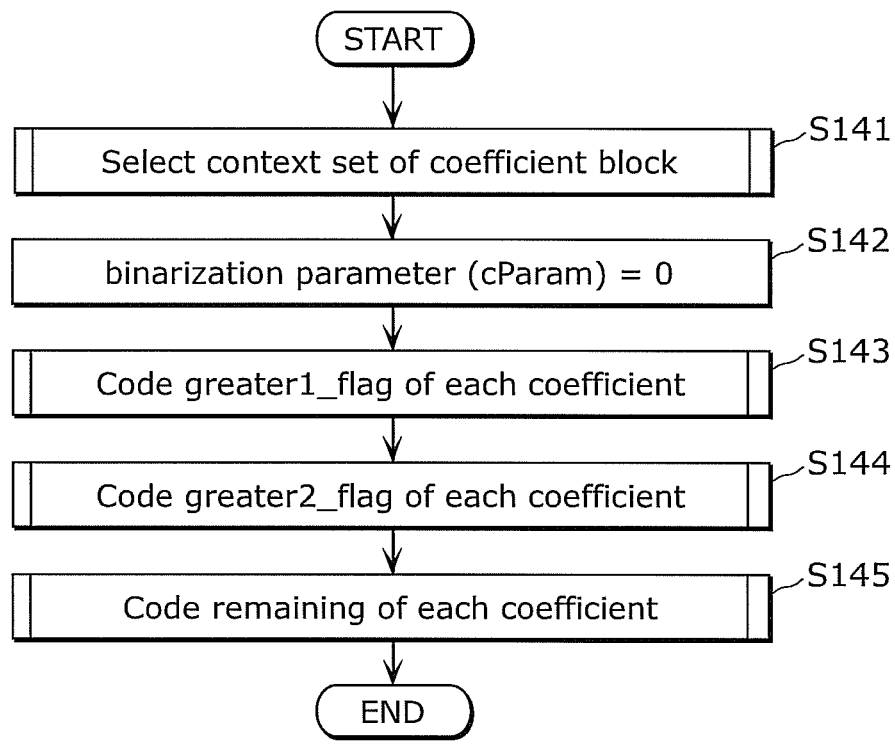
FIG. 6 is a flowchart of level coding according to Embodiment 1.

Next, referring to FIGS. 6 to 9, a flow of the coding performed by the level coding unit 133 is described in more detail. FIG. 6 is a flowchart of the coding performed by the level coding unit 133.

(Step S141)

The context set selection unit 145 sets respective context set numbers to be used in arithmetic coding on greater1_flag and greater2_flag. The step will be described later in more detail.

(Step S142)

The binarization parameter updating unit 144 initializes the binarization parameter (cParam) to 0. At this step, cParam is set to 0 at the beginning of a target 4×4 coefficient block. It should be noted that Steps S141 and S142 are performed once for the target coefficient block. However, the following steps from Step S143 are performed for each of the coefficients.

(Step S143)

Figure 7:
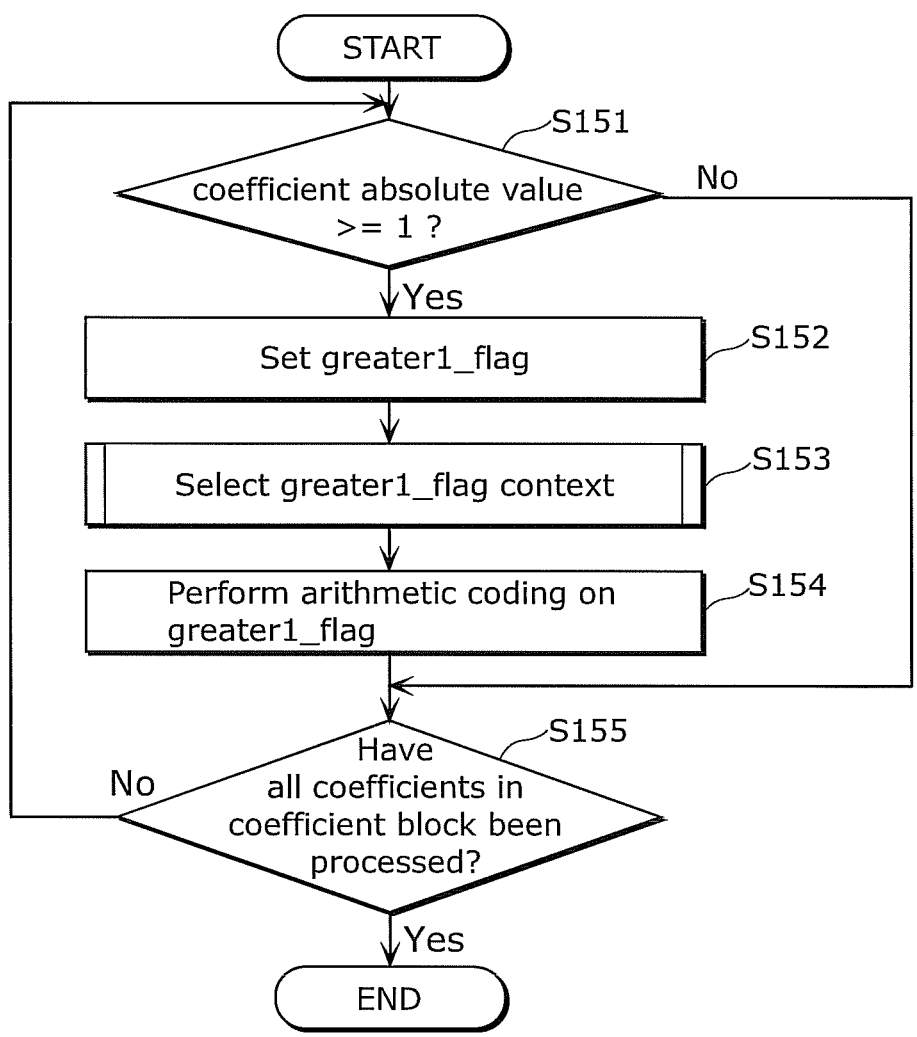
FIG. 7 is a flowchart of greater1_flag coding according to Embodiment 1.

The level coding unit 133 codes greater1_flag of each of coefficients included in a target coefficient block. FIG. 7 is a flowchart of explaining this step in more detail.

(Step S151)

The greater1_flag setting unit 141 determines whether or not an absolute value of a target coefficient (coefficient to be processed) is 1 or greater. If the absolute value is 1 or greater, then greater1_flag is coded at Steps S152 to S154. If the absolute value is 0, greater1_flag is not coded.

(Step S152)

If the absolute value of the target coefficient is 2 or greater, then the greater1_flag setting unit 141 sets greater1_flag to 1. If the absolute value is 1, then the greater1_flag setting unit 141 sets greater1_flag to 0.

(Step S153)

The greater1_flag context selection unit 147 sets a context number based on the context set number selected at Step S141. The step will be described later in more detail.

(Step S154)

The arithmetic coding unit 151 loads a context to be used (using context) from the greater1_flag context memory 148 based on the context number selected at Step S153, and then performs arithmetic coding on greater1_flag by using the context. Furthermore, the arithmetic coding unit 151 stores the context that has been updated in the arithmetic coding back into the same place in the greater1_flag context memory 148.

(Step S155)

The processing from Step S151 to Step S155 is repeated until all the coefficients in the target 4×4 coefficient block have been processed.

As a result, greater1_flag(s) of the respective coefficients in the target coefficient block have been coded.

(Step S144)

Figure 8:
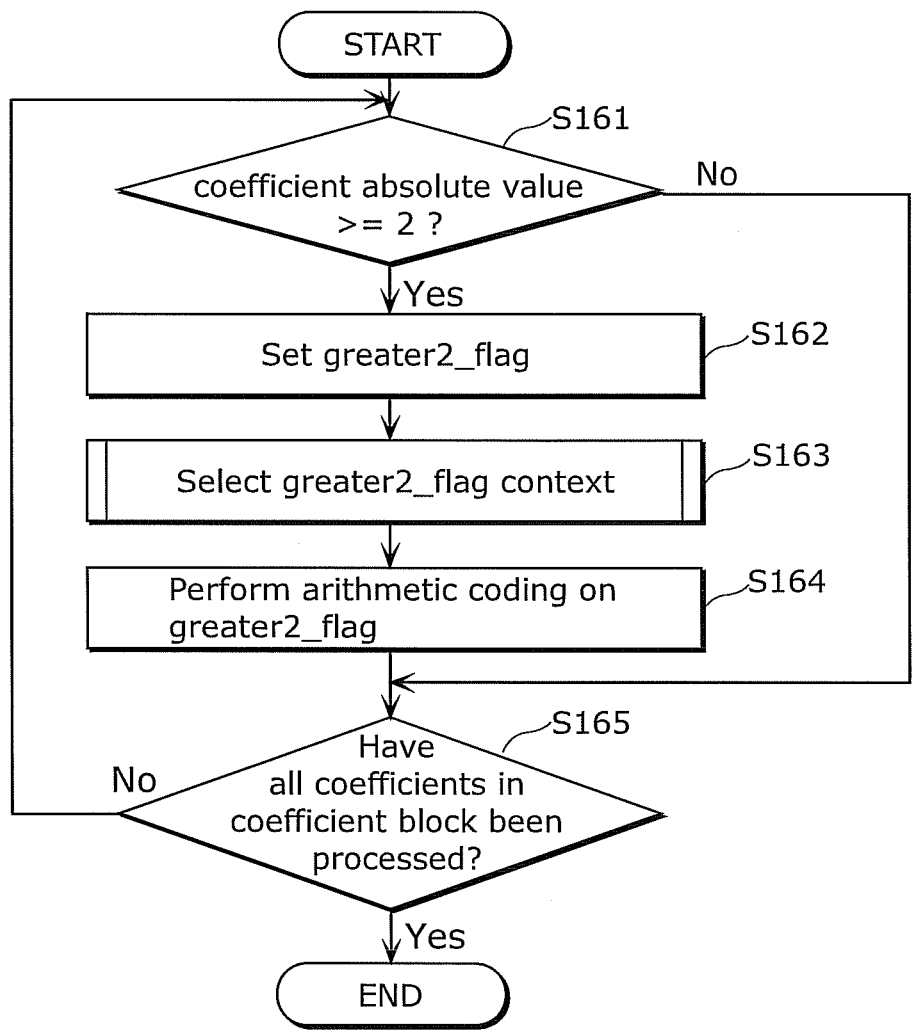
FIG. 8 is a flowchart of greater2_flag coding according to Embodiment 1.

The level coding unit 133 codes greater2_flag of each of coefficients included in a target coefficient block. FIG. 8 is a flowchart of explaining this step in more detail.

(Step S161)

The greater2_flag setting unit 142 determines whether or not an absolute value of a target coefficient is 2 or greater. If the absolute value is 2 or greater, then greater2_flag is coded at Steps S162 to S165. If the absolute value is 1 or smaller, greater2_flag is not coded.

(Step S162)

If the absolute value of the target coefficient is 3 or greater, then the greater2_flag setting unit 142 sets greater2_flag to 1. If the absolute value is 2, then the greater2_flag setting unit 142 sets greater2_flag to 0.

(Step S163)

The greater2_flag context selection unit 149 sets the context set number selected at Step S141 as a context number. Unlike greater1_flag, a context set number for greater2_flag is directly set as a context number. In other words, a single context set for greater2_flag includes only one context.

(Step S164)

The arithmetic coding unit 151 loads a context to be used (using context) from the greater2_flag context memory 150 based on the context number selected at Step S150, and then performs arithmetic coding on greater2_flag by using the context. Furthermore, the arithmetic coding unit 151 stores the context that has been updated in the arithmetic coding back into the same place in the greater2_flag context memory 150.

(Step S165)

The processing from Step S161 to Step S164 is repeated until all the coefficients in the target 4×4 coefficient block have been processed.

As a result, greater2_flag(s) of the respective coefficients in the target coefficient block have been coded.

(Step S145)

Figure 9:
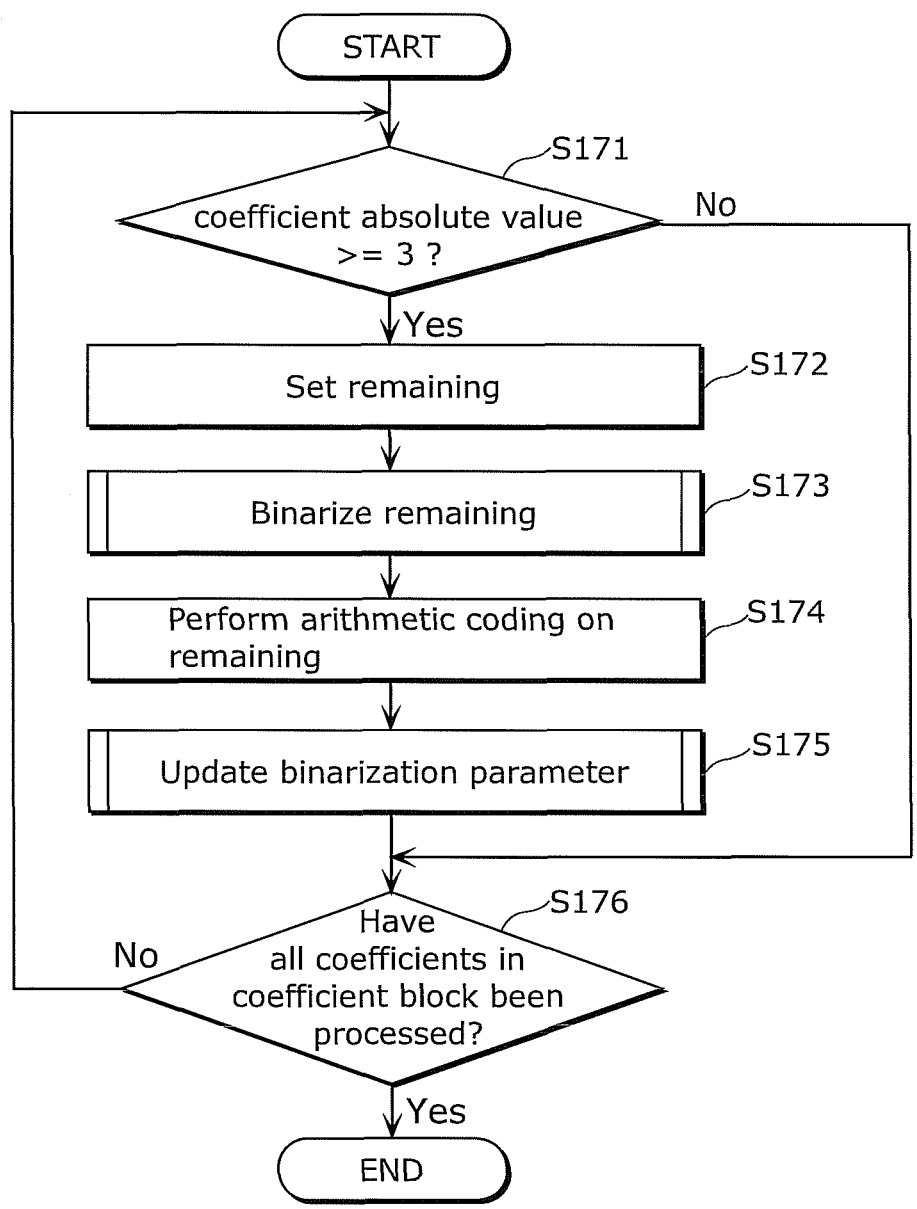
FIG. 9 is a flowchart of remaining coding according to Embodiment 1.

The level coding unit 133 codes remaining in each of coefficients in a target coefficient block. FIG. 9 is a flowchart of explaining this step in more detail.

(Step S171)

The remaining setting unit 143 determines whether or not an absolute value of a target coefficient is 3 or greater. If the absolute value is 3 or greater, then remaining is coded at Steps S172 to S175. If the absolute value is 2 or smaller, remaining is not coded.

(Step S172)

The remaining setting unit 143 calculates a numerical value by subtracting 3 from the absolute value of the target coefficient, and sets the numerical value as remaining (multivalued signal).

(Step S173)

The remaining binarization unit 152 transforms the multivalued signal of remaining to a binarized signal. The step will be described later in more detail.

(Step S174)

The arithmetic coding unit 151 performs arithmetic coding on remaining. Unlike greater1_flag and greater2_flag, remaining is applied with bypass arithmetic coding that does not use any context.

(Step S175)

The binarization parameter updating unit 144 initializes the binarization parameter (cParam). The step will be described later in more detail.

(Step S176)

The processing from Step S171 to Step S175 is repeated until all the coefficients in the target coefficient block have been processed.

<Processing (Context Set Selection)>

Figure 10:
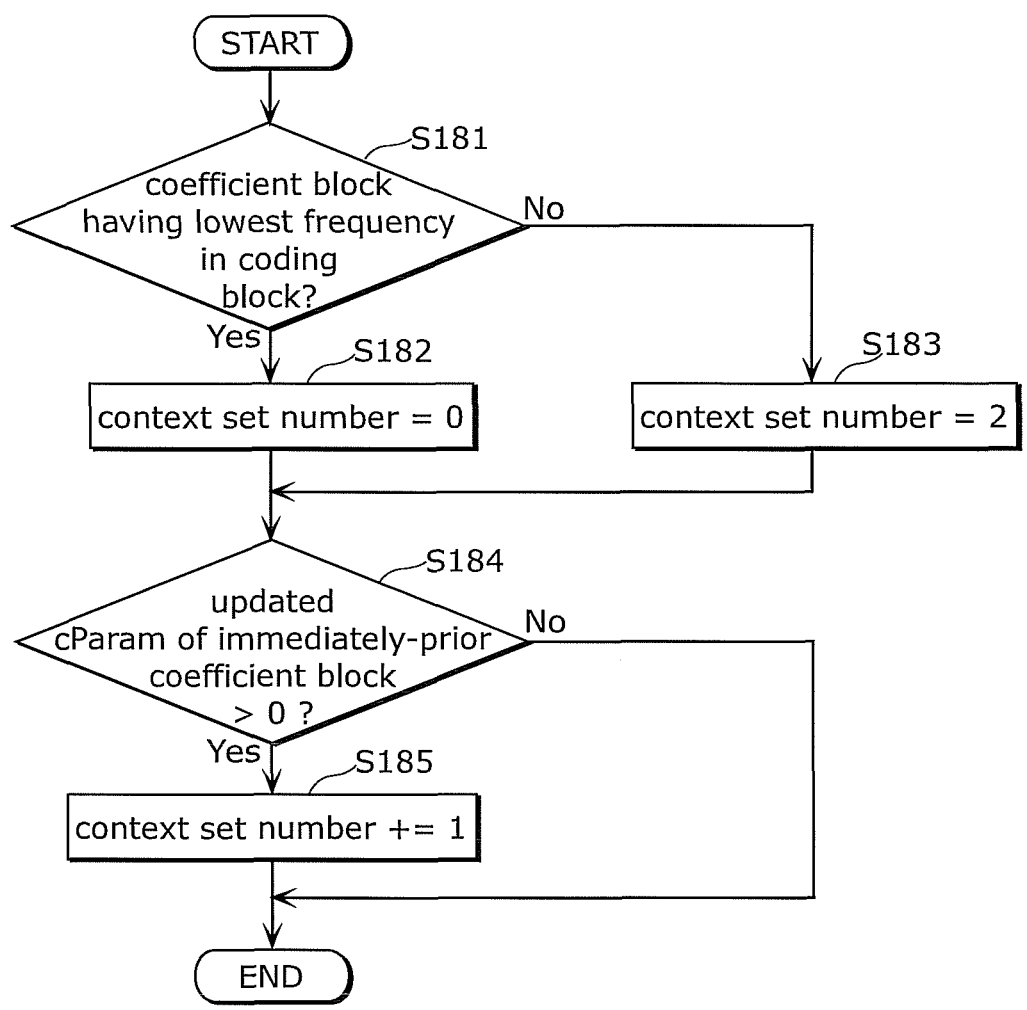
FIG. 10 is a flowchart of context set selection according to Embodiment 1.

Next, referring to FIG. 10, the context set selection (S141 in FIG. 6) is described in more detail.

(Steps S181 to S183)

The context set selection unit 145 determines whether or not a target coefficient block has the lowest frequency in the target coding block. If the target coefficient block has the lowest frequency, then the context set number is set to 0. Otherwise, the context set number is set to 2. More specifically, if the target coefficient block is located at the upper-left corner of the target coding block, then the context set selection unit 145 sets the context set number to 0. Otherwise, the context set number is set to 2.

(Steps S184 and S185)

If an updated binarization parameter (cParam) of a coefficient block (immediately-prior coefficient block), which has been processed immediately prior to the target coefficient block, is greater than 0, then the context set selection unit 145 increments the context set number by 1. Therefore, if cParam has been updated at least once for the immediately-prior coefficient block, the context set is changed.

As described above, at Steps S181 to S185, the context set number has a value ranging from 0 to 3. In other words, there are four kinds of context sets from which the context set selection unit 145 selects one.

<Processing (Greater1_Flag Context Selection)>

Figure 11:
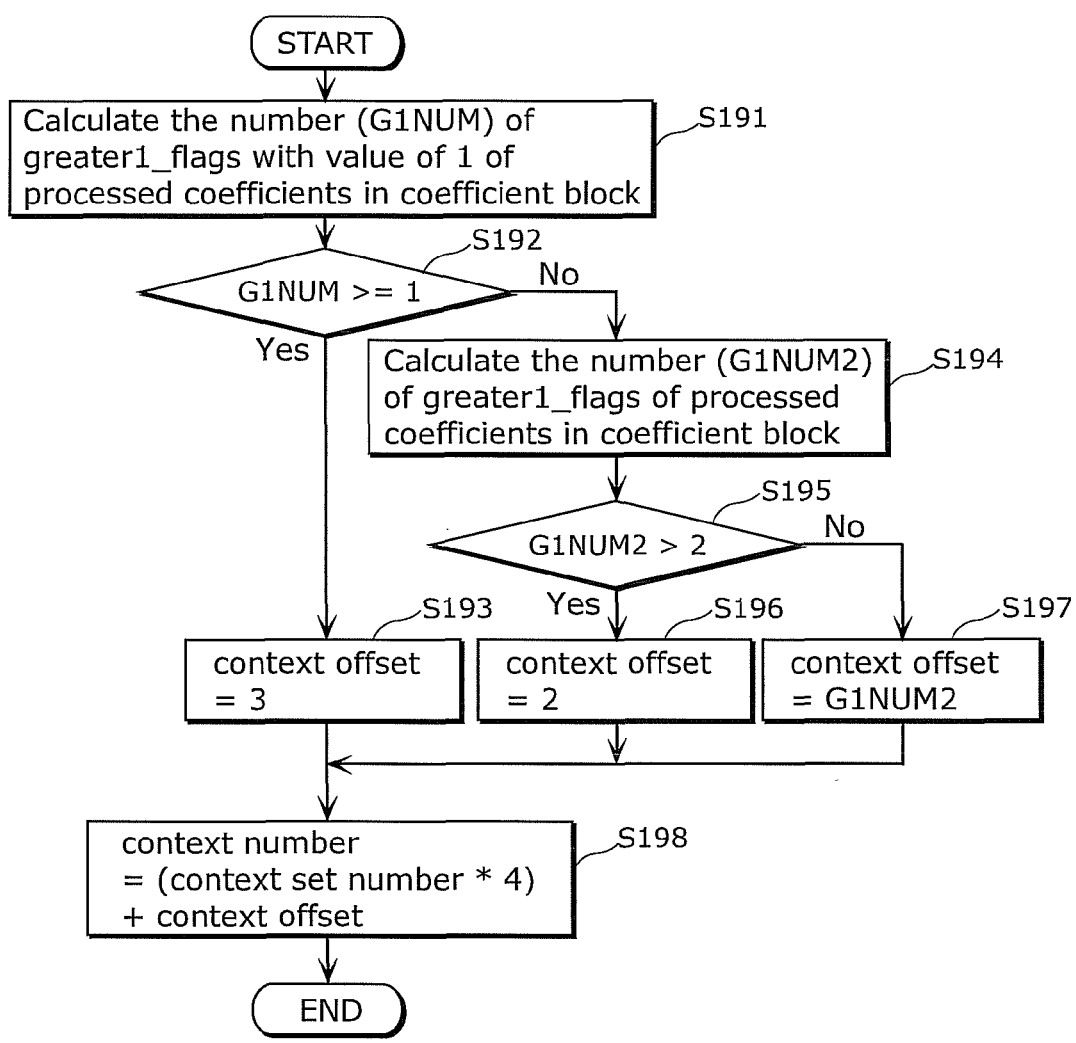
FIG. 11 is a flowchart of greater1_flag context selection according to Embodiment 1.
Figure 13:
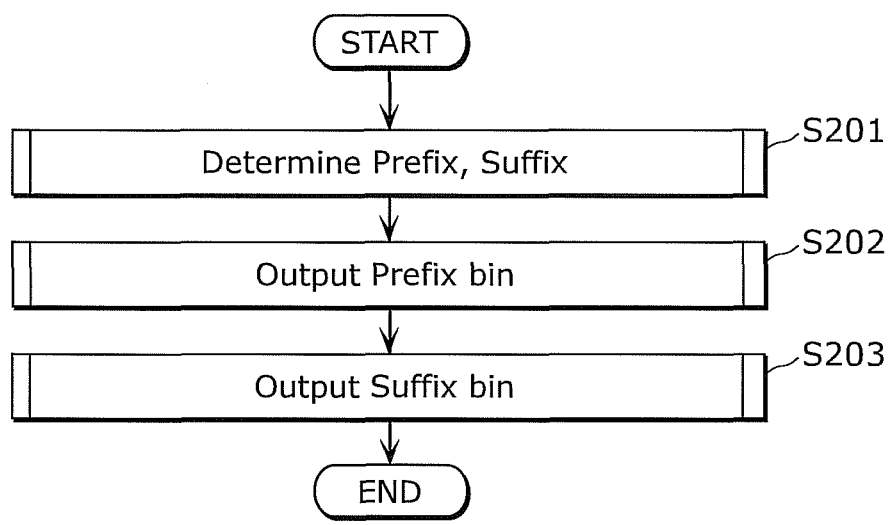
FIG. 13 is a flowchart of remaining binarization according to Embodiment 1.

Next, referring to FIG. 11, the greater1_flag context selection (S153 in FIG. 7) is described in more detail.

(Step S191)

From among coefficients that have been processed in the target coefficient block, the greater1_flag context selection unit 147 counts the number (G1NUM) of greater1_flag(s) with a value of 1. In other words, the greater1_flag context selection unit 147 counts the number of coefficients having an absolute value of 2 or greater. Here, greater1_flag(s) of processed coefficients are stored in the greater1_flag memory 146, so that the greater1_flag context selection unit 147 obtains these greater1_flag(s) from the greater1_flag memory 146.

(Steps S192 to S193)

If G1NUM counted at Step S191 is greater than or equal to 1, then the greater1_flag context selection unit 147 sets a context offset to 3. if G1NUM is 0, then the processing proceeds to Step S194. In other words, when there is at least one processed coefficient having an absolute value of 2 or greater in the target coefficient block, the context offset is set to 3.

(Step S194)

From among the processed coefficients in the target coefficient block, the greater1_flag context selection unit 147 counts the number (G1NUM2) of coefficients having greater1_flag. In other words, the greater1_flag context selection unit 147 counts the number of coefficients having an absolute value of 1 or greater. Here, the greater1_flag context selection unit 147 obtains the greater1_flag(s) of the processed coefficients from the geater1_flag memory 146.

(Steps S195 to S197)

If G1NUM2 counted at Step S194 is greater than 2, then the greater1_flag context selection unit 147 sets the context offset to 2. Otherwise, the greater1_flag context selection unit 147 sets the context offset to the value of G1NUM2.

Thus, at Steps S191 to S197, the context offset is set to a value ranging from 0 to 3.

(Step S198)

The greater1_flag context selection unit 147 sets the context number to "(context set number X 4)+context offset", and then stores the resulting context number to the greater1_flag context memory 148. Since the context set number has a value ranging from 0 to 3 and the context offset has a value ranging from 0 to 3 as seen in FIG. 12, the context number eventually has a value ranging from 0 to 15. In other words, there are four kinds of context sets, and there are four contexts in each of the context sets for greater1_flag. The context set selection unit 145 selects one kind of context set from the four kinds, and the greater1_flag context selection unit 147 selects one of the four contexts in the selected context set.

<Processing (Remaining Binarization)>

Next, referring to FIGS. 13 to 16, the remaining binarization (S173 in FIG. 9) is described in more detail. In summary, a binarized signal (bin) includes prefix and suffix. A method of determining prefix and suffix is changed according to a binarization parameter (cParam).

(Step S201)

Figure 14:
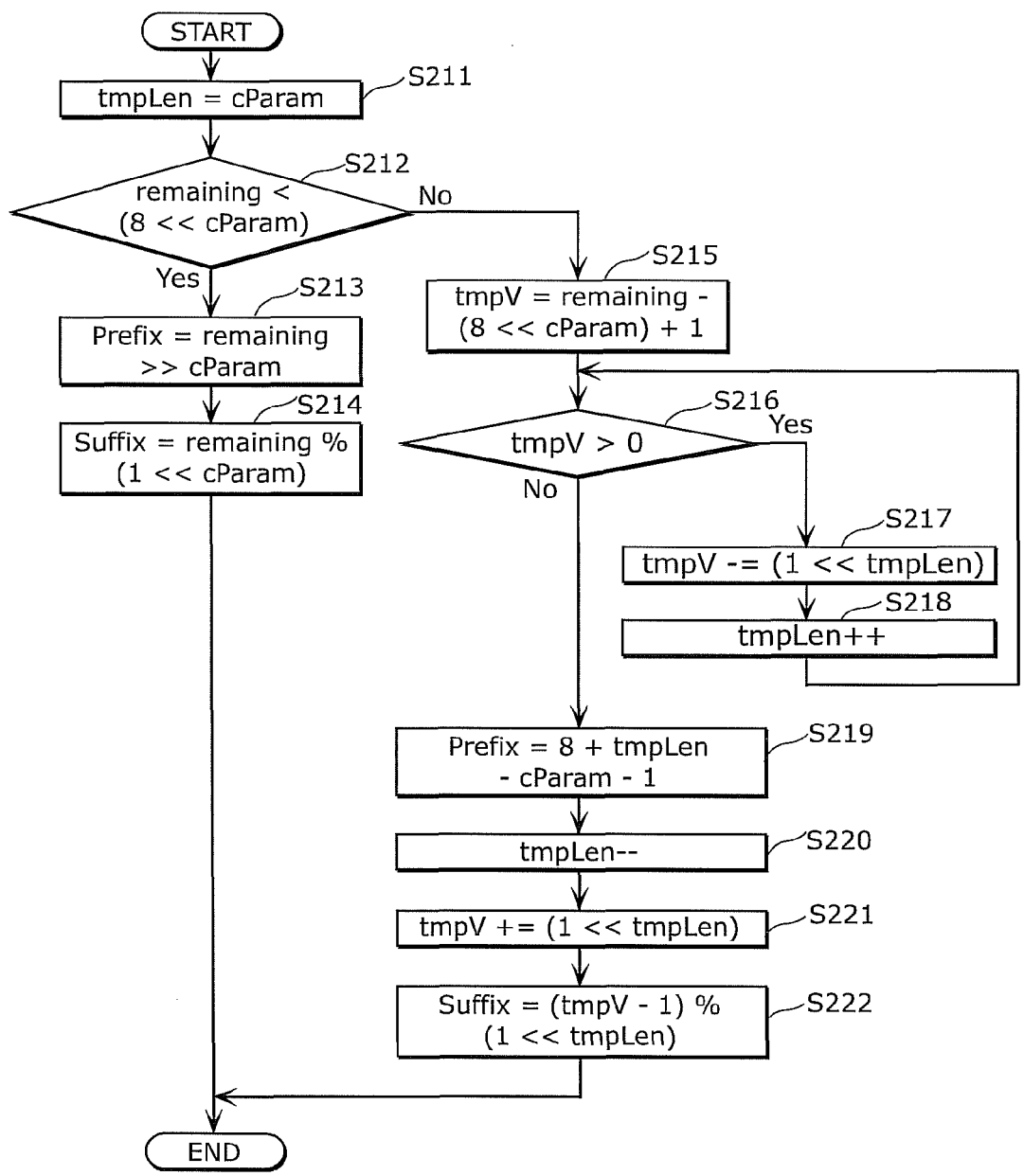
FIG. 14 is a flowchart of prefix and suffix determination according to Embodiment 1.

The prefix suffix determination unit 153 determines prefix and suffix. FIG. 14 is a flowchart of explaining this step in more detail.

(Steps S211 to S222)

The prefix suffix determination unit 153 uses cParam in determining prefix and suffix. The determination processing is classified mainly to the following two ways. If remaining is small, prefix and suffix are determined at Steps S213 and S214. On the other hand, if remaining is large, prefix and suffix are determined at Steps S215 to S222. cParam is used as a threshold value based on which it is determined whether remaining is small or large. As cParam is larger, the threshold value is larger. cParam is related to a bin length of prefix and suffix.

FIGS. 15A to 15C show prefix and suffix bin in association with cParam and remaining. As shown in FIGS. 15A to 15C, if remaining is small, smaller cParam results in a shorter bin length, while if remaining is large, larger cParam results in a shorter bin length. In other words, if remaining would be small, smaller cParam is more likely to increase coding efficiency. On the other hand, if remaining would be large, larger cParam is more likely to increase coding efficiency.

(Step S202)

Figure 16:
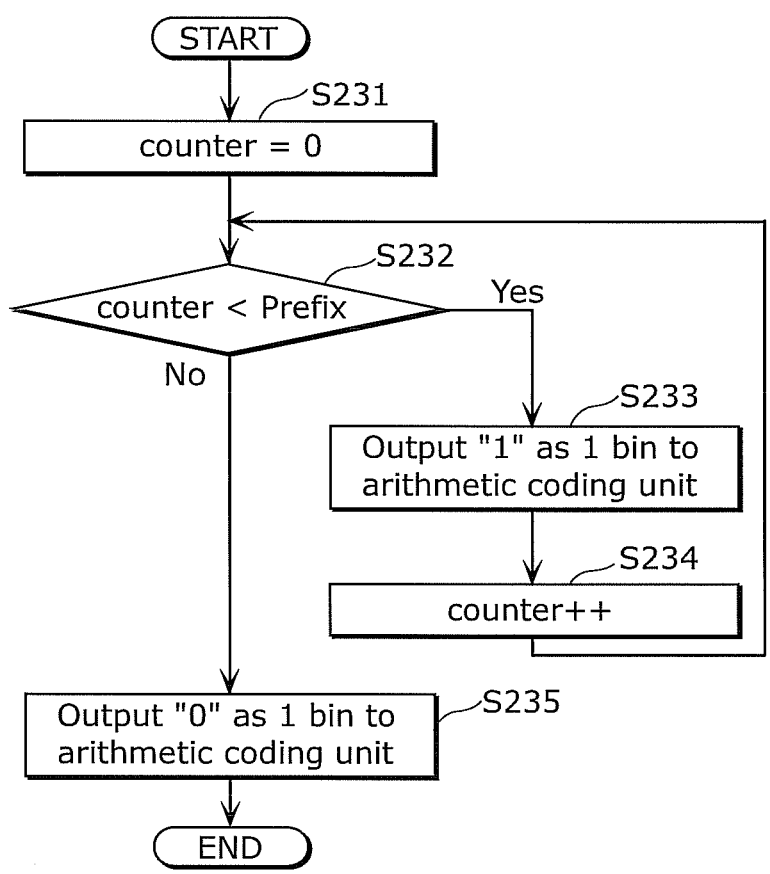
FIG. 16 is a flowchart of prefix bin outputting according to Embodiment 1.

The prefix bin output unit 155 provides bin of prefix to the arithmetic coding unit 151. FIG. 16 is a flowchart of explaining this step in more detail.

(Steps S231 to S235)

The prefix bin output unit 155 first outputs values of "1" in the same number as a value of prefix, and finally outputs a value of "0".

(Step S203)

Figure 17:
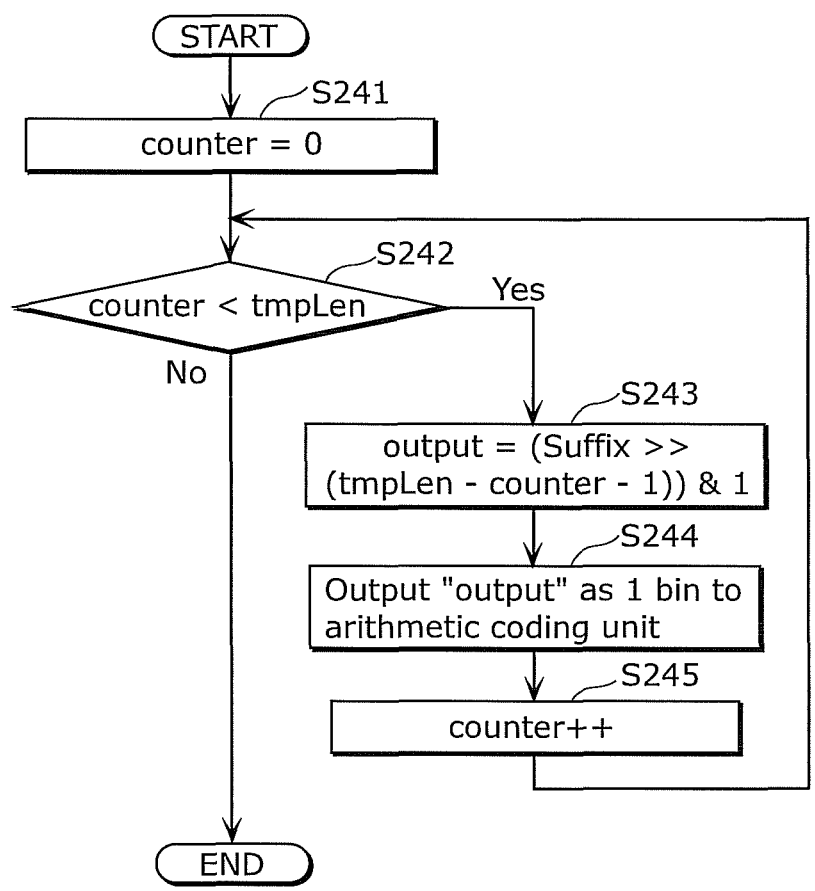
FIG. 17 is a flowchart of suffix bin outputting according to Embodiment 1.

The suffix bin output unit 154 provides bin of suffix to the arithmetic coding unit 151. FIG. 17 is a flowchart of explaining this step in more detail.

(Steps S241 to S245)

The suffix bin output unit 154 transforms a value of suffix into a binary-coded form, and outputs the resulting values in the binary-coded form sequentially in an order from a higher-order bit. The suffix bin output unit 154 outputs bin(s) in the number of tmpLen. Here, if the number of bits of the suffix value is smaller than tmpLen, the highest-order bit is outputted as 0.

<Processing (Binarization Parameter Updating)>

Figure 18:
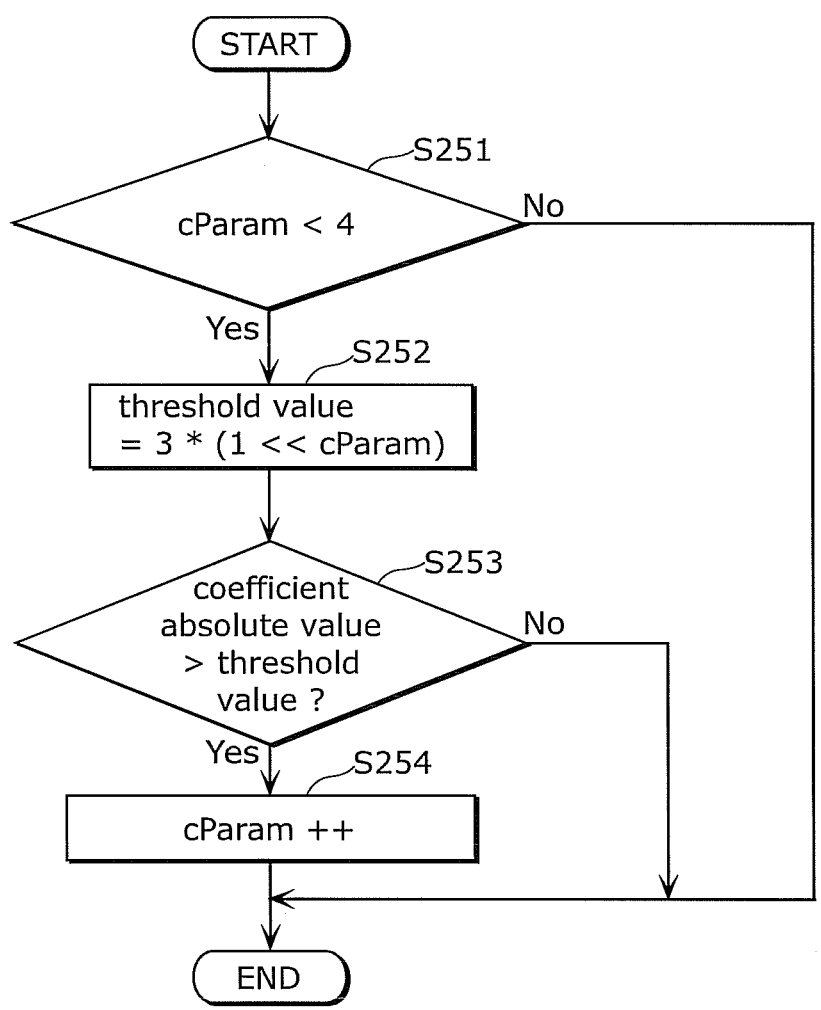
FIG. 18 is a flowchart of binarization parameter updating according to Embodiment 1.

Next, referring to FIG. 18, the binarization parameter updating (S175 in FIG. 9) is described in more detail.

(Step S251)

If the binarization parameter (cParam) is smaller than 4, then the binarization parameter updating unit 144 updates cParam at Steps S252 to S254. If cParam is 4 or greater, then the binarization parameter updating unit 144 does not update cParam and terminates the processing.

(Steps S252 to S254)

If an absolute value of a target coefficient is greater than a threshold value, then the binarization parameter updating unit 144 increments cParam by 1. The threshold value is determined by a mathematical formula "3×(1<<cParam)". "<<" means shift to the left. As cParam has a greater value, the threshold value has a greater value. As described above, cParam is initialized to 0 at the beginning of the processing for the target coefficient block. Every time a coefficient greater than the threshold value appears due to the processing of the binarization parameter updating unit 144, cParam is incremented by 1 until cParam reaches 4 at maximum <Effects>

As described above, in the image coding apparatus 100 according to the present embodiment, if there is a coefficient having an absolute value greater than a threshold value in a target processed coefficient block, a context for greater1_flag and a context for greater2_flag are changed. As a result, it is possible to increase coding efficiency with a small processing amount.

More specifically, a binarization parameter (cParam) is incremented by 1 every time an absolute value of a coefficient greater than the threshold value is found. If, at the beginning of a target coefficient block, a value of cParam that has been updated in processing for an immediately-prior coefficient block is greater than 0, in other words, if the immediately-prior coefficient block includes at least one coefficient greater than the threshold value, then a context set number is changed. More specifically, if there is a coefficient having a large value in an immediately-prior coefficient block (a coefficient block with a higher frequency than that of the target coefficient block), the image coding apparatus 100 determines that there is a high possibility that the target coefficient block also includes a coefficient having a large value. Therefore, a context appropriate for a coefficient having a large value is selected.

In the present HVEC standard (see Non-Patent Literature 1), the number of processed coefficients having an absolute value of 2 or greater is counted, and a context for a target coefficient is determined according to the number. However, the processed coefficients are not limited to coefficients included in the immediately-prior coefficient block. They may be a plurality of coefficients included in a plurality of coefficient blocks which are located closer to a high frequency side than the target coefficient block.

On the other hand, in the technique of the present embodiment, it is not determined whether or not there is a coefficient exceeding a threshold value in an immediately-prior coefficient block. Therefore, the image coding apparatus 100 according to the present embodiment does not need to count the number, nor to have a resistor for storing the count values.

Furthermore, the image coding method according to the present embodiment has been applied to test software of the present HEVC standard for experiments. FIG. 19 shows experiment results in comparison to the state before the application. The experiment conditions are based on common experiment conditions of the HEVC standard group. A larger numerical value indicates lower coding efficiency. A negative value indicates improvement of the coding efficiency. As shown in FIG. 19, each of the values ranges from −0.01% to 0.03%. It means that coding efficiency is hardly affected even if the counting of coefficients is eliminated.

Moreover, by unifying information to be used in selecting contexts and information to be used in coding of remaining, a circuit size is reduced. More specifically, cParam, which is incremented every time an absolute value of a coefficient that is greater than the threshold value is found, is used for changing a binarization parameter of remaining and for selecting a context of greater1_flag and a context of greater2_flag, so that one structure can perform various functions. Thus, in comparison to the present HEVC standard, the image coding method according to the present embodiment can eliminate the counting of coefficients while coding efficiency deterioration is suppressed, without adding a new structure.

It should be noted that it has been described above that a context set is changed based on a binarization parameter (cParam) that has been updated for an immediately-prior coefficient block. However, the image coding apparatus 100 may perform the change based on a binarization parameter that has been updated for a coefficient block different from the immediately-prior coefficient block. It is possible, for example, the image coding apparatus 100 may change a context set when cParam exceeds 0 in processing for any processed coefficient block. Coefficient blocks are processed sequentially in an order from a higher frequency block. Therefore, if cParam of any one of the coefficient blocks exceeds 0, in other words, if a coefficient having an absolute value that is greater than or equal to a threshold value appears, there is a high possibility that all the following coefficient blocks have large coefficient values. In such a case, it is possible to increase coding efficiency by selecting a context set that is to be used for the above possibility.

Furthermore, the image coding apparatus 100 initializes the binarization parameter (cParam) to 0 at the beginning of processing for a target coefficient block. However, it is also possible to keep using cParam updated for an immediately-prior coefficient block, without initializing cParam to 0. This makes it possible to keep using the state of a high-frequency coefficient block. As a result, coding efficiency is sometimes increased depending on input image.

It should also be noted that it has been described above that the image coding apparatus 100 changes a context set when cParam is greater than 0. However, the present embodiment is not limited to the above. It is also possible to change a context set, if cParam is greater than 1 or if cParam is greater than 2, for example. Depending on input image, it is sometimes possible to increase coding efficiency by changing a context set when cParam is greater than 1.

It should also be noted that it has been described above that four kinds of context sets are used, but the present embodiment is not limited to the above. There may be four or more kinds of context sets, or four or less kinds of context sets. For example, although it has been described above that the image coding apparatus 100 increments a context set number by 1 when cParam is greater than 0 whichever the context set number is 0 or 2. However, it is also possible that the context set number is incremented by 1 only when the context set number is 2.

It should also be noted that it has been described above that the image coding apparatus 100 changes a context set when a target coefficient block has the lowest frequency, but the change may be unnecessary. It is also possible that the image coding apparatus 100 increments the context set number by 1 when cParam is greater than 0, and further increments the resulting context set number by 1 when cParam is greater than 1. Depending on input image, coding efficiency may be increased when the number of kinds of context sets is increased. On the other hand, depending on input image, when the number of context sets is decreased, it is possible to decrease kinds of contexts, thereby reducing a circuit size for the selection processing and reducing a memory for storing contexts.

It should also be noted that it has been shown in FIG. 11 that the image coding apparatus 100 sets a context of greater1_flag based on G1NUM and G1NUM2, but the present embodiment is not limited to the above. For example, the image coding apparatus 100 may set a context based on a position of a target coefficient in a target coefficient block, or based on either G1NUM or G1NUM2.

It should also be noted that it has been described above that, in selecting a context for greater2_flag, the image coding apparatus 100 sets a context set number itself as a context number, but the present embodiment is not limited to the above. The image coding apparatus 100 may select a context for greater2_flag by the same technique as used for greater1_flag.

It should also be noted that it has been described above that greater1_flag exists when an absolute value of a target coefficient is 1 or greater and that greater2_flag exists when the absolute value of the target coefficient is 2 or greater. However, it is also possible to limit respective maximum numbers of the flags in a coefficient block in the same manner as the present HEVC standard (Non-Patent Literature 1). It is possible that eight greater1_flag(s) exist at maximum and one greater2_flag exists at maximum.

It should also be noted that it has been described above that, in the remaining binarization of the image coding apparatus 100, prefix and suffix form bin. However, the binarized signal of remaining may be any signal as long as a bin length can be changed based on cParam. For example, the binarized signal of remaining may have only prefix, or may be expressed by the exponent Golomb technique of H.264 moving picture coding standard.

It should also be noted that it has been described above that the last of bin of prefix is set to 0, but the last 0 may be deleted when prefix is maximum. If prefix is not maximum, it is necessary to insert "0" to clarify bin at the boundary of prefix and suffix. However, if an image decoding apparatus knows a maximum value of a coefficient, a maximum value of prefix is obvious. Therefore, if prefix is maximum, the image decoding apparatus can determine the boundary between prefix and suffix without "0". The elimination of the "0" insertion in the case of maximum prefix can significantly shorten a bin length when there are a large number of coefficients with maximum prefix (in other words, when a coding bit rate is high). As a result, coding efficiency is increased.

It has been described above that the threshold value used in updating the binarization parameter (cParam) is set according to the mathematical formula of "3*(1<<cParam)", but the present embodiment is not limited to the above. For example, the image coding apparatus may use other numerical value such as "4" instead of "3" in the mathematical formula, or use other mathematical formula.

It should also be noted that it has been described above that the image coding apparatus uses contexts in arithmetic coding on greater1_flag and greater2_flag for all of the coefficients, but it is also possible that bypass arithmetic coding, which does not use any context, may be performed on greater1_flag or greater2_flag of a part of the coefficients, in the same manner as performed on remaining. For example, if greater1_flag of an immediately-prior coefficient is 1, the image coding apparatus may perform bypass arithmetic coding on greater1_flag of a target coefficient. It is also possible that the image coding apparatus performs bypass arithmetic coding on greater1_flag at the beginning of a target coefficient block. The use of the bypass arithmetic coding can eliminate loading and updating of a context. In addition, the use of the bypass arithmetic coding can eliminate a dependence relationship with other syntax using the same context. As a result, the processing can be performed at a higher speed.

It should also be noted that it has been described above that a coding block has a size of 32 pixels×32 pixels at maximum, and 4 pixels×4 pixels at minimum, but a size of the coding blocks is not limited to the above. It is also possible that the coding blocks have a fixed size.

It should also be noted that it has been described above that a coding block is divided into 4×4 coefficient blocks, but it is not necessary to divide a coding block into coefficient blocks each having 4 pixels×4 pixels. For example, it is also possible to divide a coding block into coefficient blocks each having 8 pixels×8 pixels. A coding block may be divided into rectangular coefficient blocks each having 8 pixels×4 pixels, for example.

Furthermore, the processing according to the present embodiment may be implemented to software. This software may be distributed by downloading or the like. Or, this software may be recorded onto a recording medium such as a CD-ROM to be distributed. The above is applied to the other embodiments in this description.

Embodiment 2

In Embodiment 2, the description is given for an image decoding apparatus that decodes a coded bitstream generated by the image coding apparatus according to Embodiment 1.

<Overall Structure>

Figure 20:
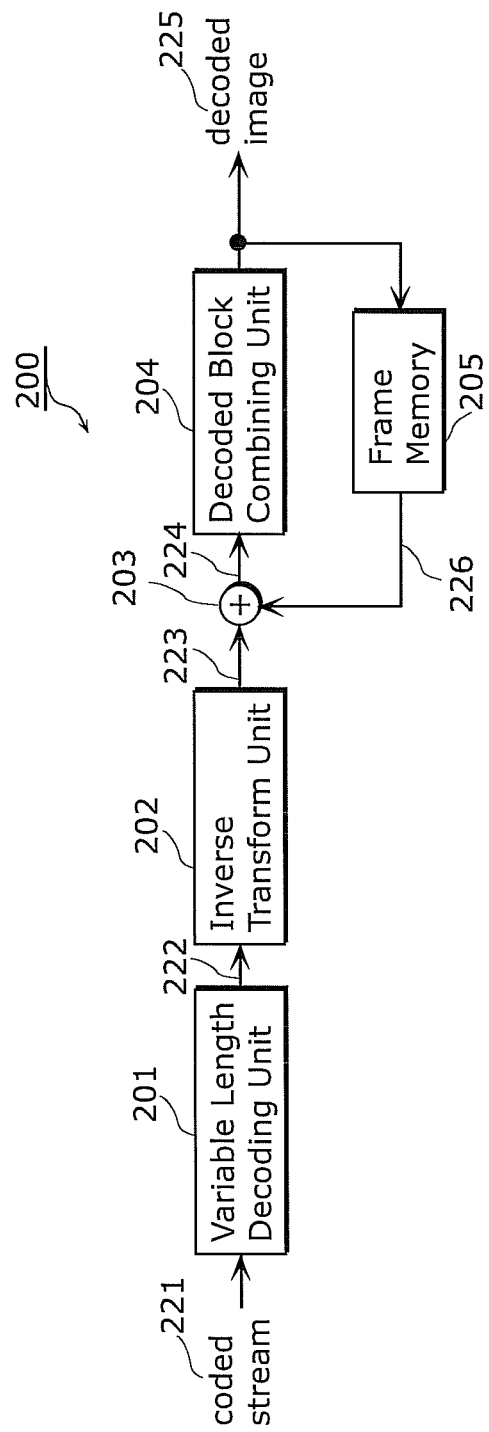
FIG. 20 is a block diagram of an image decoding apparatus according to Embodiment 2.

FIG. 20 is a block diagram showing the structure of the image decoding apparatus 200 according to the present embodiment.

The image decoding apparatus 200 shown in FIG. 20 decodes a coded stream 221 to generate a decoded image 225. Here, the coded stream 221 corresponds, for example, to the coded stream 125 generated by the above-described image coding apparatus 100. The image decoding apparatus 200 includes a variable length decoding unit 201, an inverse transform unit 202, an addition unit 203, a decoded block combining unit 204, and a frame memory 205.

<Processing (Overall)>

Figure 21:
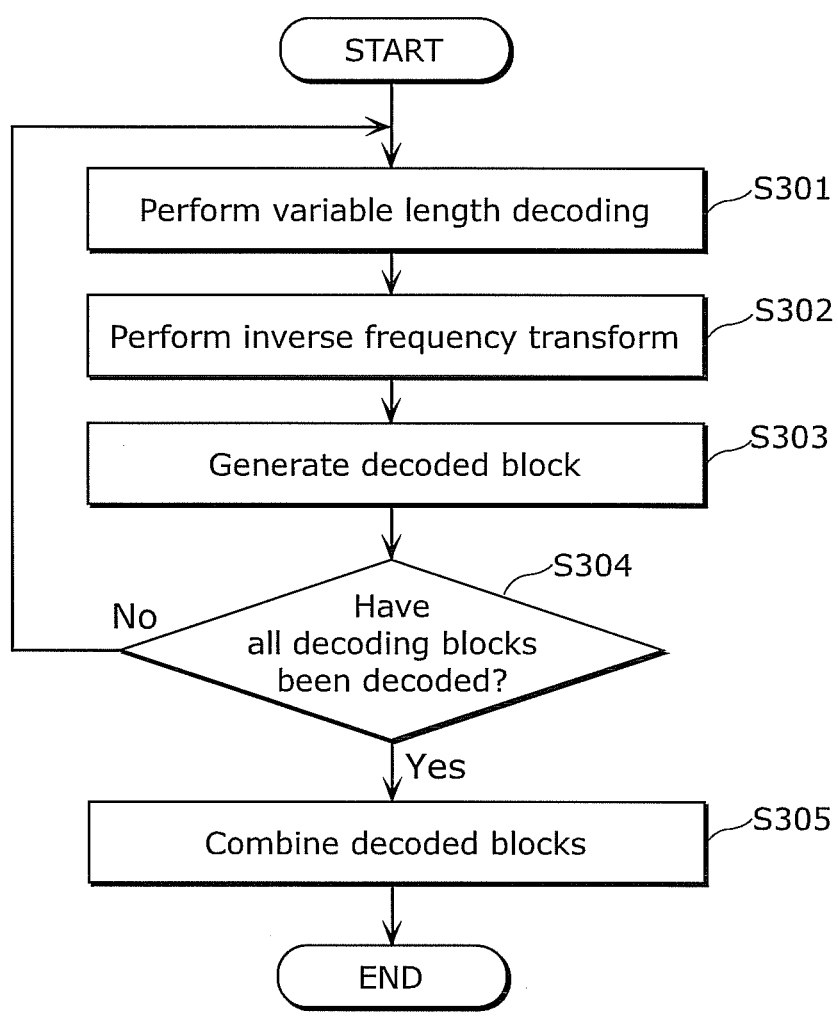
FIG. 21 is a flowchart of image decoding according to Embodiment 2.

Next, referring to FIG. 21, an overall flow of the decoding is described.

(Step S301)

The variable length decoding unit 201 performs variable length decoding on the coded stream 221 to generate frequency coefficients 222, and provides the frequency coefficients 222 to the inverse transform unit 202.

(Step S302)

The inverse transform unit 202 transforms the frequency coefficients 222 to pixel data to generate a differential block 223.

(Step S303)

The addition unit 203 adds a decoded image 226 stored in the frame memory 205 to the differential block 223, thereby generating a decoded block 224.

(Step S304)

The processing from Step S301 to Step S303 is repeated until all blocks in a target image have been decoded.

(Step S305)

The decoded block combining unit 204 combines a plurality of decoded blocks 224 together to generate a decoded image 225, and stores, as a decoded image 226, the decoded image 225 to the frame memory 205.

The following describes the variable length decoding unit 201 in more detail.

<Structure of Variable Length Decoding Unit 201>

Figure 22:
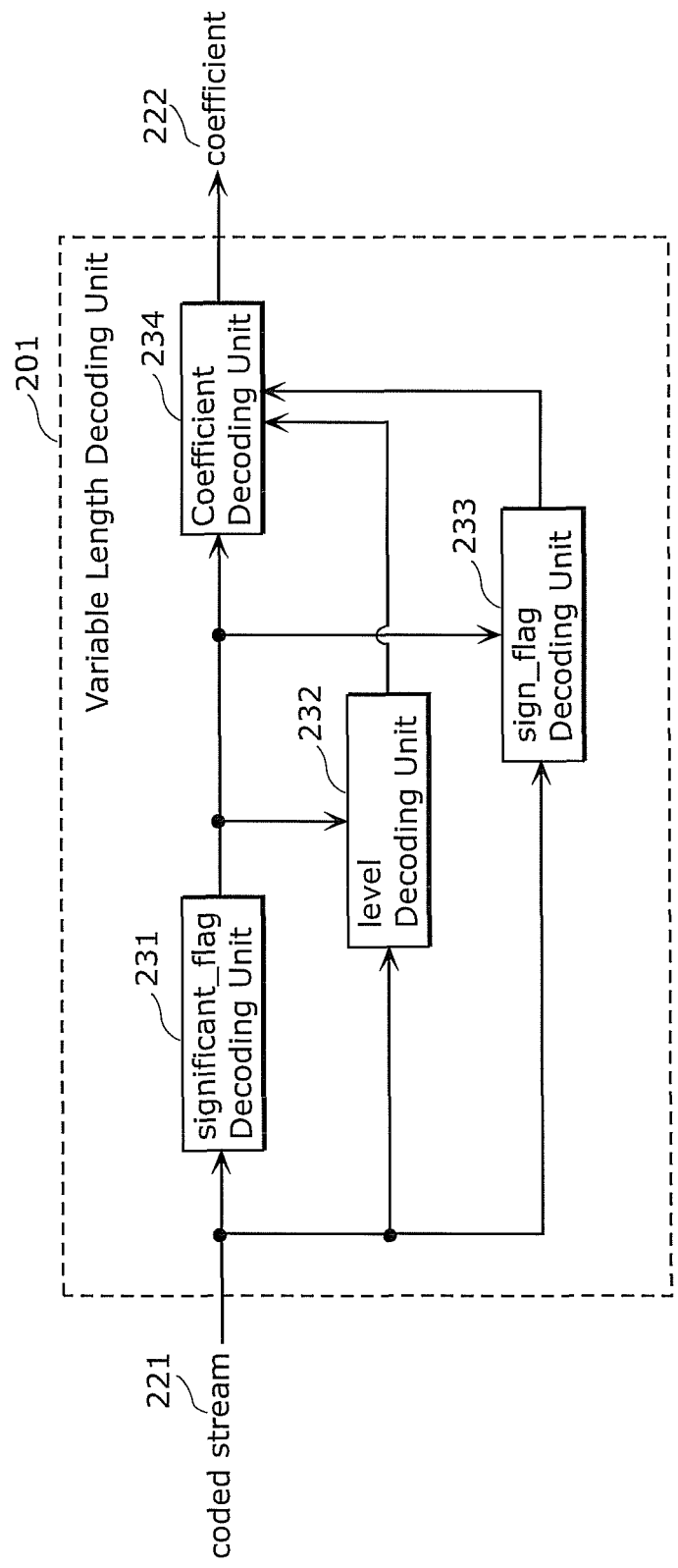
FIG. 22 is a block diagram of a variable length decoding unit according to Embodiment 2.

FIG. 22 is a block diagram showing the structure of the variable length decoding unit 201. In the present embodiment, like Embodiment 1, the frequency coefficient 222 (hereinafter, referred to also simply as "coefficient") is expressed based on five parameters: significant_flag, greater1_flag, greater2_flag, remaining, and sign_flag. The respective parameters indicate the same as described in Embodiment 1, so that they are not explained again.

As shown in FIG. 22, the variable length decoding unit 201 includes a significant_flag decoding unit 231, a level decoding unit 232, a sign_flag decoding unit 233, and a coefficient decoding unit 234.

<Processing (Variable Length Decoding)>

Figure 23:
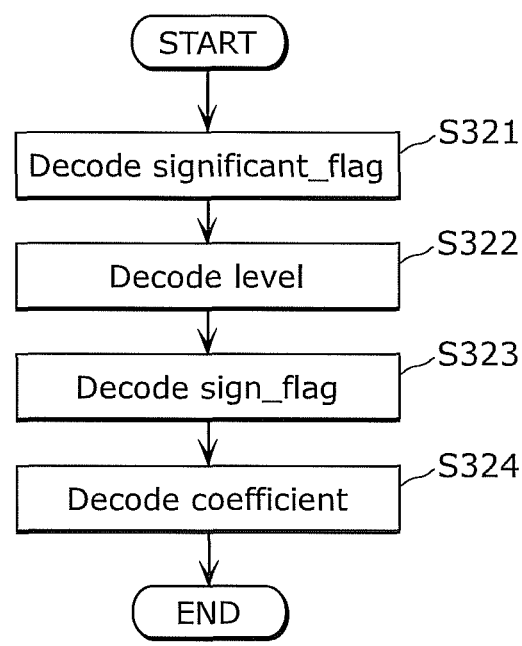
FIG. 23 is a flowchart of variable length decoding according to Embodiment 2.

Next, referring to FIG. 23, a flow of the variable length decoding is described.

(Step S321)

The significant_flag decoding unit 231 decodes significant_flag of each of coefficients in a target coefficient block, and provides the resulting significant_flag to the level decoding unit 232, the sign_flag decoding unit 233, and the coefficient decoding unit 234.

(Step S322)

The level decoding unit 232 decodes greater1_flag, greater2_flag, and remaining of each of the coefficients in the target coefficient block, and provides the resulting greater1_flag, greater2_flag, and remaining to the coefficient decoding unit 234. Here, the level decoding unit 232 decodes greater1_flag, greater2_flag, and remaining, only when significant_flag is 1.

(Step S323)

The sign_flag decoding unit 233 decodes sign_flag of each of the coefficients in the target coefficient block, and provides the resulting sign_flag to the coefficient decoding unit 234. Here, the sign_flag decoding unit 233 decodes sign_flag, only when significant_flag is 1.

(Step S324)

The coefficient decoding unit 234 decodes the target coefficient based on significant_flag, greater1_flag, greater2_flag, remaining, and sign_flag. The respective parameters indicate the same as described in Embodiment 1, so that the coefficient decoding unit 234 decodes the target coefficient according to the indication of the parameters.

The following describes the level decoding unit 232 in more detail.

<Structure of Level Decoding Unit 232>

Figure 24:
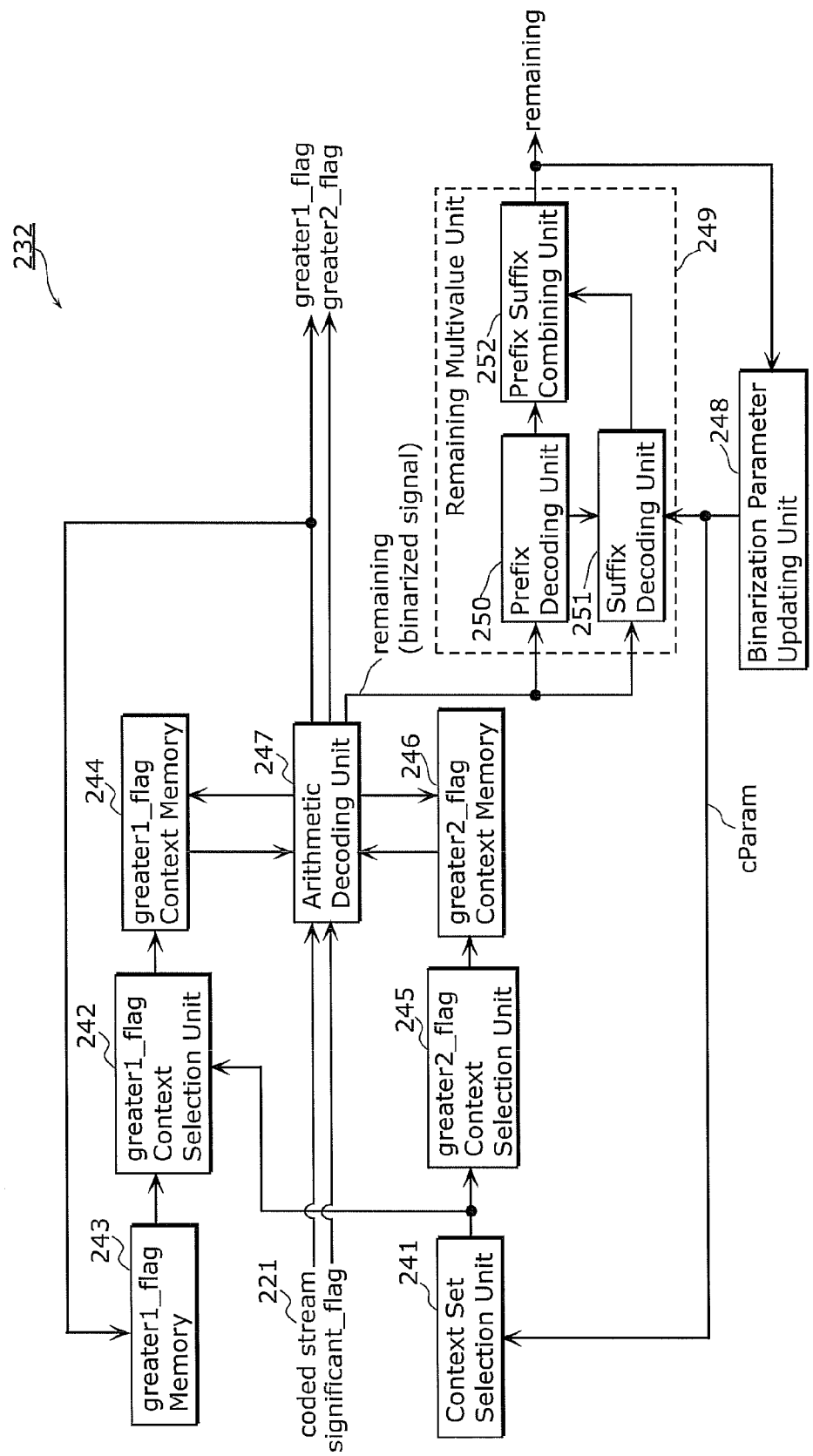
FIG. 24 is a block diagram of a level decoding unit according to Embodiment 2.

FIG. 24 is a block diagram showing the structure of the level decoding unit 232. As shown in FIG. 24, the level decoding unit 232 includes a context set selection unit 241, a greater1_flag context selection unit 242, a greater1_flag memory 243, a greater1_flag context memory 244, a greater2_flag context selection unit 245, a greater2_flag context memory 246, an arithmetic decoding unit 247, a binarization parameter updating unit 248, and a remaining multivalue unit 249. The remaining multivalue unit 249 includes a prefix decoding unit 250, a suffix decoding unit 251, and a prefix suffix combining unit 252.

<Processing (Level Decoding)>

Figure 25:
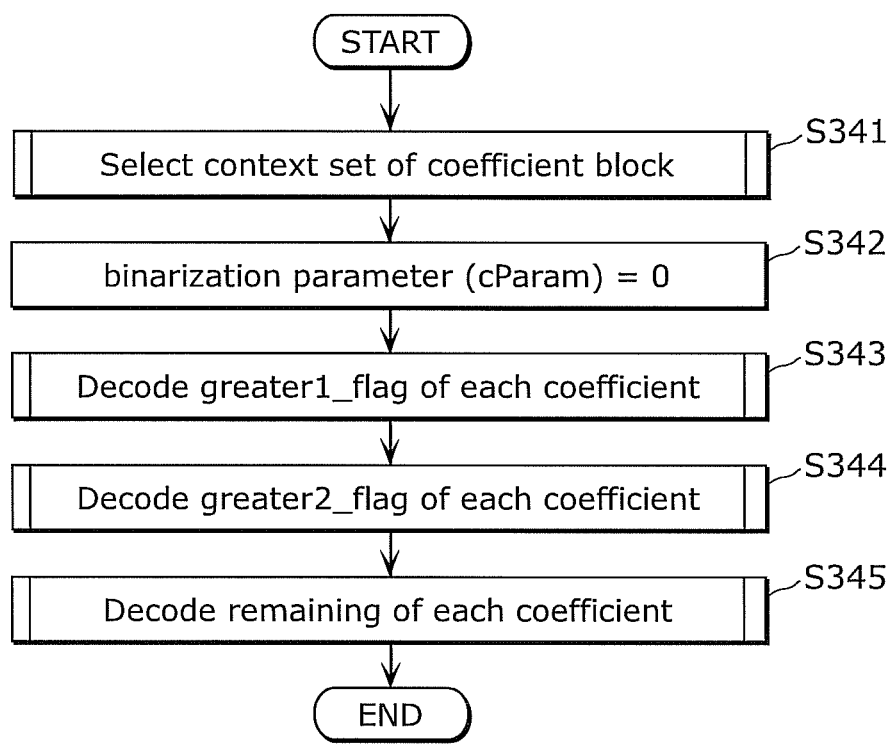
FIG. 25 is a flowchart of level decoding according to Embodiment 2.

Next, referring to FIGS. 25 to 28, the level decoding is described in more detail. FIG. 25 is a flowchart of the decoding performed by the level decoding unit 232.

(Step S341)

The context set selection unit 241 sets respective context set numbers to be used in arithmetic decoding on greater1_flag and arithmetic decoding on greater2_flag. The setting method is the same as the context set selection (FIG. 10) according to Embodiment 1.

(Step S342)

The binarization parameter updating unit 248 initializes the binarization parameter (cParam) to 0. At this step, cParam is set to 0 at the beginning of a target coefficient block. It should be noted that Steps S341 and S342 are performed once for the target coefficient block, while the following steps from Step S343 are performed for each of coefficients in the target coefficient block.

(Step S343)

Figure 26:
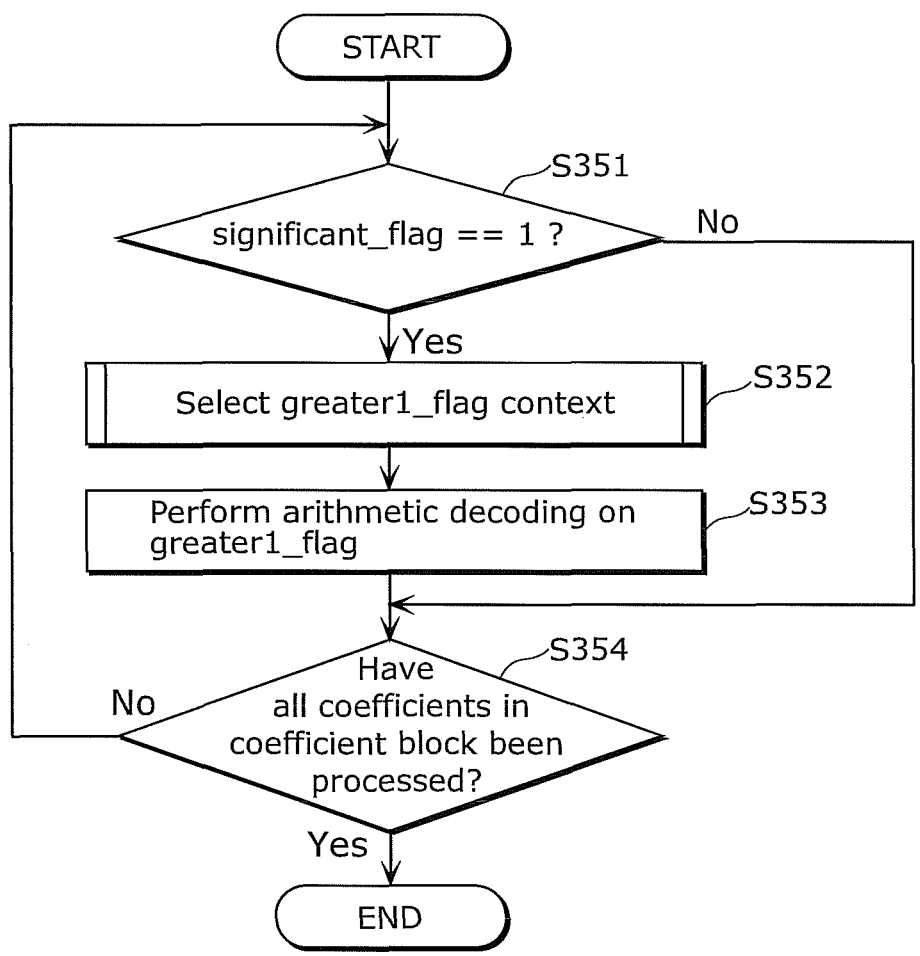
FIG. 26 is a flowchart of greater1_flag decoding according to Embodiment 2.

The level decoding unit 232 decodes greater1_flag of each of coefficients in a target coefficient block. FIG. 26 is a flowchart of explaining this step in more detail.

(Step S351)

The level decoding unit 232 determines whether or not significant_flag of a target coefficient is 1. If significant_flag is 1, then the level decoding unit 232 decodes greater1_flag at Steps S352 and S353. On the other hand, if significant_flag is 0, the level decoding unit 232 does not decode greater1_flag.

(Step S352)

The greater1_flag context selection unit 242 sets a context number based on the context set number selected at Step S341. The setting method is the same as the greater1_flag context selection (FIG. 11) according to Embodiment 1.

(Step S353)

The arithmetic decoding unit 247 loads a context to be used (using context) from the greater1_flag context memory 244 according to the context number selected at Step S352, and performs arithmetic decoding on greater1_flag by using the context. In addition, the arithmetic decoding unit 247 stores the context that has been updated in the arithmetic decoding, back into the same place in the greater1_flag context memory 244.

(Step S354)

The processing from Step S351 to Step S353 is repeated until all the coefficients in the target coefficient block have been processed.

As a result, greater1_flag(s) of the respective coefficients in the target coefficient block have been decoded.

(Step S344)

Figure 27:
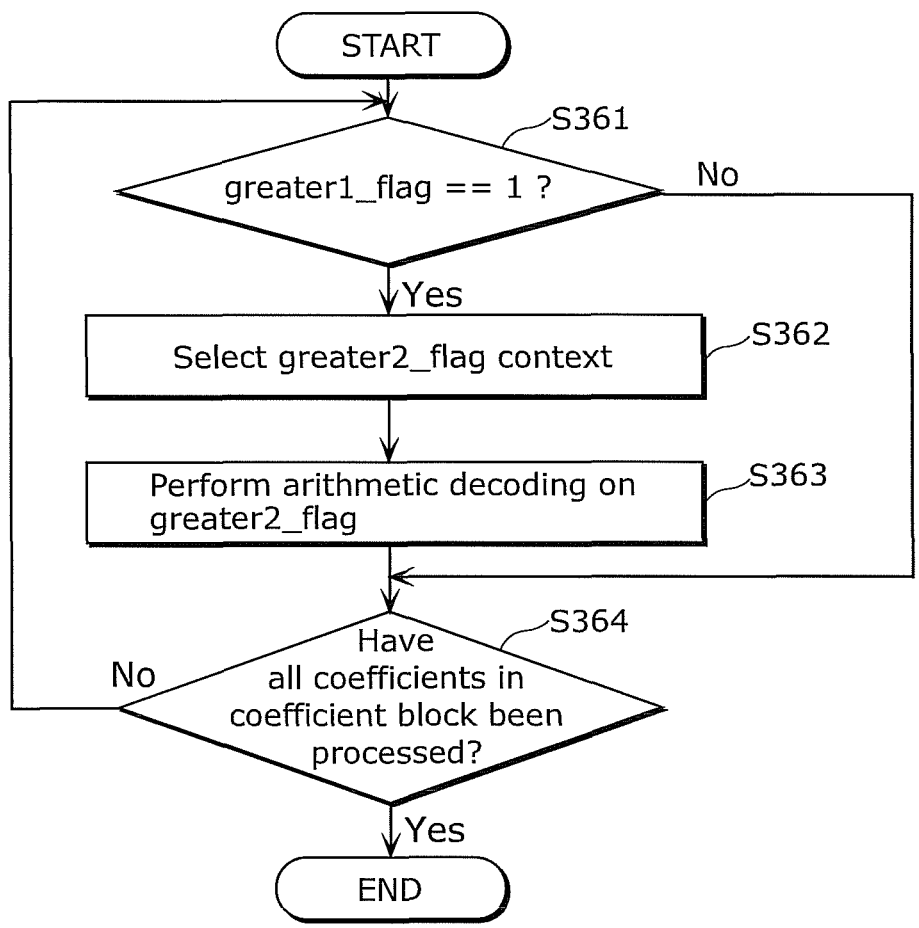
FIG. 27 is a flowchart of greater2_flag decoding according to Embodiment 2.

The level decoding unit 232 decodes greater2_flag of each of coefficients in a target coefficient block. FIG. 27 is a flowchart of explaining this step in more detail.

(Step S361)

The level decoding unit 232 determines whether or not greater1_flag of a target coefficient is 1. If greater1_flag is 1, then the level decoding unit 232 decodes greater2_flag at Steps S362 and S363. On the other hand, if greater1_flag is 0, the level decoding unit 232 does not decode greater2_flag. It should be noted that if significant_flag of the target coefficient is 0, the level decoding unit 232 decodes neither greater1_flag nor greater2_flag.

(Step S362)

The greater2_flag context selection unit 245 sets the context set number selected at Step S341 as a context number. Unlike greater1_flag, a context set number for greater2_flag is directly set to a context number. In other words, a single context set for greater2_flag includes only one context.

(Step S363)

The arithmetic decoding unit 247 loads a context to be used (using context) from the greater2_flag context memory 246 according to the context number selected at Step S362, and performs arithmetic decoding on greater2_flag by using the context. In addition, the arithmetic decoding unit 247 stores the context that has been updated in the arithmetic decoding, back into the same place in the greater2_flag context memory 246.

(Step S364)

The processing from Step S361 to Step S363 is repeated until all the coefficients in the target coefficient block have been processed.

As a result, greater2_flag(s) of the respective coefficients in the target coefficient block have been decoded.

(Step S345)

Figure 28:
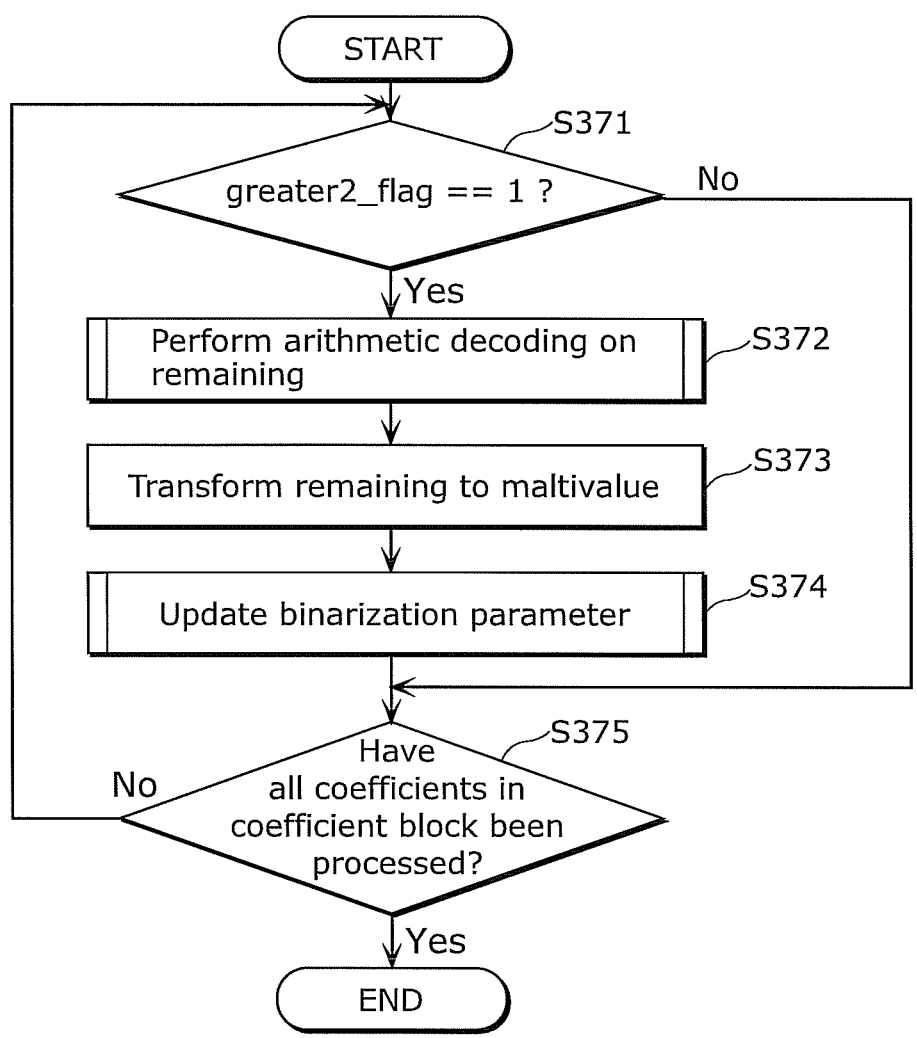
FIG. 28 is a flowchart of remaining decoding according to Embodiment 2.

The level decoding unit 232 decodes remaining of each of coefficients in a target coefficient block. FIG. 28 is a flowchart of explaining this step in more detail.

(Step S371)

The level decoding unit 232 determines whether or not greater2_flag of a target coefficient is 1. If greater2_flag is 1, then the level decoding unit 232 decodes remaining at Steps S372 and S373. On the other hand, if greater2_flag is 0, the level decoding unit 232 does not decode remaining. It should be noted that if significant_flag of the target coefficient is 0 or greater1_flag of the target coefficient is 0, the level decoding unit 232 decodes neither greater2_flag nor remaining.

(Step S372)

The arithmetic decoding unit 247 performs arithmetic decoding on remaining. Unlike greater1_flag and greater2_flag, remaining is applied with bypass arithmetic coding that does not use any context.

(Step S373)

The remaining multivalue unit 249 transforms a multi-valued signal of remaining to a binarized signal. This step will be described later in more detail.

(Step S374)

The binarization parameter updating unit 248 updates the binarization parameter (cParam). The updating method is the same as the binarization parameter updating (FIG. 18) according to Embodiment 1.

(Step S375)

The processing from Step S371 to Step S374 is repeated until all the coefficients in the target coefficient block have been processed.

<Processing (Remaining Maltivalue Transform)>

Figure 29:
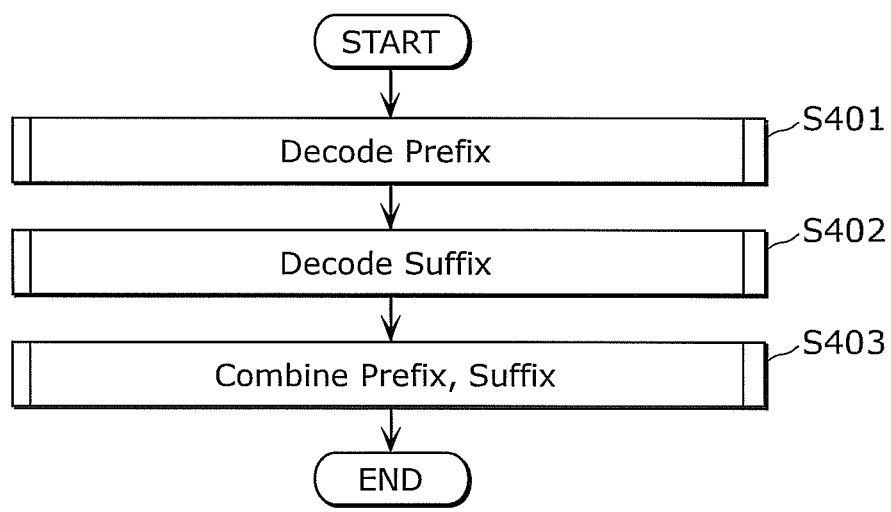
FIG. 29 is a flowchart of remaining multivalue transform according to Embodiment 2.
Figure 30:
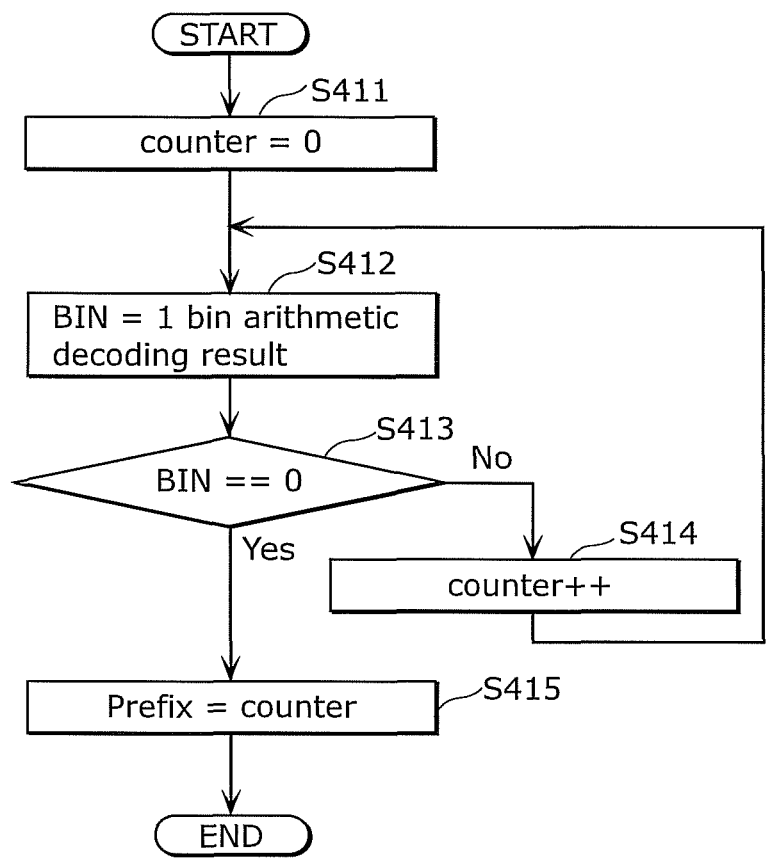
FIG. 30 is a flowchart of prefix decoding according to Embodiment 2.
Figure 31:
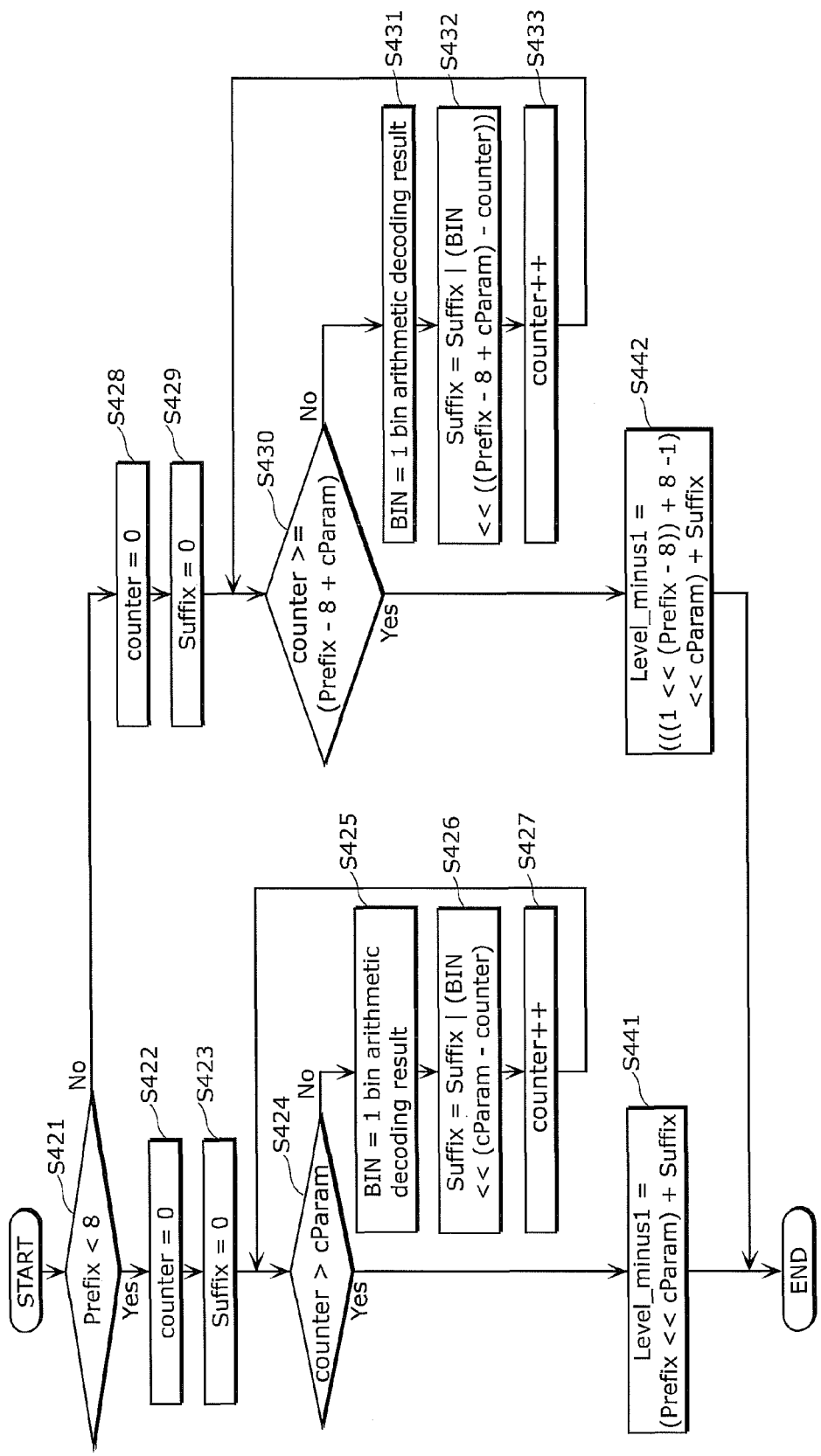
FIG. 31 is a flowchart of suffix decoding and prefix and suffix combining according to Embodiment 2.

Next, referring to FIGS. 29 to 31, the transforming of remaining to a maltivalue (S373 in FIG. 28) is described in more detail.

(Step S401)

The prefix decoding unit 250 decodes prefix. FIG. 30 is a flowchart of explaining this step in more detail.

(Steps S411 to S415)

The prefix decoding unit 250 determines prefix. In summary, the prefix decoding unit 250 obtains codes by 1 bit each sequentially from the arithmetic decoding unit 247 until "0" is found. The number of the continuous "1" is set to a value of prefix.

(Step S402)

The suffix decoding unit 251 decodes suffix.

(Step S403)

The prefix suffix combining unit 252 combines prefix and suffix to generate a multivalued signal of remaining.

FIG. 31 is a flowchart of explaining Steps S402 and S403 in more detail.

(Steps S421 to S433)

The suffix decoding unit 251 determines suffix. In summary, if prefix is smaller than 8, then the suffix decoding unit 251 sets a value of cParam as a bin length, and generates suffix by arranging arithmetic decoding results of the bin length in an order from a higher order. On the other hand, if prefix is 8 or greater, then the suffix decoding unit 251 calculates a bin length from prefix and cParam, and generates suffix by arranging arithmetic decoding results of the bin length in an order from a higher order.

(Steps S441 to S442)

The prefix suffix combining unit 252 calculates remaining based on prefix, suffix, and cParam.

<Effects>

As described above, the image decoding apparatus according to Embodiment 2 can offer the same effects as described in Embodiment 1.

Figure 32A:
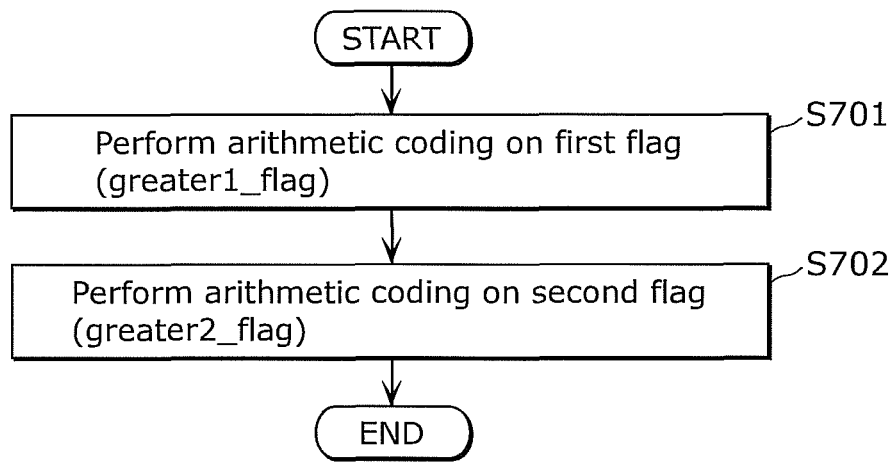
FIG. 32A is a flowchart of an image coding method according to Embodiment 1.

FIG. 32A is a flowchart of image coding performed by the above-described image coding apparatus 100.

As explained above, the image coding apparatus 100 performs arithmetic coding on a first flag (greater1_flag) indicating whether or not an absolute value of a target coefficient included in a target coefficient block is greater than 1 (S701). Next, the image coding apparatus 100 performs arithmetic coding on a second flag (greater2_flag) indicating whether or not the absolute value is greater than 2 (S702).

Figure 32B:
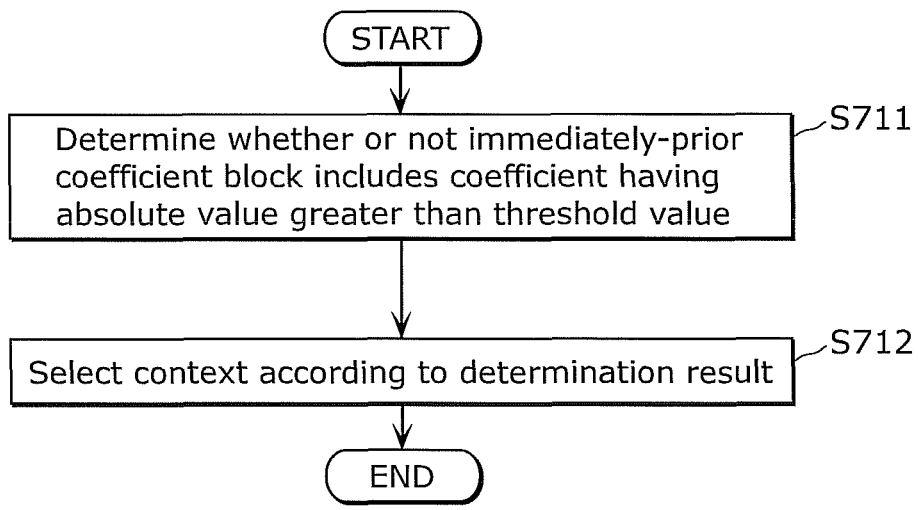
FIG. 32B is a flowchart of first flag coding and second flag coding according to Embodiment 1.

FIG. 32B is a flowchart of Steps S701 and S702.

At Steps S701 and S702, the image coding apparatus 100 determines whether or not an immediately-prior coefficient block includes a coefficient having an absolute value greater than a threshold value (S711), and based on the determination result, selects respective contexts to be used in arithmetic coding on the first flag and arithmetic coding on the second flag (S712). In other words, the image coding apparatus 100 makes the above determination with reference only to coefficients included in the immediately-prior coefficient block, and not to coefficients included in coefficient blocks other than the immediately-prior coefficient block. In other words, the image coding apparatus 100 performs arithmetic coding on the first flag and the second flag by using contexts corresponding to the determination result among a plurality of contexts.

The immediately-prior coefficient block refers to a coefficient block that has been processed immediately prior to a target coefficient block.

More specifically, if an absolute value of a target coefficient is greater than the threshold value, the image coding apparatus 100 increments the binarization parameter (cParam) (S253 and S254 in FIG. 18). Then, if cParam of an immediately-prior coefficient block is greater than 0, then the image coding apparatus 100 changes a context (in other words, increments a context set number) (S184 and S185 in FIG. 10).

In other words, based on a variable generated in arithmetic coding on an immediately-prior coefficient block, the image coding apparatus 100 determines whether or not the immediately-prior coefficient block includes a coefficient having an absolute value greater than the threshold value.

More specifically, if the absolute value of the target coefficient is greater than 2, the image coding apparatus 100 binarizes remaining that is a value obtained by subtracting 3 from the absolute value, according to a transform table designated by the binarization parameter (cParam) among a plurality of transform tables. This binarization parameter is determined depending on whether or not the immediately-prior coefficient block includes a coefficient having an absolute value greater than the threshold value. The above-mentioned variable is this binarization parameter.

It has been described above that the threshold value for absolute values of coefficients, which is referred to in context change, is determined based on the binarization parameter (S252 in FIG. 18), but the threshold value may be a predetermined value ("1") as described regarding the conventional technique. In other words, the image coding apparatus 100 may determine whether or not an immediately-prior coefficient block includes a coefficient having an absolute value greater than 1 (of 2 or greater), and based on the determination result, change a context to be used to another. As described previously, in the conventional technique, the number of coefficients having an absolute value greater than a threshold value is counted. This processing is different from the processing of determining whether or not there is a coefficient having an absolute value greater than a threshold value as described in the present embodiment.

In this case, like the above case, the image coding apparatus 100 may determine whether or not an immediately-prior coefficient block includes a coefficient having an absolute value greater than 1, based on a variable generated in arithmetic coding on the immediately-prior coefficient block. For example, this variable is greater1_flag. In other words, the image coding apparatus 100 may change a context according to whether or not an immediately-prior coefficient block includes a coefficient that has greater1_flag having a value of 1.

Figure 33A:
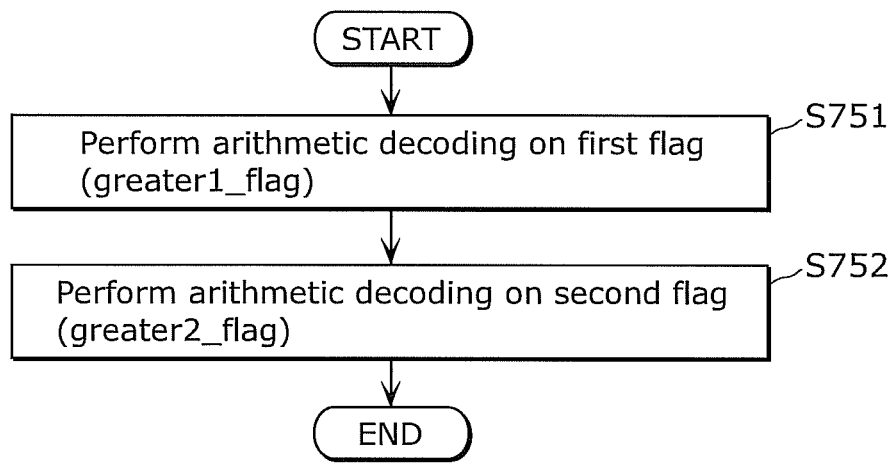
FIG. 33A is a flowchart of an image decoding method according to Embodiment 2.

FIG. 33A is a flowchart of image decoding performed by the above-described image decoding apparatus 200.

As shown in FIG. 33A, the image decoding apparatus 200 performs arithmetic decoding on the first flag (greater1_flag) that indicates whether or not an absolute value of a target coefficient included in a target coefficient block is greater than 1 (S751). The image decoding apparatus 200 performs arithmetic decoding on the second flag (greater2_flag) that indicates whether or not the absolute value is greater than 2 (S752).

Figure 33B:
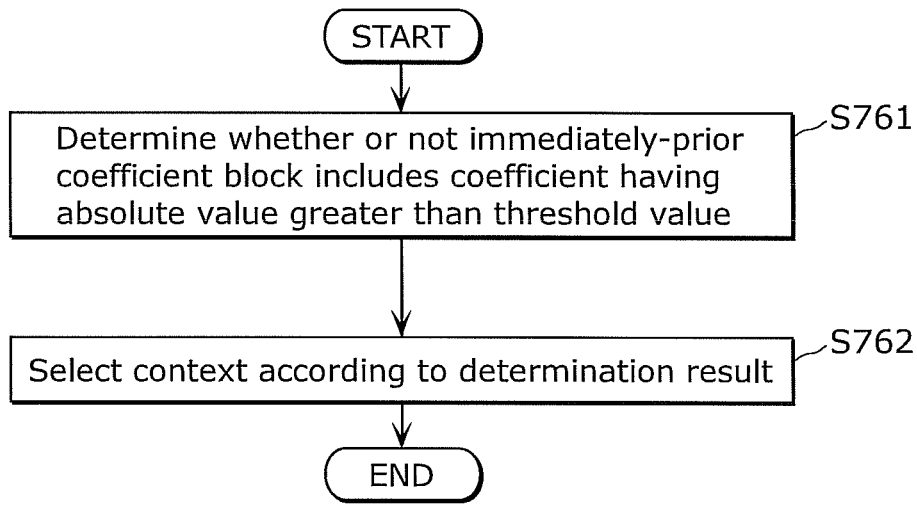
FIG. 33B is a flowchart of first flag decoding and second flag decoding according to Embodiment 2.

FIG. 33B is a flowchart of Steps S751 and S752.

At Steps S751 and S752, the image decoding apparatus 200 determines whether or not an immediately-prior coefficient block includes a coefficient having an absolute value greater than a threshold value (S761), and based on the determination result, changes respective contexts to be used in arithmetic decoding on the first flag and the second flag (S762). In other words, the image decoding apparatus 200 performs arithmetic decoding on the first flag and the second flag by using respective contexts corresponding to the determination result among a plurality of contexts.

More specifically, if an absolute value of a target coefficient is greater than the threshold value, the image decoding apparatus 200 increments the binarization parameter (cParam) (S253 and S254 in FIG. 18). Then, if cParam of an immediately-prior coefficient block is greater than 0, then the image decoding apparatus 200 changes a context (in other words, increments a context set number) (S184 and S185 in FIG. 10).

In other words, based on a variable generated in arithmetic decoding on an immediately-prior coefficient block, the image decoding apparatus 200 determines whether or not the immediately-prior coefficient block includes a coefficient having an absolute value greater than the threshold value.

More specifically, if an absolute value of a target coefficient is greater than 2, the image decoding apparatus 200 transforms remaining, which is obtained by subtracting 3 from the absolute value, to a multivalue according to a transform table designated by the binarization parameter among a plurality of transform tables. This binarization parameter is determined depending on whether or not the immediately-prior coefficient block includes a coefficient having an absolute value greater than the threshold value. The above-mentioned variable is this binarization parameter.

Like the above, the threshold value may be a predetermined value ("1"). In this case, like the above case, the image decoding apparatus 200 may determine whether or not an immediately-prior coefficient block includes a coefficient having an absolute value greater than 1, based on a variable generated in arithmetic coding on the immediately-prior coefficient block. For example, this variable is greater1_flag. In other words, the image decoding apparatus 200 may change a context, according to whether or not an immediately-prior coefficient block includes a coefficient that has greater1_flag having a value of 1.

Embodiment 3

In Embodiment 3, a variation of Embodiment 1 is described. An image coding apparatus according to Embodiment 3 differs from the image coding apparatus according to Embodiment 1 in that the level coding unit 133A functions differently from the level coding unit 133. The following describes the level coding unit 133A.

<The Structure of Level Coding Unit 133A>

Figure 34:
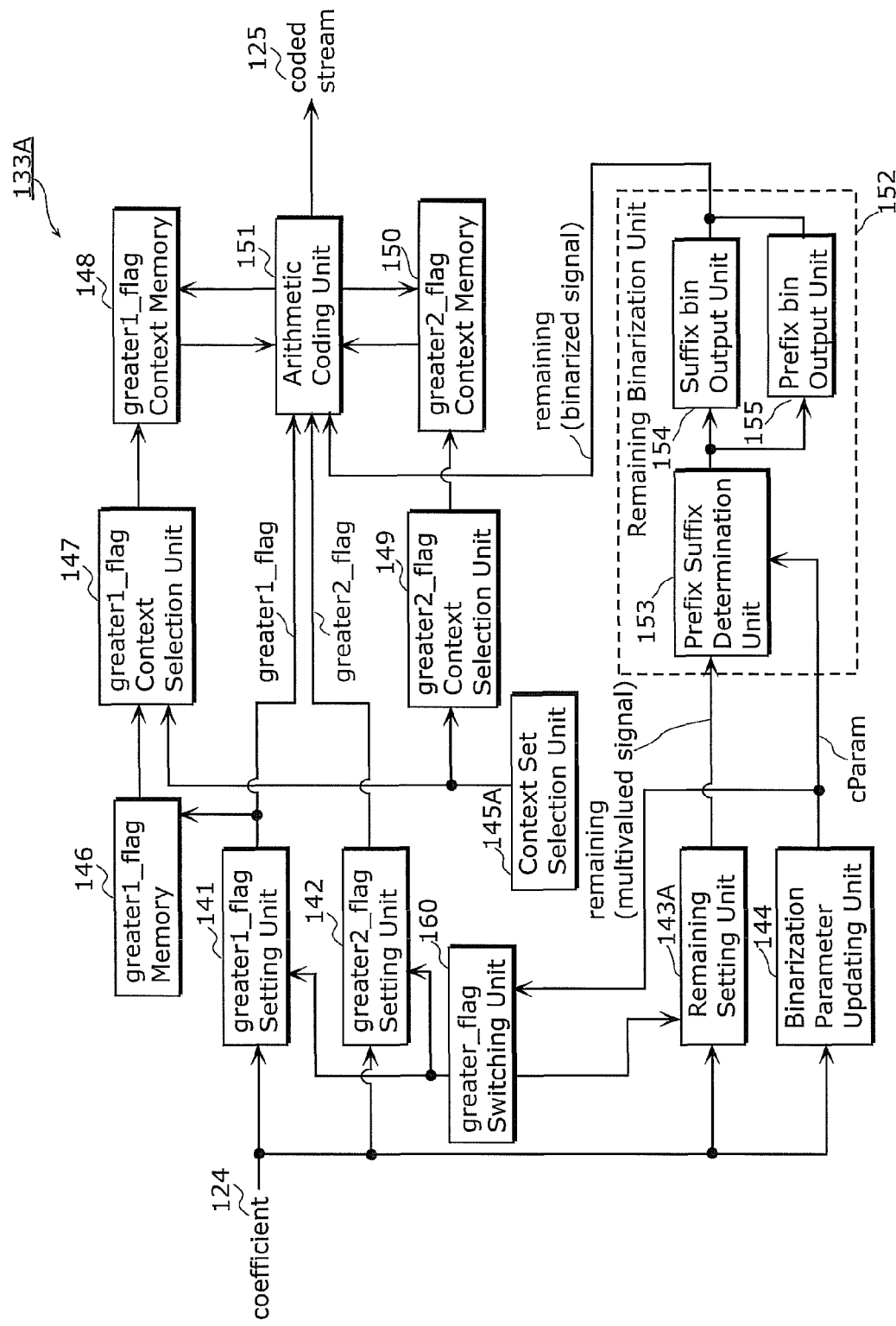
FIG. 34 is a block diagram of a level coding unit according to Embodiment 3.

FIG. 34 is a block diagram showing the structure of the level coding unit 133A. The level coding unit 133A includes not only the structure of the level coding unit 133 according to Embodiment 1 but also as a greater_flag switching unit 160. Furthermore, functions of the remaining setting unit 143A and the context set selection unit 145A are different from those of the remaining setting unit 143 and the context set selection unit 145.

<Processing (Level Coding)>

Figure 35:
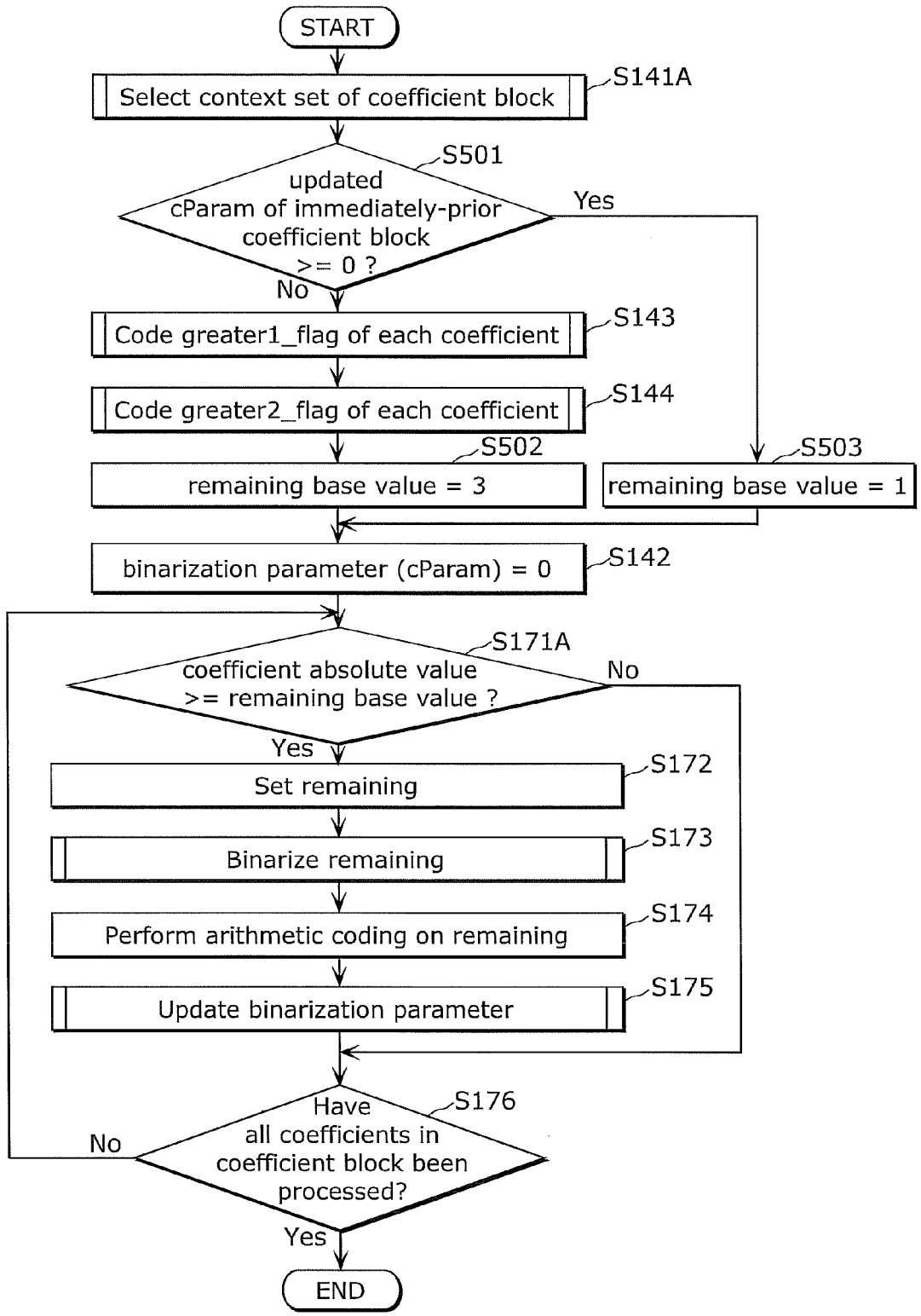
FIG. 35 is a flowchart of level coding according to Embodiment 3.

Next, referring to FIG. 35, the level coding is described in more detail. The level coding according to Embodiment 1 is added with new Steps S501 to S503. Furthermore, Steps S141A and S171A are different from Steps S141 and S171. The steps identical to those in Embodiment 1 are not explained again below.

(Step S141A)

The context set selection unit 145A sets a context set number to be used in arithmetic coding on greater1_flag and greater2_flag. This step will be described later in more detail.

(Step S501)

The greater_flag switching unit 160 determines whether or not a binarization parameter (cParam) that has been updated in processing on an immediately-prior coefficient block is greater than 0. In the same manner as described in Embodiment 1, if the binarization parameter is 0, then greater1_flag and greater2_flag are coded. On the other hand, if the binarization parameter is greater than 0, then greater1_flag and greater2_flag are not coded.

(Steps S502, S503, and S171A)

If the binarization parameter (cParam) that has been updated for the immediately-prior coefficient block is greater than 0, then the remaining setting unit 143A sets a remaining base value to 1. If the binarization parameter (cParam) is 0, the remaining setting unit 143A sets the remaining base value to 3. Then, if an absolute value of a target coefficient is greater than or equal to the remaining base value, then the level coding unit 133A codes remaining at Steps S172 to S175. On the other hand, if the absolute value is smaller than the remaining base value, the level coding unit 133A does not code remaining. When remaining is coded, the level coding unit 133A subtracts the remaining base value from the absolute value, and sets the resulting value as remaining and coded. This is because greater1_flag and greater2_flag are sometimes not coded depending on cParam and a value to be set as remaining is therefore changed. In Embodiment 1, since there are greater1_flag and greater2_flag whatever cParam is, the remaining base value is fixed to "3".

<Processing (Context Set Selection)>

Next, referring to FIG. 35, the context set selection (S141A in FIG. 34) is described in more detail.

(Steps S511 to S513)

The context set selection unit 145A determines whether or not a target coefficient block has the lowest frequency in the target coding block. If the target coefficient block has the lowest frequency, then the context set selection unit 145A sets the context set number to 0. Otherwise, the context set selection unit 145A sets the context set number to 1. In other words, if the target coefficient block is located at the upper-left corner of the target coding block, then the context set selection unit 145A sets the context set number to 0. Otherwise, the context set selection unit 145A sets the context set number to 1.

Unlike Embodiment 1, the context set selection unit 145A does not change a context set when cParam is greater than 0. This is because greater1_flag and greater2_flag are not coded and a context is not selected if cParam is greater than 0 as seen in the previously-described level coding flow.

<Effects>

As described above, the image coding apparatus according to the present embodiment determines, based on a binarization parameter that has been updated for an immediately-prior coefficient block, that greater1_flag and greater2_flag are not to be coded and therefore a coefficient is coded based on remaining instead of greater1_flag and greater2_flag. Thereby, if there is at least one coefficient greater than a threshold value in processing for the immediately-prior coefficient block, the image coding apparatus performs bypass arithmetic coding that does not use any context, instead of arithmetic coding that uses a context. The bypass arithmetic coding does not require loading and updating of a context. Moreover, the bypass arithmetic coding allows processing to start without waiting until a context has been updated at a prior stage. Therefore, the bypass arithmetic coding can increase a speed of the processing more than the arithmetic coding that uses a context.

Furthermore, if there is a high possibility that an absolute value of a target coefficient is small, greater1_flag and greater2_flag are sometimes 0 so that coding of remaining is not necessary. However, the above situation rarely occurs when there is a high possibility that the absolute value of the target coefficient is large. Therefore, a total bin amount can be often reduced if greater1_flag and greater2_flag are not coded.

If cParam after processing on an immediately-prior coefficient block is greater than 0 (in other words, if there is at least one coefficient greater than a threshold value), the image coding apparatus according to the present embodiment expects that there is a high probability of causing coefficients having an absolute value in the target coefficient block, and therefore does not code greater1_flag and greater2_flag. As a result, the processing can be performed at a higher speed, by decreasing the number of arithmetic coding steps using contexts while suppressing deterioration of coding efficiency.

Furthermore, greater1_flag and greater2_flag are not coded when cParam is greater than 0. As a result, a context set that is used when cParam is greater than 0, in other words, a context set that is used when there is a high probability of causing coefficients having a large value, is not necessary. More specifically, if a target coefficient block is located at the upper-left corner of a target coding block, the image coding apparatus uses a single context. If the target coefficient block is not located at the upper-left corner, the image coding apparatus uses a single common context set. As a result, it is possible to decrease the number of using contexts, and thereby reduce a size of a memory for storing contexts and a size of a circuit for selecting the contexts.

By unifying information to be used in determining whether or not to code greater1_flag and greater2_flag and information to be used in coding remaining, a circuit size is reduced. More specifically, cParam, which is incremented every time an absolute value of a target coefficient exceeds the threshold value, is used for changing a binarization parameter of remaining and for determining whether or not to code greater1_flag and greater2_flag. As a result, one structure can perform various functions. In comparison to the present HEVC standard (Non-Patent Literature 1), the image coding apparatus according to the present embodiment can determine whether or not to code greater1_flag and greater2_flag, without including an additional structure.

Figures 36, 37:
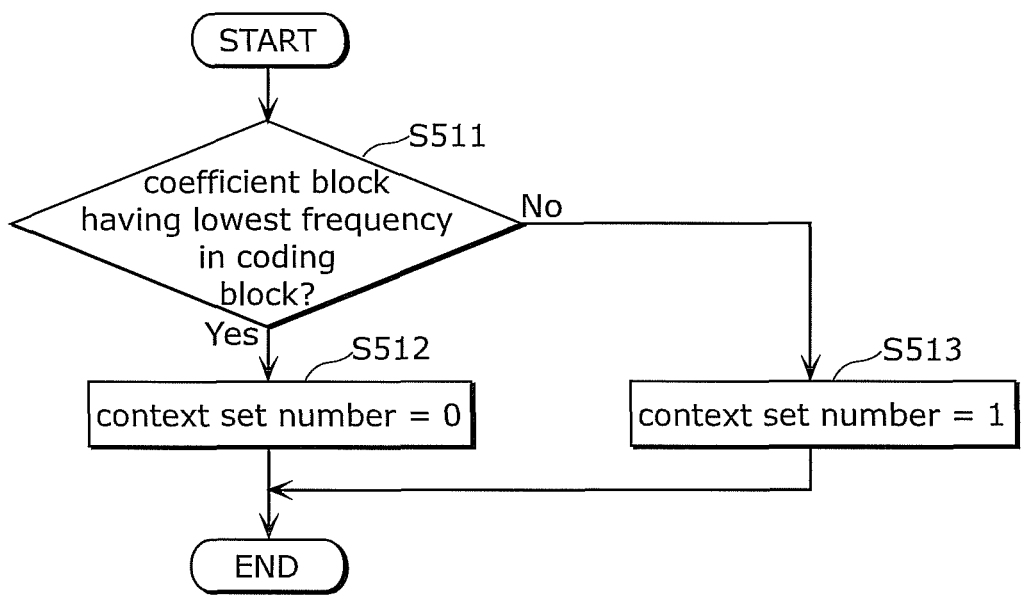
FIG. 36 is a flowchart of context set selection according to Embodiment 3.
FIG. 37 is a table showing evaluation results of an image coding method according to Embodiment 3.

Furthermore, the image coding method according to the present embodiment has been applied to test software of the present HEVC standard (Non-Patent Literature 1) for experiments. FIG. 37 shows experiment results in comparison to results without the application of the present embodiment. The experiment conditions are based on common experiment conditions of the HEVC standard group. The numerical values in FIG. 37 are results regarding first 49 frames of test image. A larger numerical value indicates lower coding efficiency. A negative value indicates improvement of the coding efficiency. As shown in FIG. 37, each of the values ranges from −0.00% to 0.06%. It means that coding efficiency is hardly affected even if a speed of the processing is increased by eliminating arithmetic coding that uses contexts or even if a total number of contexts is decreased.

It should be noted that it has been described above that the image coding apparatus determines, based on a binarization parameter (cParam) that has been updated for an immediately-prior coefficient block, whether or not to code greater1_flag and greater2_flag. However, the determination may be made based on a binarization parameter that has been updated for a coefficient block different from the immediately-prior coefficient block. For example, the image coding apparatus may determine that greater1_flag and greater2_flag are not to be coded for following coefficient blocks, when cParam exceeds 0 in processing for any processed coefficient block. Coefficient blocks are processed sequentially from a higher frequency block. Therefore, if cParam of any one of the coefficient blocks exceeds 0, in other words, if a coefficient having an absolute value that is greater than or equal to a threshold value is found, there is a high possibility that all the following coefficient blocks have large coefficient values. In the above case, even if greater1_flag and greater2_flag are not coded, coding efficiency is sometimes not decreased.

It should also be noted that it has been described above that the image coding apparatus does not code greater1_flag and greater2_flag when cParam is greater than 0, but the present embodiment is not limited to the above. For example, it is also possible not to code greater1_flag and greater2_flag when cParam is greater than 1 or greater than 2. Depending on input image, it is sometimes possible to increase coding efficiency, if the determination as to whether to code greater1_flag and greater2_flag is made based on whether or not cParam is greater than 1

The others are the same as described in Embodiment 1, so that they are not explained again Embodiment 4

In Embodiment 4, the description is given for an image decoding apparatus that decodes a coded bitstream generated by the image coding apparatus according to Embodiment 3. The image decoding apparatus according to Embodiment 4 differs from the image decoding apparatus according to Embodiment 2 in that the level decoding unit 232 is replaced by a level decoding unit 232A. The following describes the level decoding unit 232A.

<Structure of Level Decoding Unit 232A>

Figure 38:
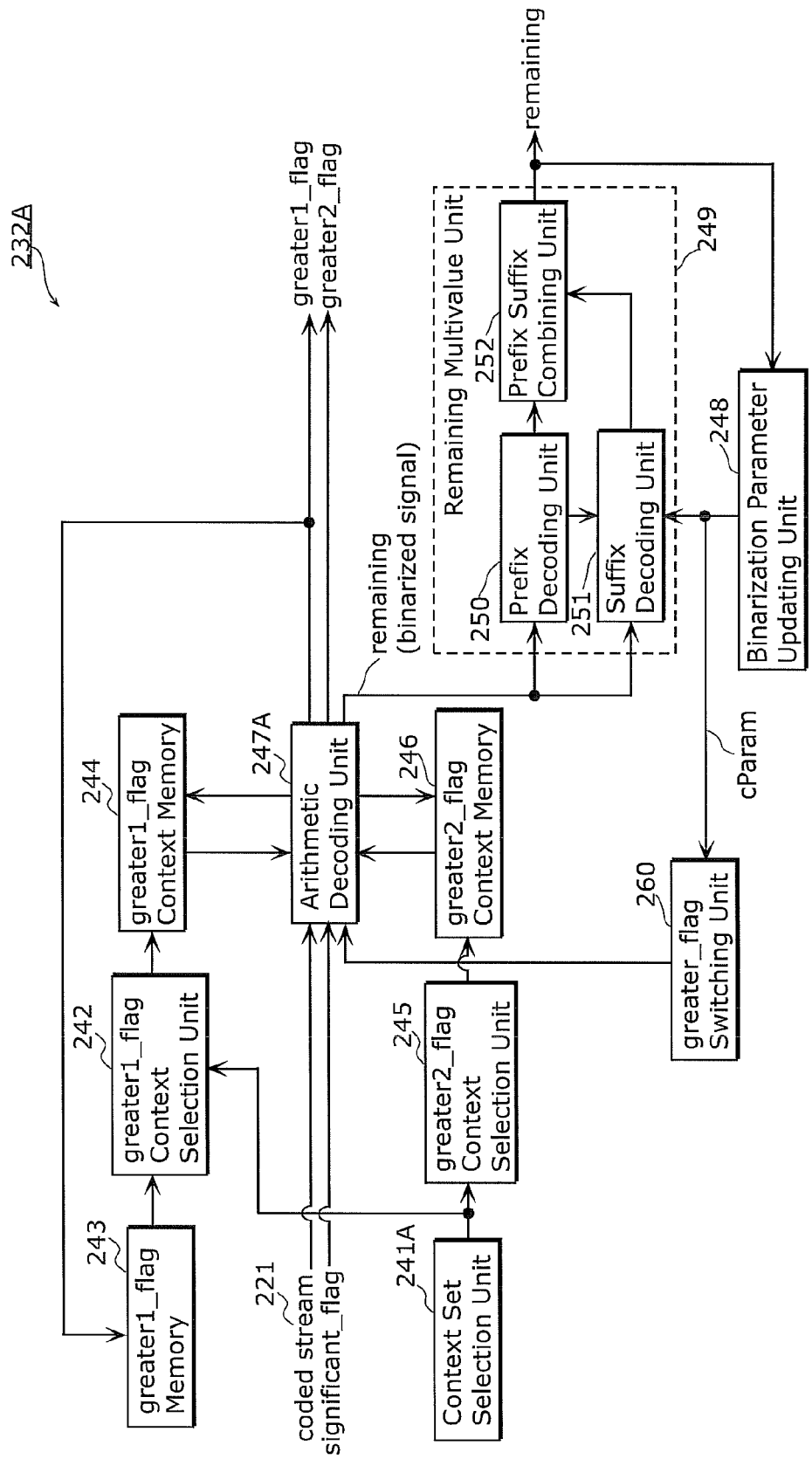
FIG. 38 is a block diagram of level decoding according to Embodiment 4.

FIG. 38 is a block diagram showing the structure of the level decoding unit 232A. The level decoding unit 232A includes not only the structure of the level decoding unit 232 according to Embodiment 2 but also as a greater_flag switching unit 260. In addition, functions of a context set selection unit 241A and an arithmetic decoding unit 247A are different from the respective functions of the context set selection unit 241 and the arithmetic decoding unit 247.

<Processing (Level Decoding)>

Figure 39:
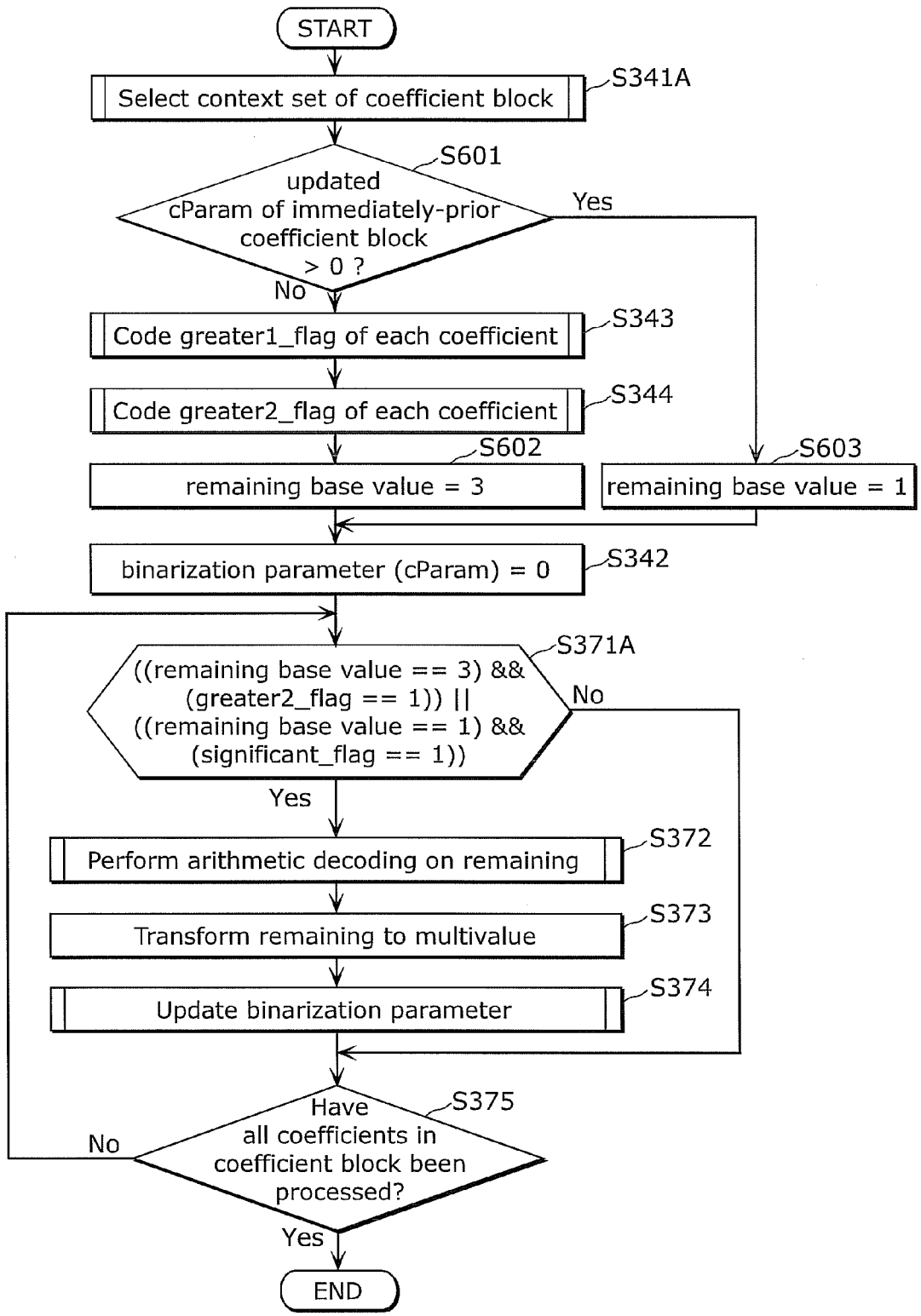
FIG. 39 is a flowchart of level decoding according to Embodiment 4.

Next, referring to FIG. 39, the level decoding is described in more detail. The level decoding according to Embodiment 2 is added with new Steps S601 to S603. Furthermore, Steps S341A and S371A are different from Steps S341 and S371, respectively. It should be noted that the steps identical to those in Embodiment 2 are not explained again below.

(Step S341A)

The context set selection unit 241A sets (selects) respective context set numbers to be used in arithmetic decoding on greater1_flag and arithmetic decoding on greater2_flag. The selection method is the same as the context set selection (FIG. 36) according to Embodiment 3. In other words, the context set selection unit 241A does not select a context based on cParam.

(Step S601)

The greater_flag switching unit 260 determines whether or not a binarization parameter (cParam) that has been updated in processing on an immediately-prior coefficient block is greater than 0. In the same manner as described in Embodiment 2, the greater_flag switching unit 260 decodes greater1_flag and greater2_flag if the binarization parameter is 0, but does not decode greater1_flag and greater2_flag if the binarization parameter is greater than 0.

(Steps S602, S603, and S371A)

If the binarization parameter (cParam) that has been updated for the immediately-prior coefficient block is greater than 0, then the arithmetic decoding unit 247A sets a remaining base value to 1. If the binarization parameter (cParam) is 0, the remaining setting unit 247A sets the remaining base value to 3. If the remaining base value is 3 and greater2_flag of a target coefficient is 1, or if the remaining base value is 1 and significant_flag of the target coefficient is 1, then the level decoding unit 232A decodes remaining at Steps S372 and S373. Otherwise, the level decoding unit 232A does not decode remaining. If remaining is decoded, a numerical value obtained by adding the remaining base value to the decoded remaining is an absolute value of the target coefficient.

<Effects>

As described above, the image decoding apparatus according to the present embodiment can offer the same effects as described in Embodiment 3.

In each of the above-described embodiments, each of the functional blocks can be generally implemented to a MPU (micro processor), a memory, or the like. Furthermore, the processing performed by each of the functional blocks can be generally implemented to software (program), and the software is recorded on a recording medium such as a Read-Only Memory (ROM). Then, such software may be distributed by down-loading, for example, or may be recoded on a recording medium such as a Compact Disc Read Only Memory (CD-ROM) to be distributed. Furthermore, each of the functional blocks may be, of course, implemented to hardware (dedicated circuit).

The processing described in each of the embodiments may be performed as centralized processing by using a single device (system), or as decentralized processing by using a plurality of devices. Furthermore, the above-described program may be executed by a single computer or by a plurality of computers. In other words, both centralized processing and decentralized processing may be performed on the program.

Although the image coding apparatus and the image decoding apparatus have been described with reference to the plurality of embodiments as above, the present disclosure is not limited to these embodiments.

It should also be noted that processing units in each of the image coding apparatus and the image decoding apparatus according to the above embodiments are typically implemented into a Large Scale Integration (LSI) which is an integrated circuit. These may be integrated separately, or a part or all of them may be integrated into a single chip.

It should also be noted that the technique of integrated circuit is not limited to the LSI, and it may be implemented as a dedicated circuit or a general-purpose processor. It is also possible to use a Field Programmable Gate Array (FPGA) that can be programmed after manufacturing the LSI, or a reconfigurable processor in which connection and setting of circuit cells inside the LSI can be reconfigured.

Each of the structural elements in each of the above-described embodiments may be configured in the form of a dedicated hardware product, or may be realized by executing a software program suitable for the structural element. Each of the structural elements may be realized by means of a program executing unit, such as a CPU and a processor, reading and executing the software program recorded on a recording medium such as a hard disk or a semiconductor memory.

In other words, each of the image coding apparatus and the image decoding apparatus includes: control circuitry; and storage electrically connected to the control circuitry and accessible from the control circuitry. The control circuitry includes at least one of the dedicated hardware and the program execution unit. The storage holds the software program executed by the program execution unit, when the control circuitry includes the program execution unit.

Furthermore, the prevent disclosure may be the above-described software program, or may be a non-transitory computer-readable recording medium on which the program is recorded. Of course, the program may be distributed via a transmission medium such as the Internet.

Furthermore, all the numerals in the above description are examples for explaining the present disclosure in more detail. The present discloser is not limited to the example numerals.

Moreover, the dividing of the functional blocks in the block diagrams are examples. It is also possible that a plurality of functional blocks are implemented as one functional block, that one functional block is divided into a plurality of pieces, or that a partial function is shifted to a different functional block. In addition, the functions of the plurality of functional blocks having similar functions may be performed in parallel or in time sharing by a common single hardware or software.

It should also be noted that the order of executing the steps included in each of the above-described image coding method and the above-described image decoding method is the example of explaining the present disclosure in more detail. Therefore, different orders except the above-described order may be used. A part of the steps may be executed at the same time (in parallel) with a different step.

Thus, although only some exemplary embodiments of the image coding apparatus and the image decoding apparatus according to the present disclosure have been described in detail above, the present disclosure is not limited to these embodiments.

Those skilled in the art will be readily appreciated that various modifications of the exemplary embodiments and combinations of the structural elements of the different embodiments are possible without materially departing from the novel teachings and advantages of the present disclosure. Accordingly, all such modifications and combinations are intended to be included within the scope of the present disclosure.

Embodiment 5

The processing described in each of embodiments can be simply implemented in an independent computer system, by recording, in a recording medium, a program for implementing the configurations of the moving picture coding method (image coding method) and the moving picture decoding method (image decoding method) described in each of embodiments. The recording media may be any recording media as long as the program can be recorded, such as a magnetic disk, an optical disk, a magnetic optical disk, an IC card, and a semiconductor memory.

Hereinafter, the applications to the moving picture coding method (image coding method) and the moving picture decoding method (image decoding method) described in each of embodiments and systems using thereof will be described. The system has a feature of having an image coding and decoding apparatus that includes an image coding apparatus using the image coding method and an image decoding apparatus using the image decoding method. Other configurations in the system can be changed as appropriate depending on the cases.

Figure 40:
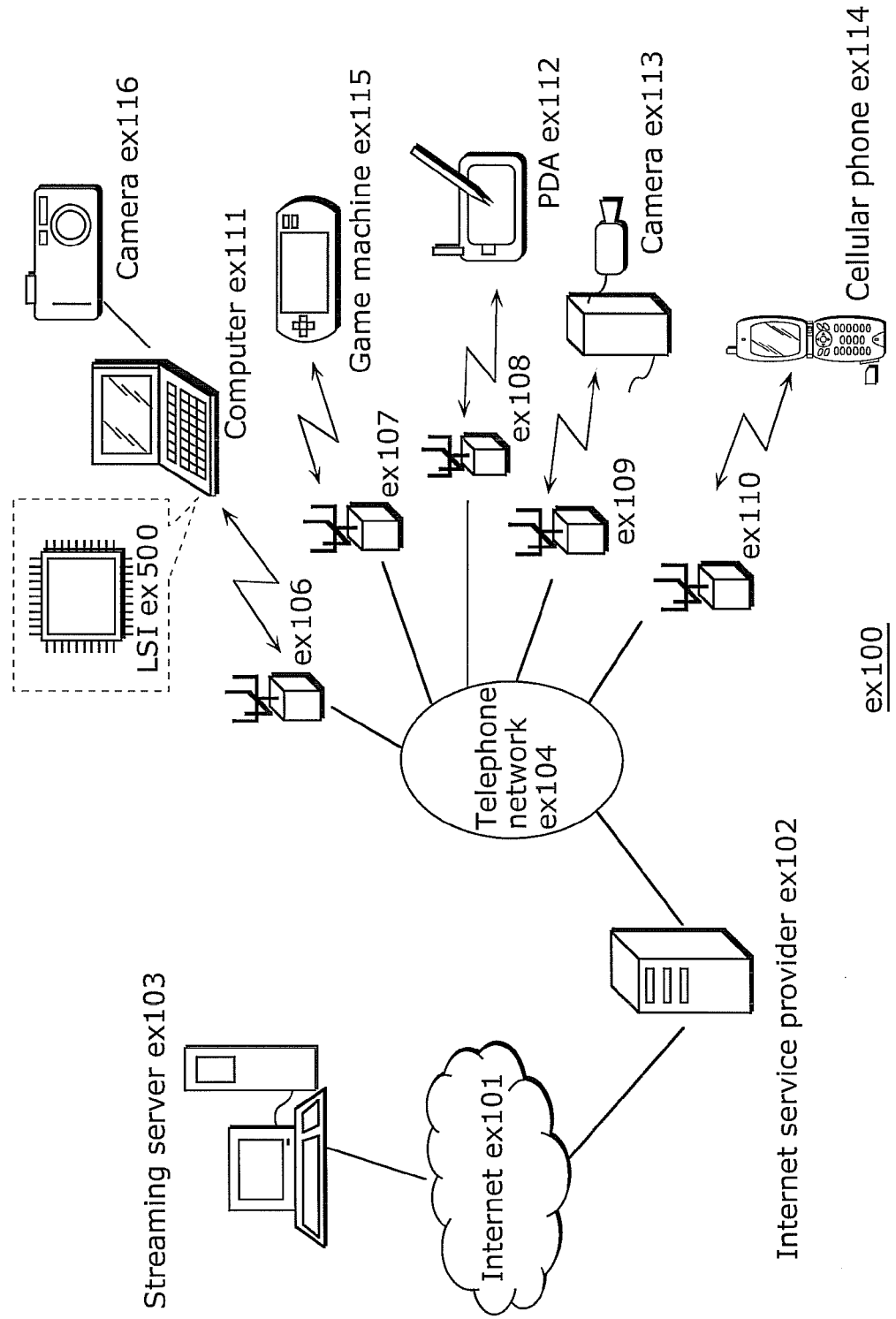
FIG. 40 shows an overall configuration of a content providing system for implementing content distribution services.

FIG. 40 illustrates an overall configuration of a content providing system ex100 for implementing content distribution services. The area for providing communication services is divided into cells of desired size, and base stations ex106, ex107, ex108, ex109, and ex110 which are fixed wireless stations are placed in each of the cells.

The content providing system ex100 is connected to devices, such as a computer ex111, a personal digital assistant (PDA) ex112, a camera ex113, a cellular phone ex114 and a game machine ex115, via the Internet ex101, an Internet service provider ex102, a telephone network ex104, as well as the base stations ex106 to ex110, respectively.

However, the configuration of the content providing system ex100 is not limited to the configuration shown in FIG. 40, and a combination in which any of the elements are connected is acceptable. In addition, each device may be directly connected to the telephone network ex104, rather than via the base stations ex106 to ex110 which are the fixed wireless stations. Furthermore, the devices may be interconnected to each other via a short distance wireless communication and others.

The camera ex113, such as a digital video camera, is capable of capturing video. A camera ex116, such as a digital camera, is capable of capturing both still images and video. Furthermore, the cellular phone ex114 may be the one that meets any of the standards such as Global System for Mobile Communications (GSM) (registered trademark), Code Division Multiple Access (CDMA), Wideband-Code Division Multiple Access (W-CDMA), Long Term Evolution (LTE), and High Speed Packet Access (HSPA). Alternatively, the cellular phone ex114 may be a Personal Handyphone System (PHS).

In the content providing system ex100, a streaming server ex103 is connected to the camera ex113 and others via the telephone network ex104 and the base station ex109, which enables distribution of images of a live show and others. In such a distribution, a content (for example, video of a music live show) captured by the user using the camera ex113 is coded as described above in each of embodiments (i.e., the camera functions as the image coding apparatus according to an aspect of the present disclosure), and the coded content is transmitted to the streaming server ex103. On the other hand, the streaming server ex103 carries out stream distribution of the transmitted content data to the clients upon their requests. The clients include the computer ex111, the PDA ex112, the camera ex113, the cellular phone ex114, and the game machine ex115 that are capable of decoding the above-mentioned coded data. Each of the devices that have received the distributed data decodes and reproduces the coded data (i.e., functions as the image decoding apparatus according to an aspect of the present disclosure).

The captured data may be coded by the camera ex113 or the streaming server ex103 that transmits the data, or the coding processes may be shared between the camera ex113 and the streaming server ex103. Similarly, the distributed data may be decoded by the clients or the streaming server ex103, or the decoding processes may be shared between the clients and the streaming server ex103. Furthermore, the data of the still images and video captured by not only the camera ex113 but also the camera ex116 may be transmitted to the streaming server ex103 through the computer ex111. The coding processes may be performed by the camera ex116, the computer ex111, or the streaming server ex103, or shared among them.

Furthermore, the coding and decoding processes may be performed by an LSI ex500 generally included in each of the computer ex111 and the devices. The LSI ex500 may be configured of a single chip or a plurality of chips. Software for coding and decoding video may be integrated into some type of a recording medium (such as a CD-ROM, a flexible disk, and a hard disk) that is readable by the computer ex111 and others, and the coding and decoding processes may be performed using the software. Furthermore, when the cellular phone ex114 is equipped with a camera, the video data obtained by the camera may be transmitted. The video data is data coded by the LSI ex500 included in the cellular phone ex114.

Furthermore, the streaming server ex103 may be composed of servers and computers, and may decentralize data and process the decentralized data, record, or distribute data.

As described above, the clients may receive and reproduce the coded data in the content providing system ex100. In other words, the clients can receive and decode information transmitted by the user, and reproduce the decoded data in real time in the content providing system ex100, so that the user who does not have any particular right and equipment can implement personal broadcasting.

Figure 41:
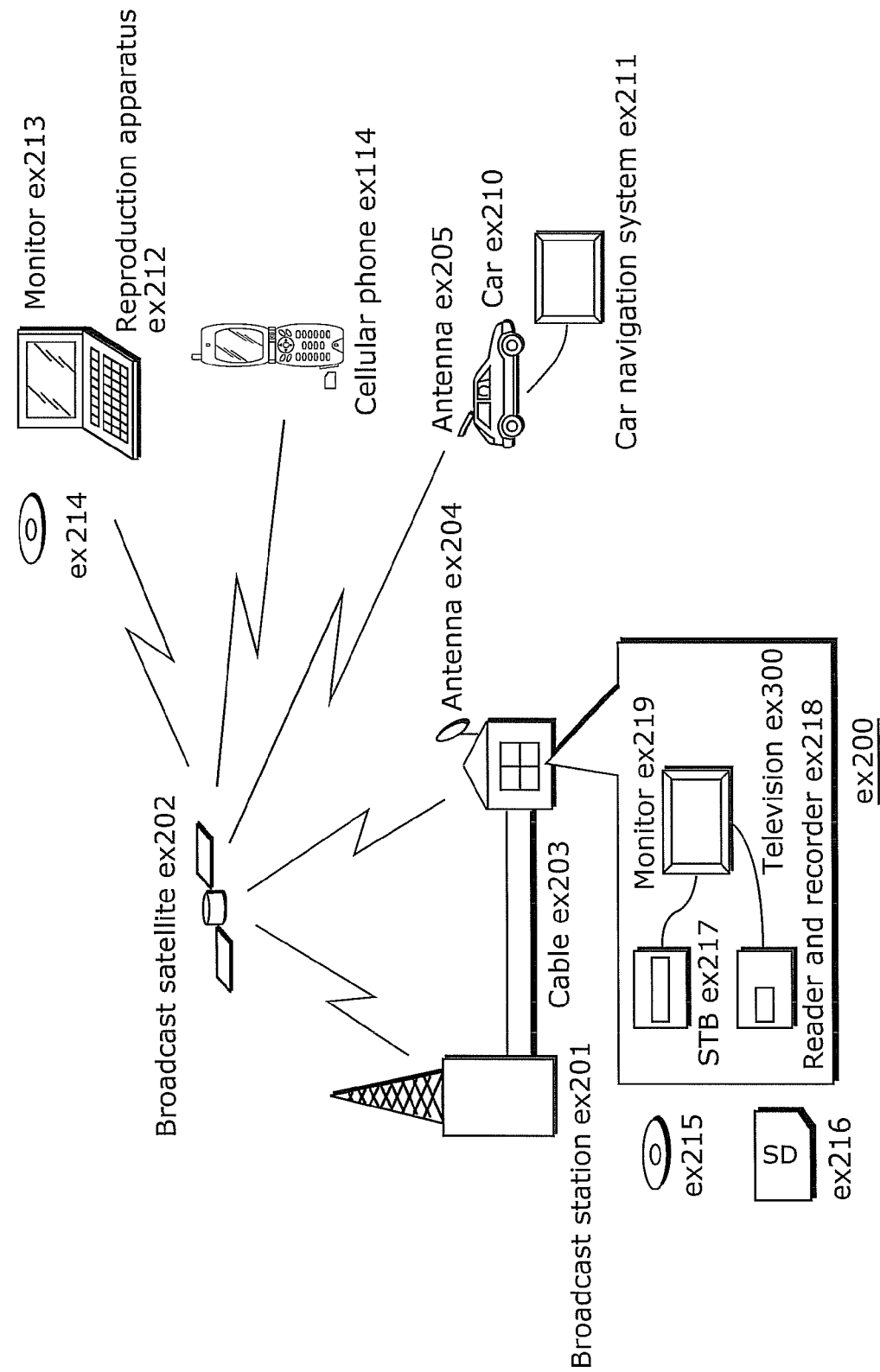
FIG. 41 shows an overall configuration of a digital broadcasting system.

Aside from the example of the content providing system ex100, at least one of the moving picture coding apparatus (image coding apparatus) and the moving picture decoding apparatus (image decoding apparatus) described in each of embodiments may be implemented in a digital broadcasting system ex200 illustrated in FIG. 41. More specifically, a broadcast station ex201 communicates or transmits, via radio waves to a broadcast satellite ex202, multiplexed data obtained by multiplexing audio data and others onto video data. The video data is data coded by the moving picture coding method described in each of embodiments (i.e., data coded by the image coding apparatus according to an aspect of the present disclosure). Upon receipt of the multiplexed data, the broadcast satellite ex202 transmits radio waves for broadcasting. Then, a home-use antenna ex204 with a satellite broadcast reception function receives the radio waves. Next, a device such as a television (receiver) ex300 and a set top box (STB) ex217 decodes the received multiplexed data, and reproduces the decoded data (i.e., functions as the image decoding apparatus according to an aspect of the present disclosure).

Furthermore, a reader/recorder ex218 (i) reads and decodes the multiplexed data recorded on a recording medium ex215, such as a DVD and a BD, or (i) codes video signals in the recording medium ex215, and in some cases, writes data obtained by multiplexing an audio signal on the coded data. The reader/recorder ex218 can include the moving picture decoding apparatus or the moving picture coding apparatus as shown in each of embodiments. In this case, the reproduced video signals are displayed on the monitor ex219, and can be reproduced by another device or system using the recording medium ex215 on which the multiplexed data is recorded. It is also possible to implement the moving picture decoding apparatus in the set top box ex217 connected to the cable ex203 for a cable television or to the antenna ex204 for satellite and/or terrestrial broadcasting, so as to display the video signals on the monitor ex219 of the television ex300. The moving picture decoding apparatus may be implemented not in the set top box but in the television ex300.

Figure 42:
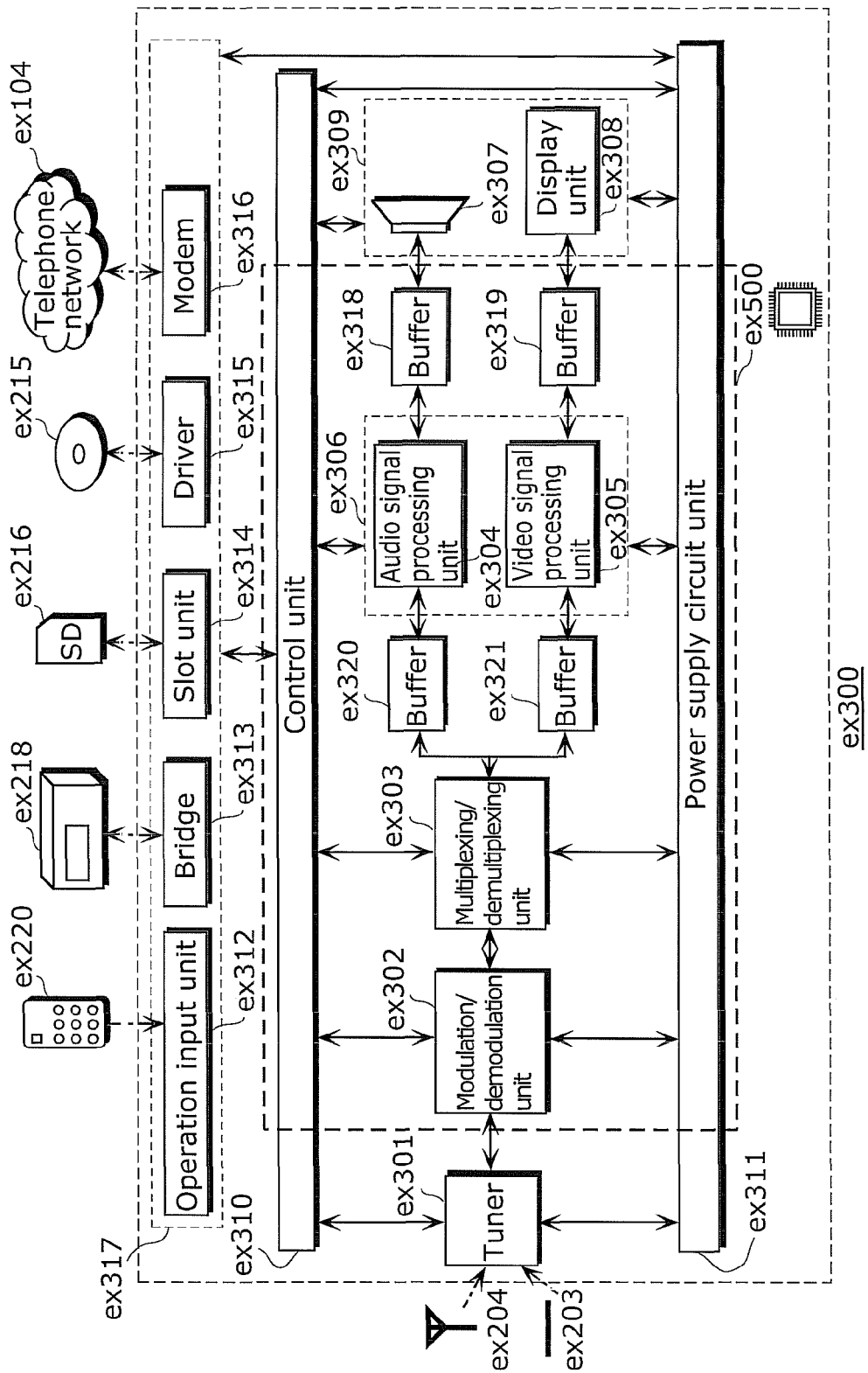
FIG. 42 shows a block diagram illustrating an example of a configuration of a television.

FIG. 42 illustrates the television (receiver) ex300 that uses the moving picture coding method and the moving picture decoding method described in each of embodiments. The television ex300 includes: a tuner ex301 that obtains or provides multiplexed data obtained by multiplexing audio data onto video data, through the antenna ex204 or the cable ex203, etc. that receives a broadcast; a modulation/demodulation unit ex302 that demodulates the received multiplexed data or modulates data into multiplexed data to be supplied outside; and a multiplexing/demultiplexing unit ex303 that demultiplexes the modulated multiplexed data into video data and audio data, or multiplexes video data and audio data coded by a signal processing unit ex306 into data.

The television ex300 further includes: a signal processing unit ex306 including an audio signal processing unit ex304 and a video signal processing unit ex305 that decode audio data and video data and code audio data and video data, respectively (which function as the image coding apparatus and the image decoding apparatus according to the aspects of the present disclosure); and an output unit ex309 including a speaker ex307 that provides the decoded audio signal, and a display unit ex308 that displays the decoded video signal, such as a display. Furthermore, the television ex300 includes an interface unit ex317 including an operation input unit ex312 that receives an input of a user operation. Furthermore, the television ex300 includes a control unit ex310 that controls overall each constituent element of the television ex300, and a power supply circuit unit ex311 that supplies power to each of the elements. Other than the operation input unit ex312, the interface unit ex317 may include: a bridge ex313 that is connected to an external device, such as the reader/recorder ex218; a slot unit ex314 for enabling attachment of the recording medium ex216, such as an SD card; a driver ex315 to be connected to an external recording medium, such as a hard disk; and a modem ex316 to be connected to a telephone network. Here, the recording medium ex216 can electrically record information using a non-volatile/volatile semiconductor memory element for storage. The constituent elements of the television ex300 are connected to each other through a synchronous bus.

First, the configuration in which the television ex300 decodes multiplexed data obtained from outside through the antenna ex204 and others and reproduces the decoded data will be described. In the television ex300, upon a user operation through a remote controller ex220 and others, the multiplexing/demultiplexing unit ex303 demultiplexes the multiplexed data demodulated by the modulation/demodulation unit ex302, under control of the control unit ex310 including a CPU. Furthermore, the audio signal processing unit ex304 decodes the demultiplexed audio data, and the video signal processing unit ex305 decodes the demultiplexed video data, using the decoding method described in each of embodiments, in the television ex300. The output unit ex309 provides the decoded video signal and audio signal outside, respectively. When the output unit ex309 provides the video signal and the audio signal, the signals may be temporarily stored in buffers ex318 and ex319, and others so that the signals are reproduced in synchronization with each other. Furthermore, the television ex300 may read multiplexed data not through a broadcast and others but from the recording media ex215 and ex216, such as a magnetic disk, an optical disk, and a SD card. Next, a configuration in which the television ex300 codes an audio signal and a video signal, and transmits the data outside or writes the data on a recording medium will be described. In the television ex300, upon a user operation through the remote controller ex220 and others, the audio signal processing unit ex304 codes an audio signal, and the video signal processing unit ex305 codes a video signal, under control of the control unit ex310 using the coding method described in each of embodiments. The multiplexing/demultiplexing unit ex303 multiplexes the coded video signal and audio signal, and provides the resulting signal outside. When the multiplexing/demultiplexing unit ex303 multiplexes the video signal and the audio signal, the signals may be temporarily stored in the buffers ex320 and ex321, and others so that the signals are reproduced in synchronization with each other. Here, the buffers ex318, ex319, ex320, and ex321 may be plural as illustrated, or at least one buffer may be shared in the television ex300. Furthermore, data may be stored in a buffer so that the system overflow and underflow may be avoided between the modulation/demodulation unit ex302 and the multiplexing/demultiplexing unit ex303, for example.

Furthermore, the television ex300 may include a configuration for receiving an AV input from a microphone or a camera other than the configuration for obtaining audio and video data from a broadcast or a recording medium, and may code the obtained data. Although the television ex300 can code, multiplex, and provide outside data in the description, it may be capable of only receiving, decoding, and providing outside data but not the coding, multiplexing, and providing outside data.

Furthermore, when the reader/recorder ex218 reads or writes multiplexed data from or on a recording medium, one of the television ex300 and the reader/recorder ex218 may decode or code the multiplexed data, and the television ex300 and the reader/recorder ex218 may share the decoding or coding.

Figure 43:
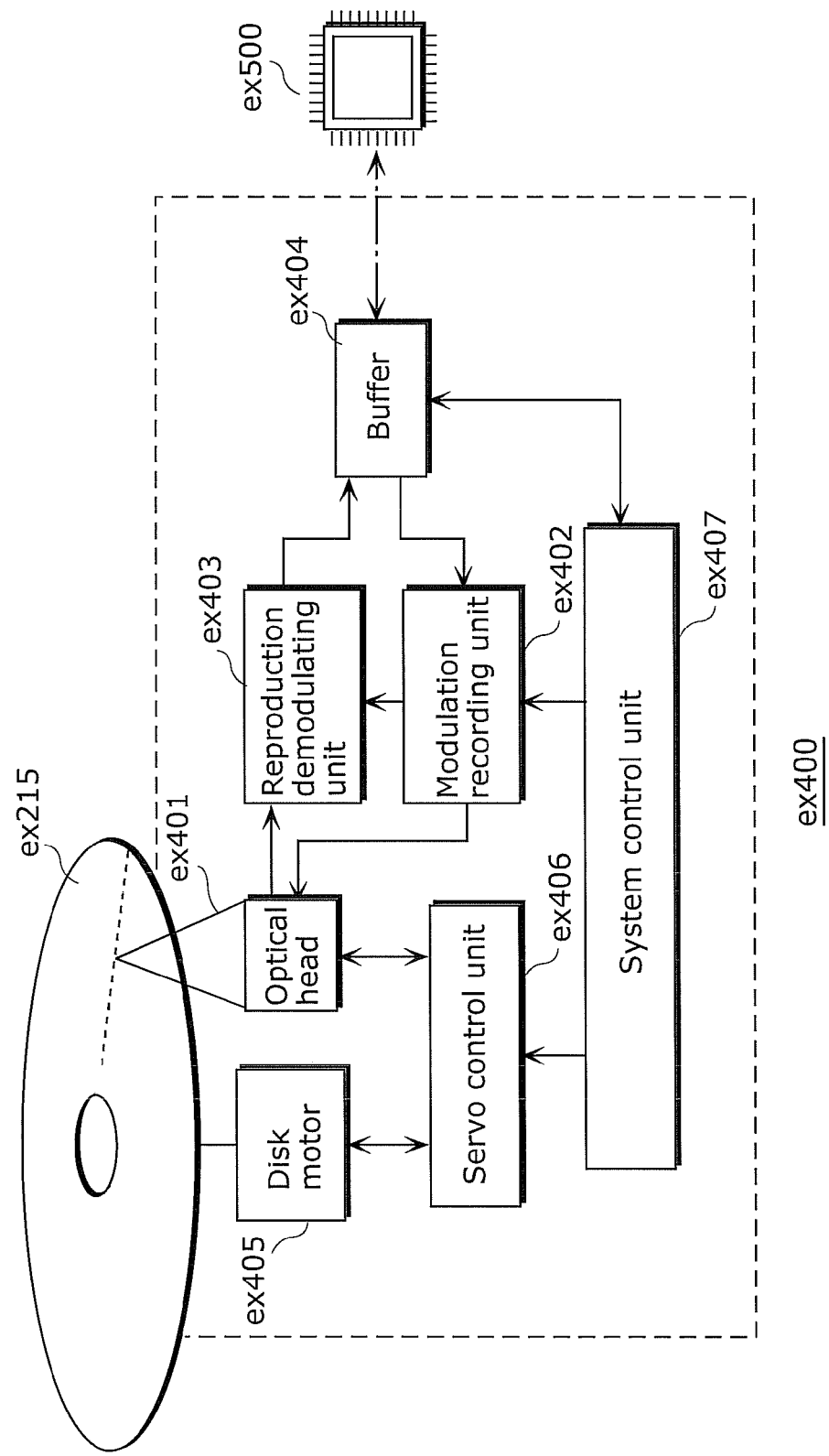
FIG. 43 shows a block diagram illustrating an example of a configuration of an information reproducing/recording unit that reads and writes information from and on a recording medium that is an optical disk.

As an example, FIG. 43 illustrates a configuration of an information reproducing/recording unit ex400 when data is read or written from or on an optical disk. The information reproducing/recording unit ex400 includes constituent elements ex401, ex402, ex403, ex404, ex405, ex406, and ex407 to be described hereinafter. The optical head ex401 irradiates a laser spot in a recording surface of the recording medium ex215 that is an optical disk to write information, and detects reflected light from the recording surface of the recording medium ex215 to read the information. The modulation recording unit ex402 electrically drives a semiconductor laser included in the optical head ex401, and modulates the laser light according to recorded data. The reproduction demodulating unit ex403 amplifies a reproduction signal obtained by electrically detecting the reflected light from the recording surface using a photo detector included in the optical head ex401, and demodulates the reproduction signal by separating a signal component recorded on the recording medium ex215 to reproduce the necessary information. The buffer ex404 temporarily holds the information to be recorded on the recording medium ex215 and the information reproduced from the recording medium ex215. The disk motor ex405 rotates the recording medium ex215. The servo control unit ex406 moves the optical head ex401 to a predetermined information track while controlling the rotation drive of the disk motor ex405 so as to follow the laser spot. The system control unit ex407 controls overall the information reproducing/recording unit ex400. The reading and writing processes can be implemented by the system control unit ex407 using various information stored in the buffer ex404 and generating and adding new information as necessary, and by the modulation recording unit ex402, the reproduction demodulating unit ex403, and the servo control unit ex406 that record and reproduce information through the optical head ex401 while being operated in a coordinated manner. The system control unit ex407 includes, for example, a microprocessor, and executes processing by causing a computer to execute a program for read and write.

Figure 44:
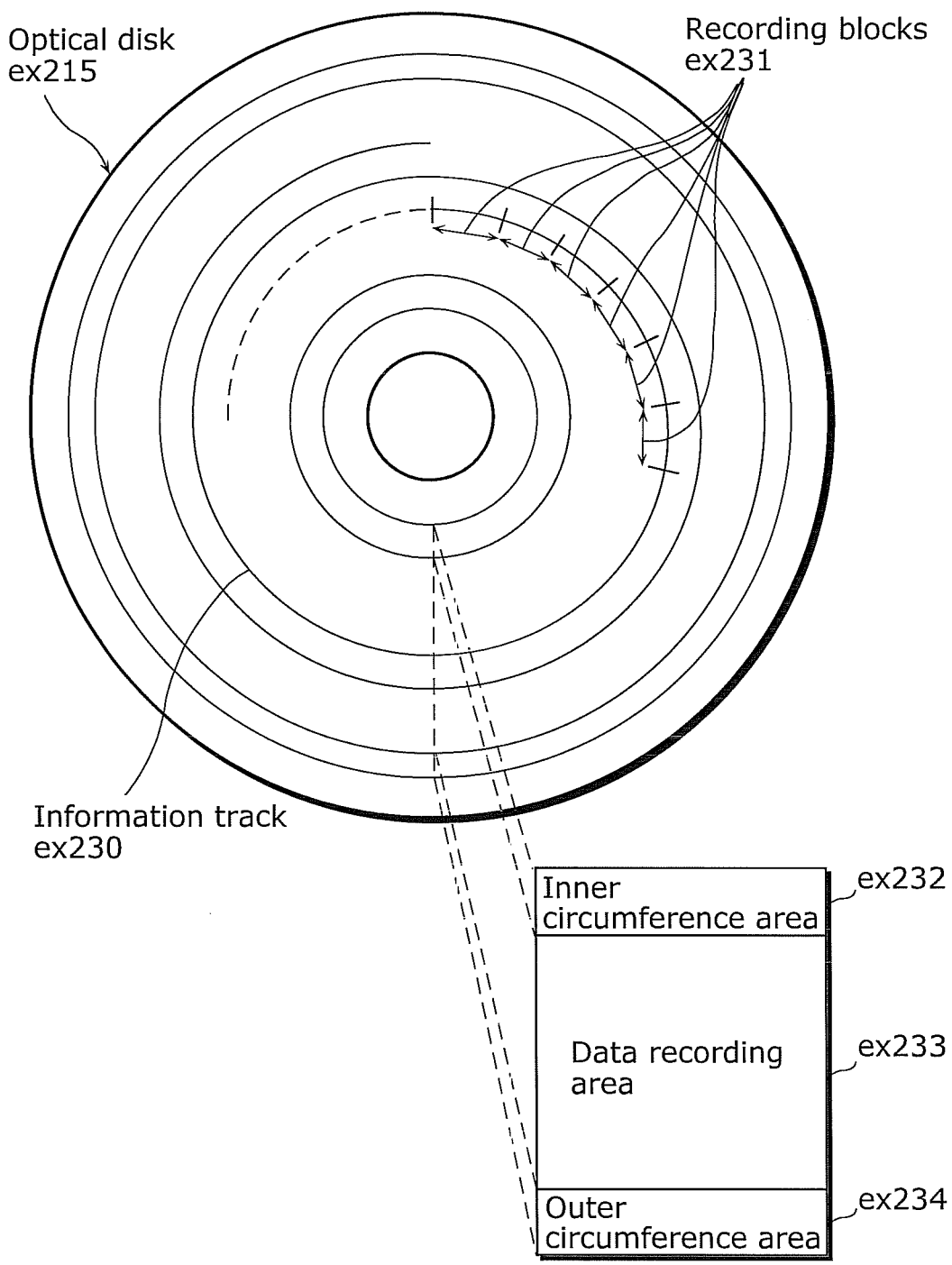
FIG. 44 shows an example of a configuration of a recording medium that is an optical disk.

Although the optical head ex401 irradiates a laser spot in the description, it may perform high-density recording using near field light FIG. 44 illustrates the recording medium ex215 that is the optical disk. On the recording surface of the recording medium ex215, guide grooves are spirally formed, and an information track ex230 records, in advance, address information indicating an absolute position on the disk according to change in a shape of the guide grooves. The address information includes information for determining positions of recording blocks ex231 that are a unit for recording data. Reproducing the information track ex230 and reading the address information in an apparatus that records and reproduces data can lead to determination of the positions of the recording blocks. Furthermore, the recording medium ex215 includes a data recording area ex233, an inner circumference area ex232, and an outer circumference area ex234. The data recording area ex233 is an area for use in recording the user data. The inner circumference area ex232 and the outer circumference area ex234 that are inside and outside of the data recording area ex233, respectively are for specific use except for recording the user data. The information reproducing/recording unit 400 reads and writes coded audio, coded video data, or multiplexed data obtained by multiplexing the coded audio and video data, from and on the data recording area ex233 of the recording medium ex215.

Although an optical disk having a layer, such as a DVD and a BD is described as an example in the description, the optical disk is not limited to such, and may be an optical disk having a multilayer structure and capable of being recorded on a part other than the surface. Furthermore, the optical disk may have a structure for multidimensional recording/reproduction, such as recording of information using light of colors with different wavelengths in the same portion of the optical disk and for recording information having different layers from various angles Furthermore, a car ex210 having an antenna ex205 can receive data from the satellite ex202 and others, and reproduce video on a display device such as a car navigation system ex211 set in the car ex210, in the digital broadcasting system ex200. Here, a configuration of the car navigation system ex211 will be a configuration, for example, including a GPS receiving unit from the configuration illustrated in FIG. 42. The same will be true for the configuration of the computer ex111, the cellular phone ex114, and others.

Figure 45A:
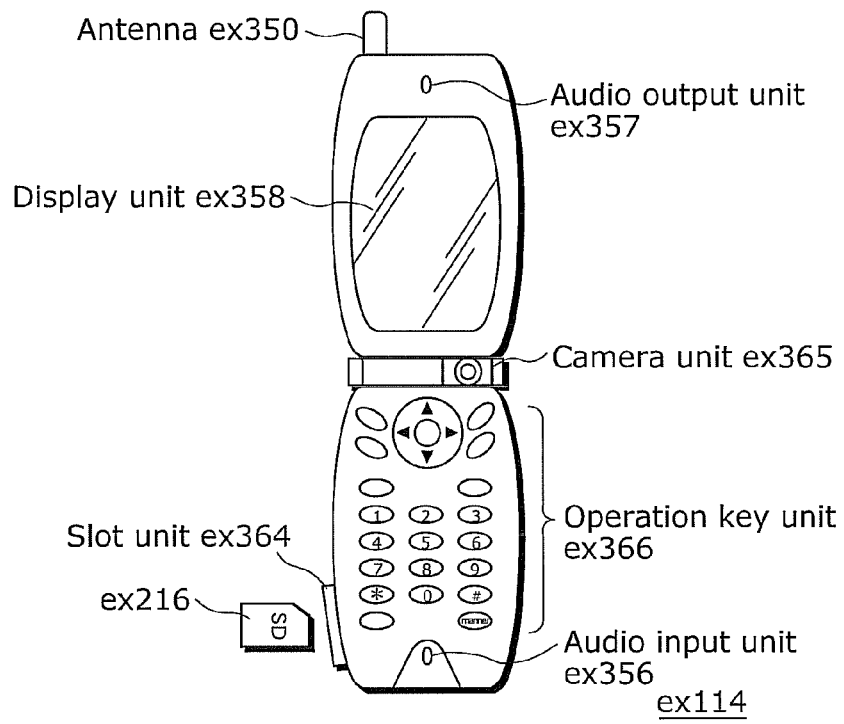
FIG. 45A shows an example of a cellular phone.

FIG. 45A illustrates the cellular phone ex114 that uses the moving picture coding method and the moving picture decoding method described in embodiments. The cellular phone ex114 includes: an antenna ex350 for transmitting and receiving radio waves through the base station ex110; a camera unit ex365 capable of capturing moving and still images; and a display unit ex358 such as a liquid crystal display for displaying the data such as decoded video captured by the camera unit ex365 or received by the antenna ex350. The cellular phone ex114 further includes: a main body unit including an operation key unit ex366; an audio output unit ex357 such as a speaker for output of audio; an audio input unit ex356 such as a microphone for input of audio; a memory unit ex367 for storing captured video or still pictures, recorded audio, coded or decoded data of the received video, the still pictures, e-mails, or others; and a slot unit ex364 that is an interface unit for a recording medium that stores data in the same manner as the memory unit ex367.

Figure 45B:
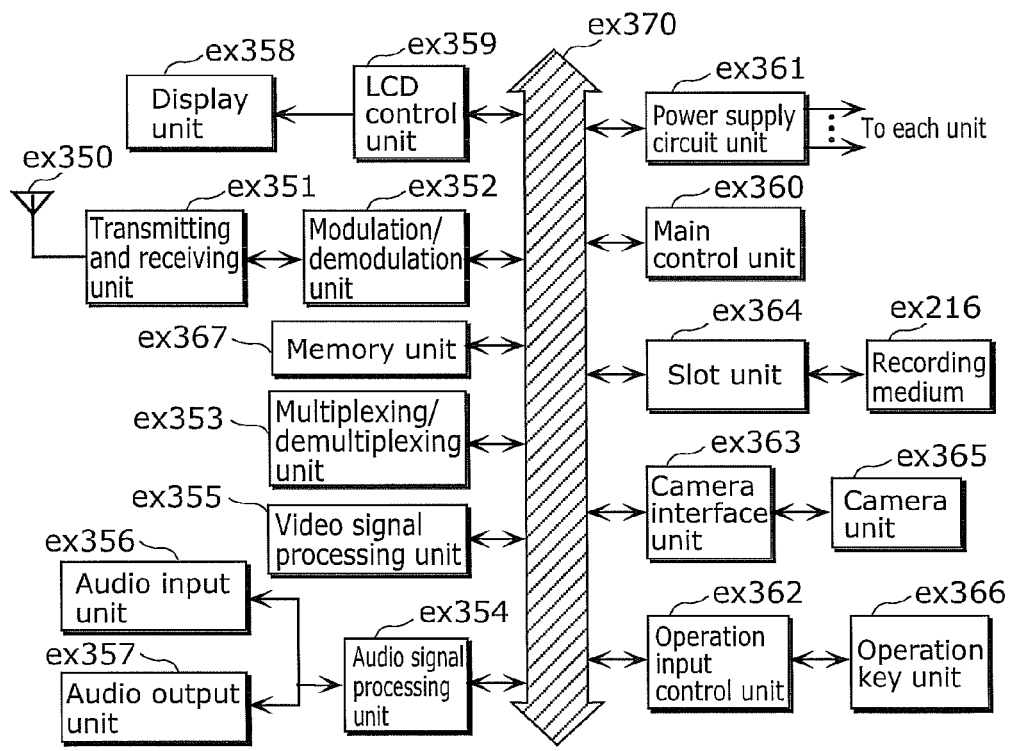
FIG. 45B is a block diagram showing an example of a configuration of a cellular phone.

Next, an example of a configuration of the cellular phone ex114 will be described with reference to FIG. 45B. In the cellular phone ex114, a main control unit ex360 designed to control overall each unit of the main body including the display unit ex358 as well as the operation key unit ex366 is connected mutually, via a synchronous bus ex370, to a power supply circuit unit ex361, an operation input control unit ex362, a video signal processing unit ex355, a camera interface unit ex363, a liquid crystal display (LCD) control unit ex359, a modulation/demodulation unit ex352, a multiplexing/demultiplexing unit ex353, an audio signal processing unit ex354, the slot unit ex364, and the memory unit ex367.

When a call-end key or a power key is turned ON by a user's operation, the power supply circuit unit ex361 supplies the respective units with power from a battery pack so as to activate the cell phone ex114.

In the cellular phone ex114, the audio signal processing unit ex354 converts the audio signals collected by the audio input unit ex356 in voice conversation mode into digital audio signals under the control of the main control unit ex360 including a CPU, ROM, and RAM. Then, the modulation/demodulation unit ex352 performs spread spectrum processing on the digital audio signals, and the transmitting and receiving unit ex351 performs digital-to-analog conversion and frequency conversion on the data, so as to transmit the resulting data via the antenna ex350. Also, in the cellular phone ex114, the transmitting and receiving unit ex351 amplifies the data received by the antenna ex350 in voice conversation mode and performs frequency conversion and the analog-to-digital conversion on the data. Then, the modulation/demodulation unit ex352 performs inverse spread spectrum processing on the data, and the audio signal processing unit ex354 converts it into analog audio signals, so as to output them via the audio output unit ex357.

Furthermore, when an e-mail in data communication mode is transmitted, text data of the e-mail inputted by operating the operation key unit ex366 and others of the main body is sent out to the main control unit ex360 via the operation input control unit ex362. The main control unit ex360 causes the modulation/demodulation unit ex352 to perform spread spectrum processing on the text data, and the transmitting and receiving unit ex351 performs the digital-to-analog conversion and the frequency conversion on the resulting data to transmit the data to the base station ex110 via the antenna ex350. When an e-mail is received, processing that is approximately inverse to the processing for transmitting an e-mail is performed on the received data, and the resulting data is provided to the display unit ex358.

When video, still images, or video and audio in data communication mode is or are transmitted, the video signal processing unit ex355 compresses and codes video signals supplied from the camera unit ex365 using the moving picture coding method shown in each of embodiments (i.e., functions as the image coding apparatus according to the aspect of the present disclosure), and transmits the coded video data to the multiplexing/demultiplexing unit ex353. In contrast, during when the camera unit ex365 captures video, still images, and others, the audio signal processing unit ex354 codes audio signals collected by the audio input unit ex356, and transmits the coded audio data to the multiplexing/demultiplexing unit ex353.

The multiplexing/demultiplexing unit ex353 multiplexes the coded video data supplied from the video signal processing unit ex355 and the coded audio data supplied from the audio signal processing unit ex354, using a predetermined method. Then, the modulation/demodulation unit (modulation/demodulation circuit unit) ex352 performs spread spectrum processing on the multiplexed data, and the transmitting and receiving unit ex351 performs digital-to-analog conversion and frequency conversion on the data so as to transmit the resulting data via the antenna ex350.

When receiving data of a video file which is linked to a Web page and others in data communication mode or when receiving an e-mail with video and/or audio attached, in order to decode the multiplexed data received via the antenna ex350, the multiplexing/demultiplexing unit ex353 demultiplexes the multiplexed data into a video data bit stream and an audio data bit stream, and supplies the video signal processing unit ex355 with the coded video data and the audio signal processing unit ex354 with the coded audio data, through the synchronous bus ex370. The video signal processing unit ex355 decodes the video signal using a moving picture decoding method corresponding to the moving picture coding method shown in each of embodiments (i.e., functions as the image decoding apparatus according to the aspect of the present disclosure), and then the display unit ex358 displays, for instance, the video and still images included in the video file linked to the Web page via the LCD control unit ex359. Furthermore, the audio signal processing unit ex354 decodes the audio signal, and the audio output unit ex357 provides the audio.

Furthermore, similarly to the television ex300, a terminal such as the cellular phone ex114 probably have 3 types of implementation configurations including not only (i) a transmitting and receiving terminal including both a coding apparatus and a decoding apparatus, but also (ii) a transmitting terminal including only a coding apparatus and (iii) a receiving terminal including only a decoding apparatus. Although the digital broadcasting system ex200 receives and transmits the multiplexed data obtained by multiplexing audio data onto video data in the description, the multiplexed data may be data obtained by multiplexing not audio data but character data related to video onto video data, and may be not multiplexed data but video data itself.

As such, the moving picture coding method and the moving picture decoding method in each of embodiments can be used in any of the devices and systems described. Thus, the advantages described in each of embodiments can be obtained.

Furthermore, various modifications and revisions can be made in any of the embodiments in the present disclosure.

Embodiment 6

Video data can be generated by switching, as necessary, between (i) the moving picture coding method or the moving picture coding apparatus shown in each of embodiments and (ii) a moving picture coding method or a moving picture coding apparatus in conformity with a different standard, such as MPEG-2, MPEG-4 AVC, and VC-1.

Here, when a plurality of video data that conforms to the different standards is generated and is then decoded, the decoding methods need to be selected to conform to the different standards. However, since to which standard each of the plurality of the video data to be decoded conform cannot be detected, there is a problem that an appropriate decoding method cannot be selected.

In order to solve the problem, multiplexed data obtained by multiplexing audio data and others onto video data has a structure including identification information indicating to which standard the video data conforms. The specific structure of the multiplexed data including the video data generated in the moving picture coding method and by the moving picture coding apparatus shown in each of embodiments will be hereinafter described. The multiplexed data is a digital stream in the MPEG-2 Transport Stream format.

FIG. 46 illustrates a structure of the multiplexed data. As illustrated in FIG. 46, the multiplexed data can be obtained by multiplexing at least one of a video stream, an audio stream, a presentation graphics stream (PG), and an interactive graphics stream. The video stream represents primary video and secondary video of a movie, the audio stream (IG) represents a primary audio part and a secondary audio part to be mixed with the primary audio part, and the presentation graphics stream represents subtitles of the movie. Here, the primary video is normal video to be displayed on a screen, and the secondary video is video to be displayed on a smaller window in the primary video. Furthermore, the interactive graphics stream represents an interactive screen to be generated by arranging the GUI components on a screen. The video stream is coded in the moving picture coding method or by the moving picture coding apparatus shown in each of embodiments, or in a moving picture coding method or by a moving picture coding apparatus in conformity with a conventional standard, such as MPEG-2, MPEG-4 AVC, and VC-1. The audio stream is coded in accordance with a standard, such as Dolby-AC-3, Dolby Digital Plus, MLP, DTS, DTS-HD, and linear PCM.

Each stream included in the multiplexed data is identified by PID. For example, 0x1011 is allocated to the video stream to be used for video of a movie, 0x1100 to 0x111F are allocated to the audio streams, 0x1200 to 0x121F are allocated to the presentation graphics streams, 0x1400 to 0x141F are allocated to the interactive graphics streams, 0x1B00 to 0x1B1F are allocated to the video streams to be used for secondary video of the movie, and 0x1A00 to 0x1A1F are allocated to the audio streams to be used for the secondary audio to be mixed with the primary audio.

Figure 47:
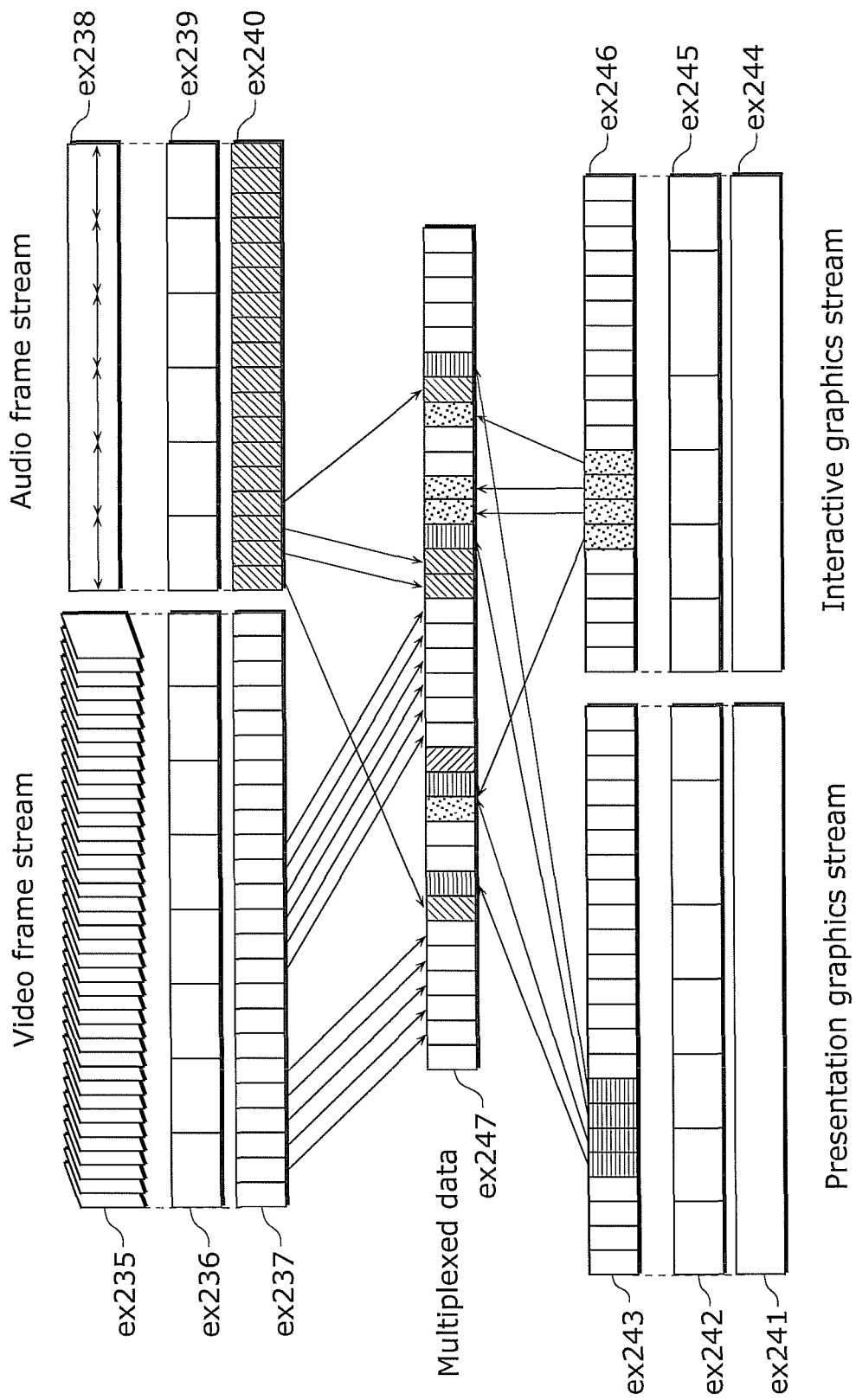
FIG. 47 schematically shows how each stream is multiplexed in multiplexed data.

FIG. 47 schematically illustrates how data is multiplexed. First, a video stream ex235 composed of video frames and an audio stream ex238 composed of audio frames are transformed into a stream of PES packets ex236 and a stream of PES packets ex239, and further into TS packets ex237 and TS packets ex240, respectively. Similarly, data of a presentation graphics stream ex241 and data of an interactive graphics stream ex244 are transformed into a stream of PES packets ex242 and a stream of PES packets ex245, and further into TS packets ex243 and TS packets ex246, respectively. These TS packets are multiplexed into a stream to obtain multiplexed data ex247.

Figure 48:
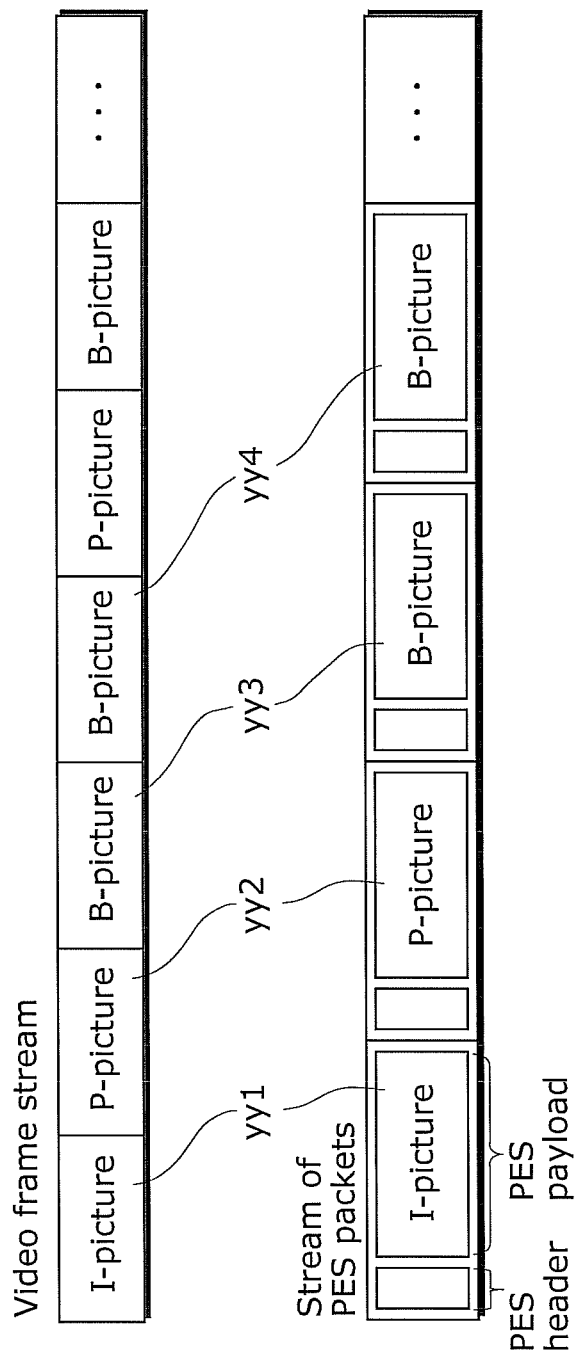
FIG. 48 shows how a video stream is stored in a stream of PES packets in more detail.

FIG. 48 illustrates how a video stream is stored in a stream of PES packets in more detail. The first bar in FIG. 48 shows a video frame stream in a video stream. The second bar shows the stream of PES packets. As indicated by arrows denoted as yy1, yy2, yy3, and yy4 in FIG. 48, the video stream is divided into pictures as I pictures, B pictures, and P pictures each of which is a video presentation unit, and the pictures are stored in a payload of each of the PES packets. Each of the PES packets has a PES header, and the PES header stores a Presentation Time-Stamp (PTS) indicating a display time of the picture, and a Decoding Time-Stamp (DTS) indicating a decoding time of the picture.

Figure 49:
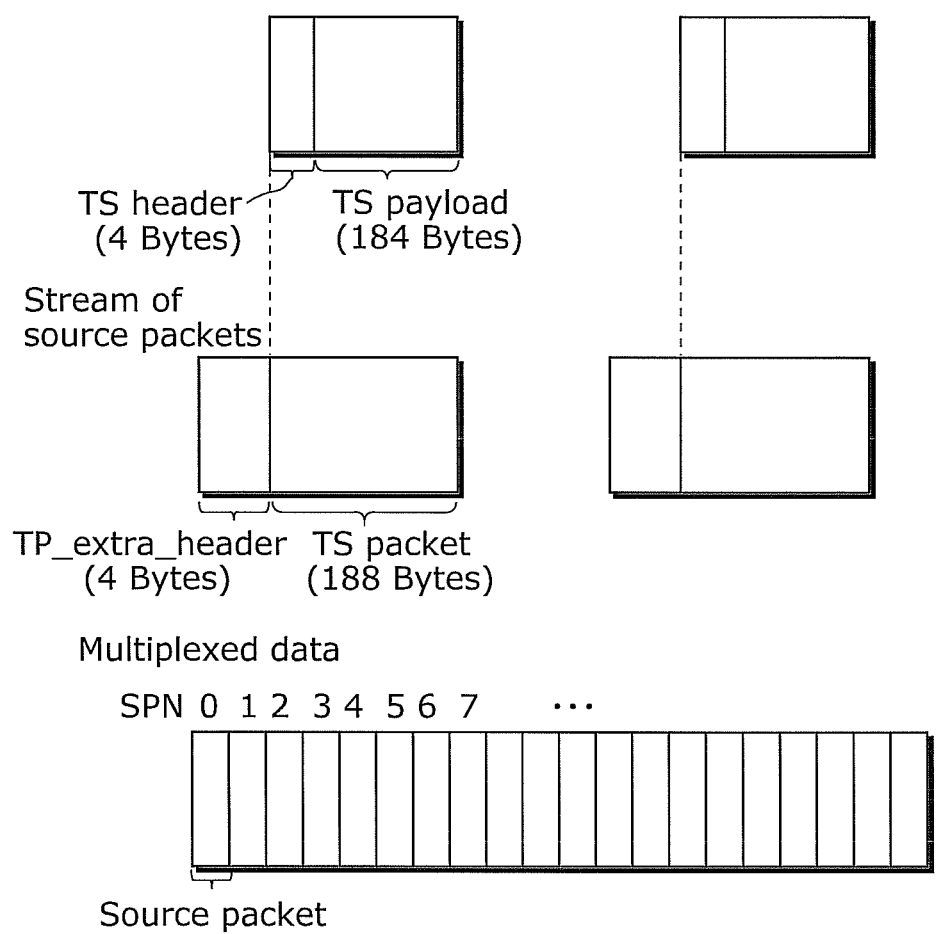
FIG. 49 shows a structure of TS packets and source packets in the multiplexed data.

FIG. 49 illustrates a format of TS packets to be finally written on the multiplexed data. Each of the TS packets is a 188-byte fixed length packet including a 4-byte TS header having information, such as a PID for identifying a stream and a 184-byte TS payload for storing data. The PES packets are divided, and stored in the TS payloads, respectively. When a BD ROM is used, each of the TS packets is given a 4-byte TP_Extra_Header, thus resulting in 192-byte source packets. The source packets are written on the multiplexed data. The TP_Extra_Header stores information such as an Arrival_Time_Stamp (ATS). The ATS shows a transfer start time at which each of the TS packets is to be transferred to a PID filter. The source packets are arranged in the multiplexed data as shown at the bottom of FIG. 49. The numbers incrementing from the head of the multiplexed data are called source packet numbers (SPNs).

Each of the TS packets included in the multiplexed data includes not only streams of audio, video, subtitles and others, but also a Program Association Table (PAT), a Program Map Table (PMT), and a Program Clock Reference (PCR). The PAT shows what a PID in a PMT used in the multiplexed data indicates, and a PID of the PAT itself is registered as zero. The PMT stores PIDs of the streams of video, audio, subtitles and others included in the multiplexed data, and attribute information of the streams corresponding to the PIDs. The PMT also has various descriptors relating to the multiplexed data. The descriptors have information such as copy control information showing whether copying of the multiplexed data is permitted or not. The PCR stores STC time information corresponding to an ATS showing when the PCR packet is transferred to a decoder, in order to achieve synchronization between an Arrival Time Clock (ATC) that is a time axis of ATSs, and an System Time Clock (STC) that is a time axis of PTSs and DTSs.

Figure 50:
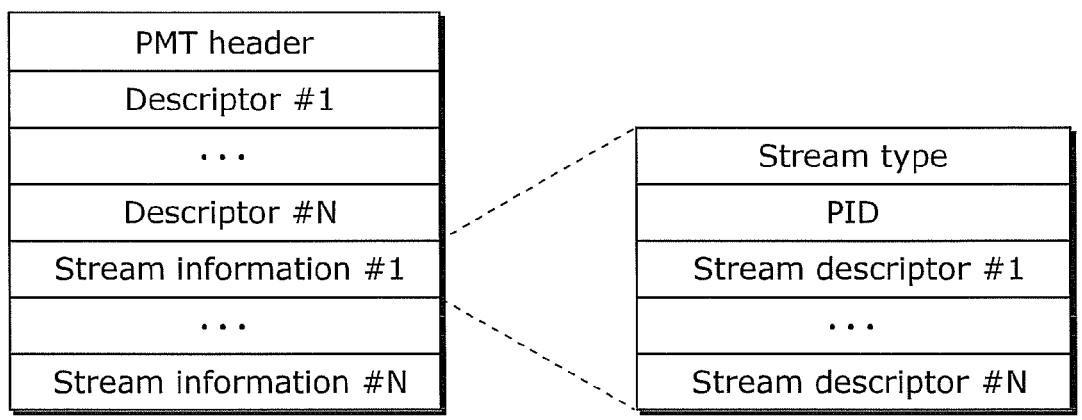
FIG. 50 shows a data structure of a PMT.

FIG. 50 illustrates the data structure of the PMT in detail. A PMT header is disposed at the top of the PMT. The PMT header describes the length of data included in the PMT and others. A plurality of descriptors relating to the multiplexed data is disposed after the PMT header. Information such as the copy control information is described in the descriptors. After the descriptors, a plurality of pieces of stream information relating to the streams included in the multiplexed data is disposed. Each piece of stream information includes stream descriptors each describing information, such as a stream type for identifying a compression codec of a stream, a stream PID, and stream attribute information (such as a frame rate or an aspect ratio). The stream descriptors are equal in number to the number of streams in the multiplexed data.

When the multiplexed data is recorded on a recording medium and others, it is recorded together with multiplexed data information files.

Figure 51:
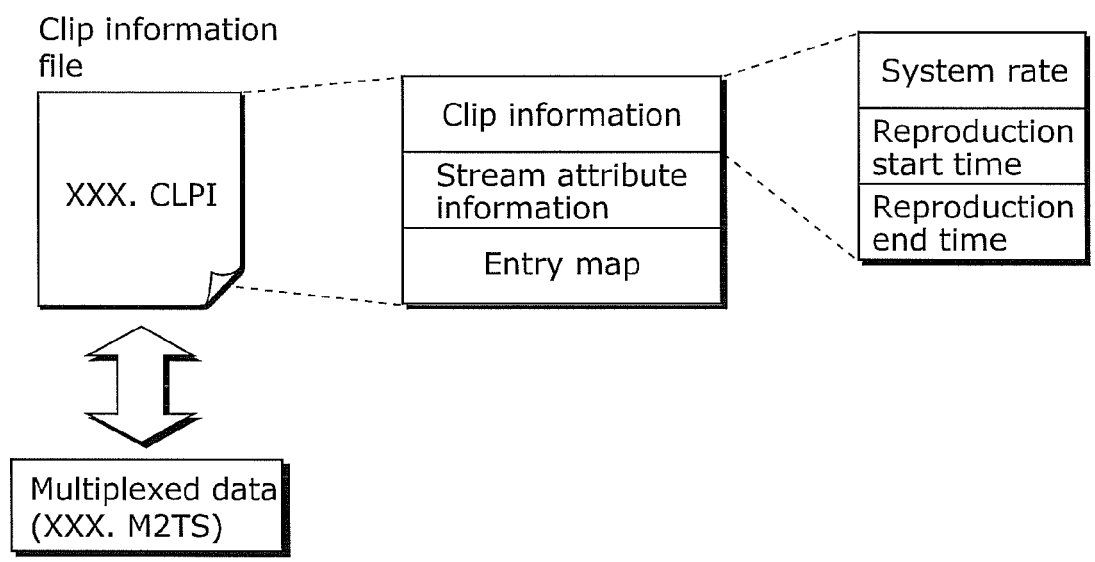
FIG. 51 shows an internal structure of multiplexed data information.

Each of the multiplexed data information files is management information of the multiplexed data as shown in FIG. 51. The multiplexed data information files are in one to one correspondence with the multiplexed data, and each of the files includes multiplexed data information, stream attribute information, and an entry map.

As illustrated in FIG. 51, the multiplexed data information includes a system rate, a reproduction start time, and a reproduction end time. The system rate indicates the maximum transfer rate at which a system target decoder to be described later transfers the multiplexed data to a PID filter. The intervals of the ATSs included in the multiplexed data are set to not higher than a system rate. The reproduction start time indicates a PTS in a video frame at the head of the multiplexed data. An interval of one frame is added to a PTS in a video frame at the end of the multiplexed data, and the PTS is set to the reproduction end time.

Figure 52:
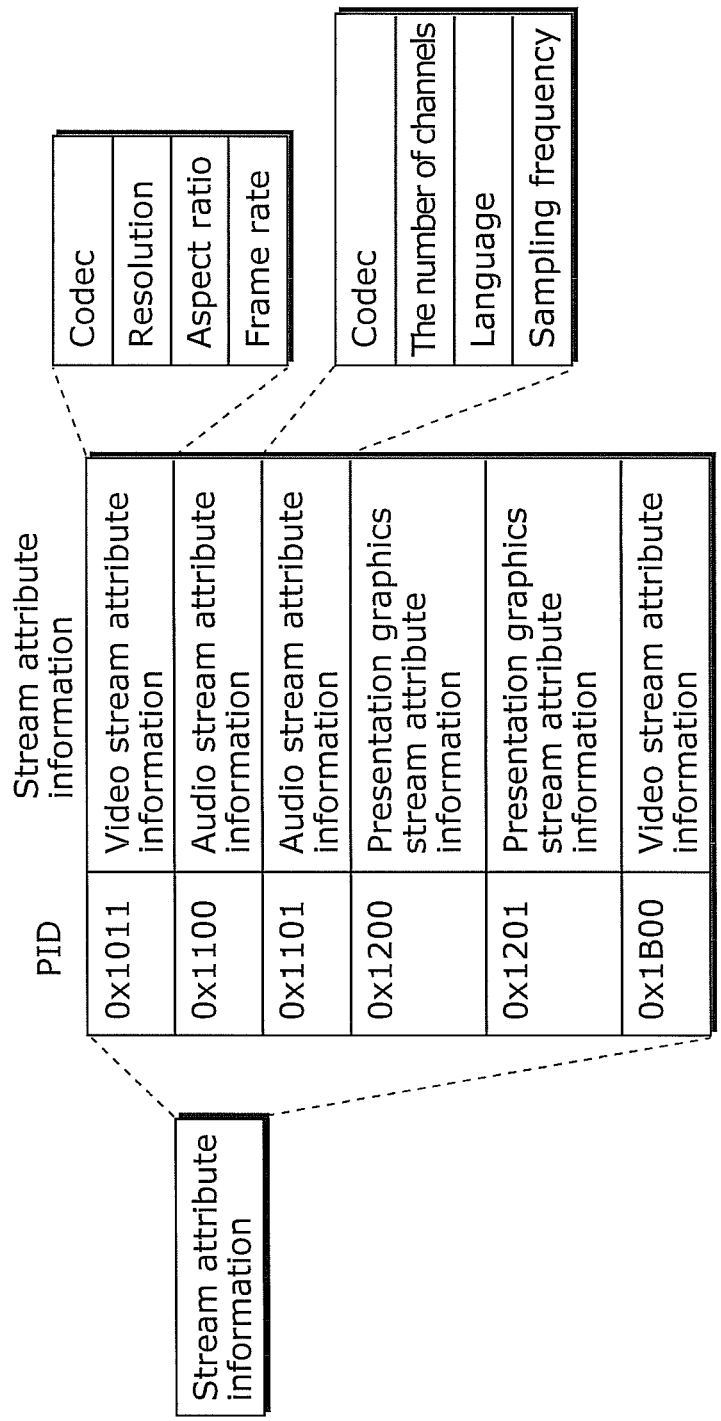
FIG. 52 shows an internal structure of stream attribute information.

As shown in FIG. 52, a piece of attribute information is registered in the stream attribute information, for each PID of each stream included in the multiplexed data. Each piece of attribute information has different information depending on whether the corresponding stream is a video stream, an audio stream, a presentation graphics stream, or an interactive graphics stream. Each piece of video stream attribute information carries information including what kind of compression codec is used for compressing the video stream, and the resolution, aspect ratio and frame rate of the pieces of picture data that is included in the video stream. Each piece of audio stream attribute information carries information including what kind of compression codec is used for compressing the audio stream, how many channels are included in the audio stream, which language the audio stream supports, and how high the sampling frequency is. The video stream attribute information and the audio stream attribute information are used for initialization of a decoder before the player plays back the information.

In the present embodiment, the multiplexed data to be used is of a stream type included in the PMT. Furthermore, when the multiplexed data is recorded on a recording medium, the video stream attribute information included in the multiplexed data information is used. More specifically, the moving picture coding method or the moving picture coding apparatus described in each of embodiments includes a step or a unit for allocating unique information indicating video data generated by the moving picture coding method or the moving picture coding apparatus in each of embodiments, to the stream type included in the PMT or the video stream attribute information. With the configuration, the video data generated by the moving picture coding method or the moving picture coding apparatus described in each of embodiments can be distinguished from video data that conforms to another standard.

Figure 53:
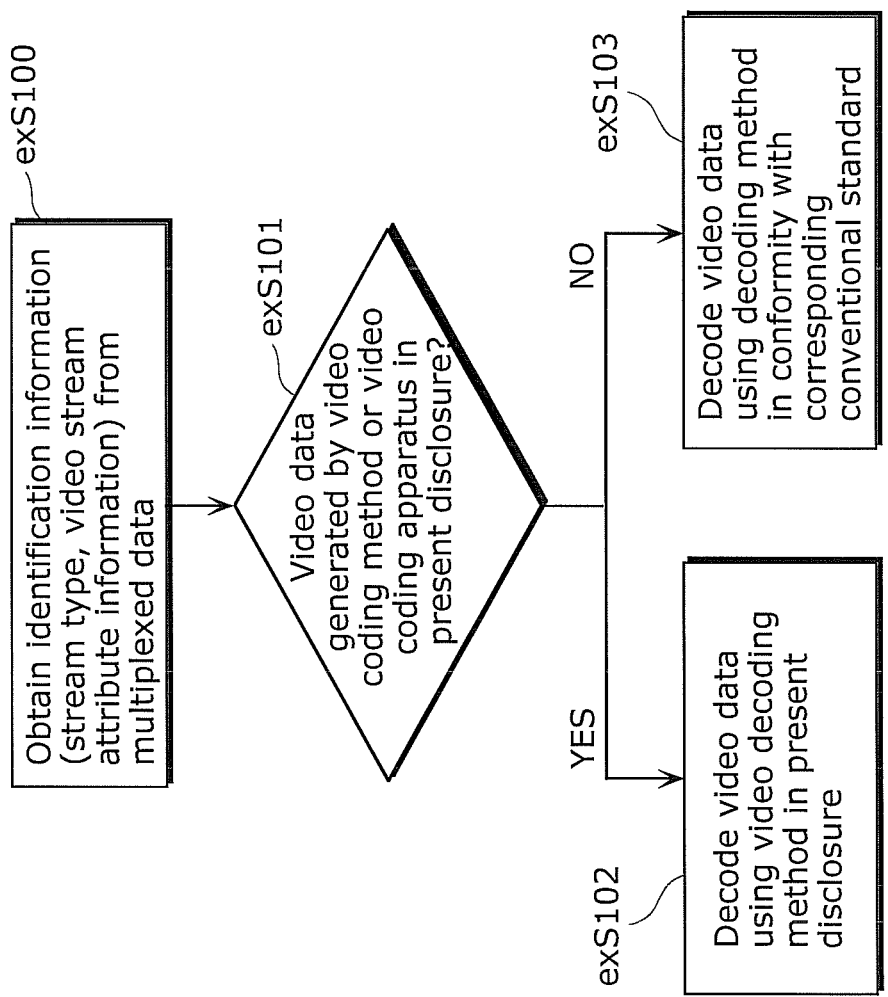
FIG. 53 shows steps for identifying video data.

Furthermore, FIG. 53 illustrates steps of the moving picture decoding method according to the present embodiment. In Step exS100, the stream type included in the PMT or the video stream attribute information included in the multiplexed data information is obtained from the multiplexed data. Next, in Step exS101, it is determined whether or not the stream type or the video stream attribute information indicates that the multiplexed data is generated by the moving picture coding method or the moving picture coding apparatus in each of embodiments. When it is determined that the stream type or the video stream attribute information indicates that the multiplexed data is generated by the moving picture coding method or the moving picture coding apparatus in each of embodiments, in Step exS102, decoding is performed by the moving picture decoding method in each of embodiments. Furthermore, when the stream type or the video stream attribute information indicates conformance to the conventional standards, such as MPEG-2, MPEG-4 AVC, and VC-1, in Step exS103, decoding is performed by a moving picture decoding method in conformity with the conventional standards.

As such, allocating a new unique value to the stream type or the video stream attribute information enables determination whether or not the moving picture decoding method or the moving picture decoding apparatus that is described in each of embodiments can perform decoding. Even when multiplexed data that conforms to a different standard is input, an appropriate decoding method or apparatus can be selected. Thus, it becomes possible to decode information without any error. Furthermore, the moving picture coding method or apparatus, or the moving picture decoding method or apparatus in the present embodiment can be used in the devices and systems described above.

Embodiment 7

Figure 54:
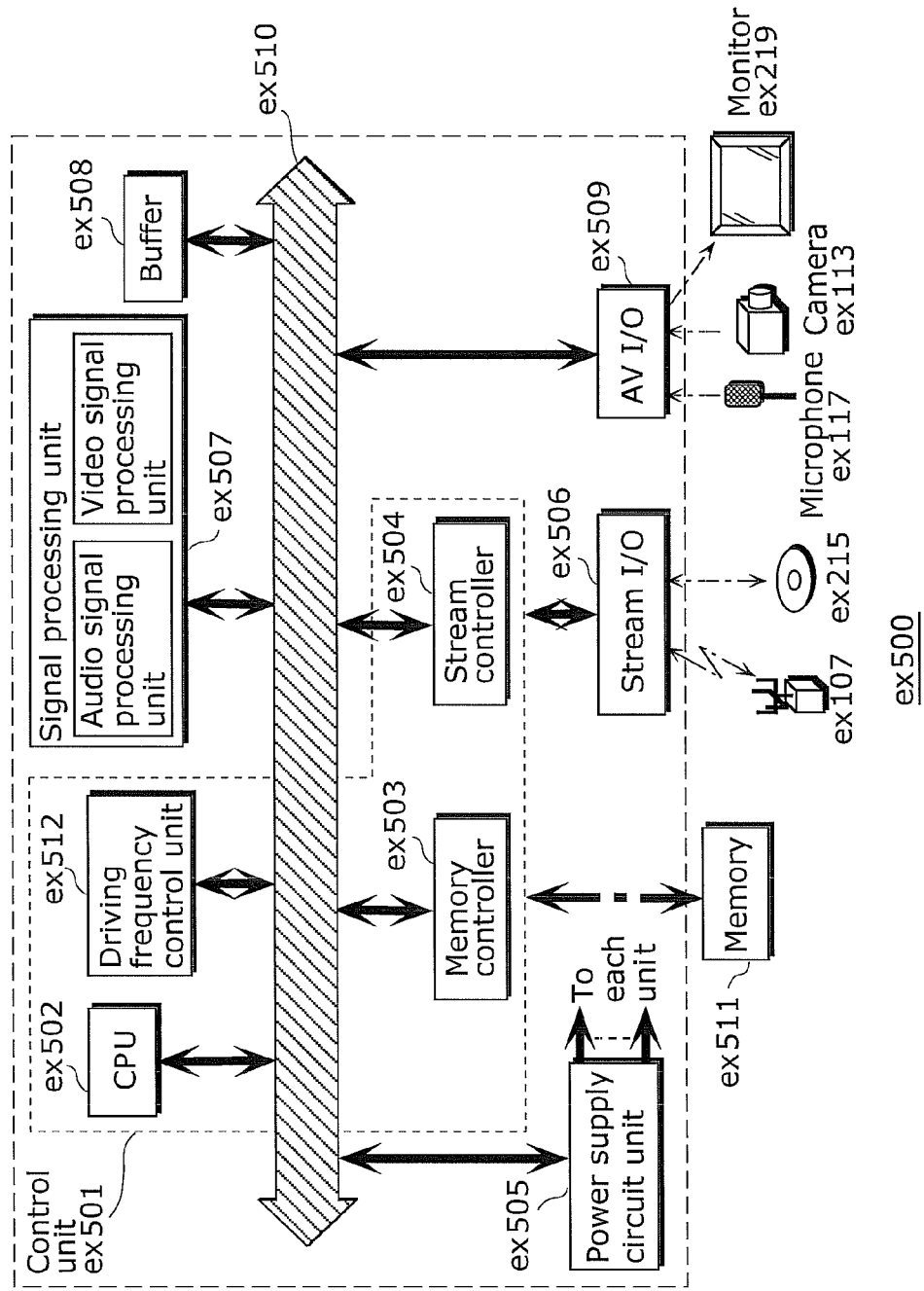
FIG. 54 shows an example of a configuration of an integrated circuit for implementing the moving picture coding method and the moving picture decoding method according to each of embodiments.

Each of the moving picture coding method, the moving picture coding apparatus, the moving picture decoding method, and the moving picture decoding apparatus in each of embodiments is typically achieved in the form of an integrated circuit or a Large Scale Integrated (LSI) circuit. As an example of the LSI, FIG. 54 illustrates a configuration of the LSI ex500 that is made into one chip. The LSI ex500 includes elements ex501, ex502, ex503, ex504, ex505, ex506, ex507, ex508, and ex509 to be described below, and the elements are connected to each other through a bus ex510. The power supply circuit unit ex505 is activated by supplying each of the elements with power when the power supply circuit unit ex505 is turned on.

For example, when coding is performed, the LSI ex500 receives an AV signal from a microphone ex117, a camera ex113, and others through an AV IO ex509 under control of a control unit ex501 including a CPU ex502, a memory controller ex503, a stream controller ex504, and a driving frequency control unit ex512. The received AV signal is temporarily stored in an external memory ex511, such as an SDRAM. Under control of the control unit ex501, the stored data is segmented into data portions according to the processing amount and speed to be transmitted to a signal processing unit ex507. Then, the signal processing unit ex507 codes an audio signal and/or a video signal. Here, the coding of the video signal is the coding described in each of embodiments. Furthermore, the signal processing unit ex507 sometimes multiplexes the coded audio data and the coded video data, and a stream IO ex506 provides the multiplexed data outside. The provided multiplexed data is transmitted to the base station ex107, or written on the recording medium ex215. When data sets are multiplexed, the data should be temporarily stored in the buffer ex508 so that the data sets are synchronized with each other.

Although the memory ex511 is an element outside the LSI ex500, it may be included in the LSI ex500. The buffer ex508 is not limited to one buffer, but may be composed of buffers. Furthermore, the LSI ex500 may be made into one chip or a plurality of chips.

Furthermore, although the control unit ex501 includes the CPU ex502, the memory controller ex503, the stream controller ex504, the driving frequency control unit ex512, the configuration of the control unit ex501 is not limited to such.

For example, the signal processing unit ex507 may further include a CPU. Inclusion of another CPU in the signal processing unit ex507 can improve the processing speed. Furthermore, as another example, the CPU ex502 may serve as or be a part of the signal processing unit ex507, and, for example, may include an audio signal processing unit. In such a case, the control unit ex501 includes the signal processing unit ex507 or the CPU ex502 including a part of the signal processing unit ex507.

The name used here is LSI, but it may also be called IC, system LSI, super LSI, or ultra LSI depending on the degree of integration.

Moreover, ways to achieve integration are not limited to the LSI, and a special circuit or a general purpose processor and so forth can also achieve the integration. Field Programmable Gate Array (FPGA) that can be programmed after manufacturing LSIs or a reconfigurable processor that allows re-configuration of the connection or configuration of an LSI can be used for the same purpose.

In the future, with advancement in semiconductor technology, a brand-new technology may replace LSI. The functional blocks can be integrated using such a technology. The possibility is that the present disclosure is applied to biotechnology.

Embodiment 8

When video data generated in the moving picture coding method or by the moving picture coding apparatus described in each of embodiments is decoded, compared to when video data that conforms to a conventional standard, such as MPEG-2, MPEG-4 AVC, and VC-1 is decoded, the processing amount probably increases. Thus, the LSI ex500 needs to be set to a driving frequency higher than that of the CPU ex502 to be used when video data in conformity with the conventional standard is decoded. However, when the driving frequency is set higher, there is a problem that the power consumption increases.

Figure 55:
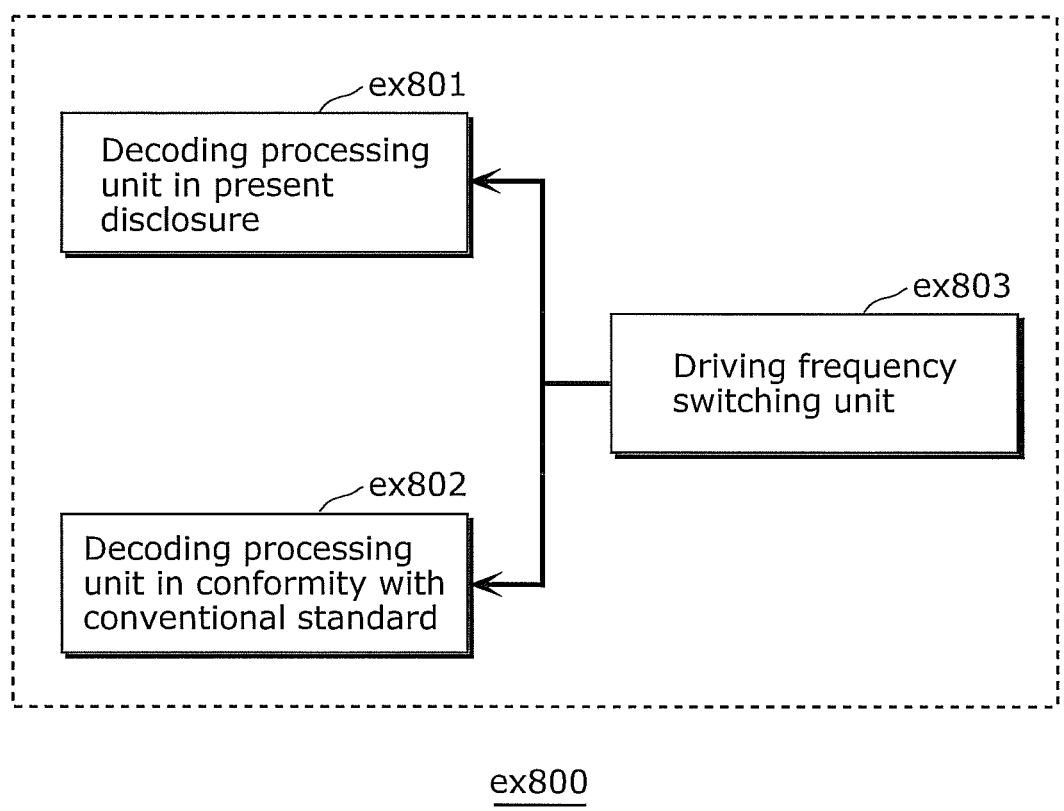
FIG. 55 shows a configuration for switching between driving frequencies.

In order to solve the problem, the moving picture decoding apparatus, such as the television ex300 and the LSI ex500 is configured to determine to which standard the video data conforms, and switch between the driving frequencies according to the determined standard. FIG. 55 illustrates a configuration ex800 in the present embodiment. A driving frequency switching unit ex803 sets a driving frequency to a higher driving frequency when video data is generated by the moving picture coding method or the moving picture coding apparatus described in each of embodiments. Then, the driving frequency switching unit ex803 instructs a decoding processing unit ex801 that executes the moving picture decoding method described in each of embodiments to decode the video data. When the video data conforms to the conventional standard, the driving frequency switching unit ex803 sets a driving frequency to a lower driving frequency than that of the video data generated by the moving picture coding method or the moving picture coding apparatus described in each of embodiments. Then, the driving frequency switching unit ex803 instructs the decoding processing unit ex802 that conforms to the conventional standard to decode the video data.

More specifically, the driving frequency switching unit ex803 includes the CPU ex502 and the driving frequency control unit ex512 in FIG. 54. Here, each of the decoding processing unit ex801 that executes the moving picture decoding method described in each of embodiments and the decoding processing unit ex802 that conforms to the conventional standard corresponds to the signal processing unit ex507 in FIG. 54. The CPU ex502 determines to which standard the video data conforms. Then, the driving frequency control unit ex512 determines a driving frequency based on a signal from the CPU ex502. Furthermore, the signal processing unit ex507 decodes the video data based on the signal from the CPU ex502. For example, the identification information described in Embodiment 6 is probably used for identifying the video data. The identification information is not limited to the one described in Embodiment 6 but may be any information as long as the information indicates to which standard the video data conforms. For example, when which standard video data conforms to can be determined based on an external signal for determining that the video data is used for a television or a disk, etc., the determination may be made based on such an external signal. Furthermore, the CPU ex502 selects a driving frequency based on, for example, a look-up table in which the standards of the video data are associated with the driving frequencies as shown in FIG. 57. The driving frequency can be selected by storing the look-up table in the buffer ex508 and in an internal memory of an LSI, and with reference to the look-up table by the CPU ex502.

Figure 56:
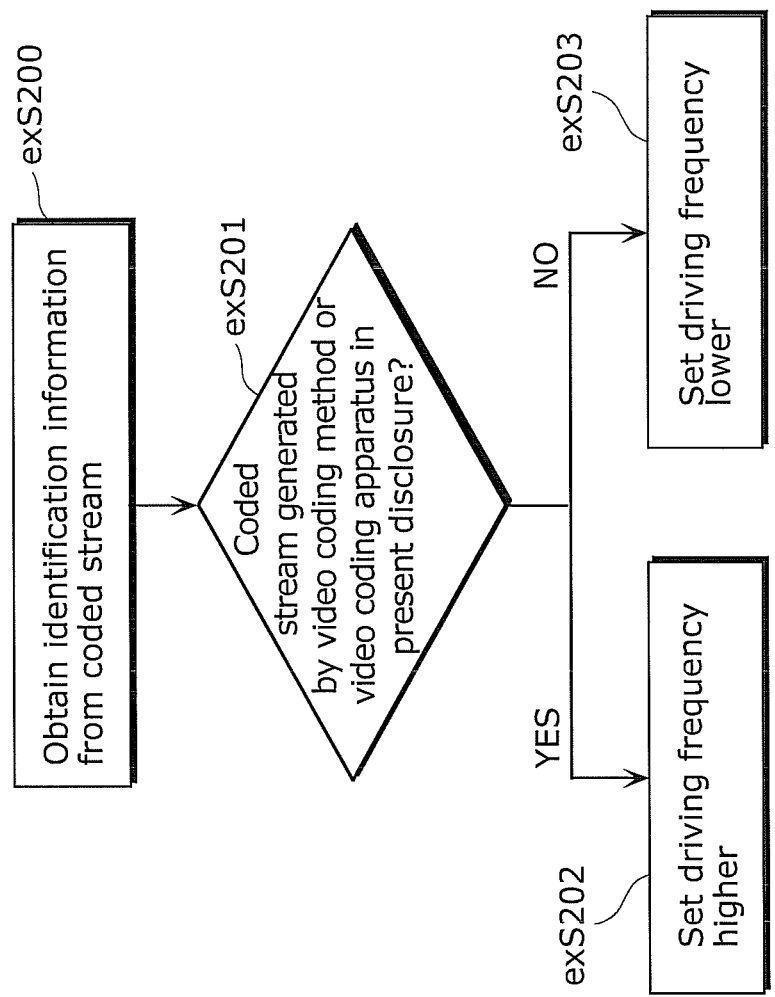
FIG. 56 shows steps for identifying video data and switching between driving frequencies.

FIG. 56 illustrates steps for executing a method in the present embodiment. First, in Step exS200, the signal processing unit ex507 obtains identification information from the multiplexed data. Next, in Step exS201, the CPU ex502 determines whether or not the video data is generated by the coding method and the coding apparatus described in each of embodiments, based on the identification information. When the video data is generated by the moving picture coding method and the moving picture coding apparatus described in each of embodiments, in Step exS202, the CPU ex502 transmits a signal for setting the driving frequency to a higher driving frequency to the driving frequency control unit ex512. Then, the driving frequency control unit ex512 sets the driving frequency to the higher driving frequency. On the other hand, when the identification information indicates that the video data conforms to the conventional standard, such as MPEG-2, MPEG-4 AVC, and VC-1, in Step exS203, the CPU ex502 transmits a signal for setting the driving frequency to a lower driving frequency to the driving frequency control unit ex512. Then, the driving frequency control unit ex512 sets the driving frequency to the lower driving frequency than that in the case where the video data is generated by the moving picture coding method and the moving picture coding apparatus described in each of embodiment.

Furthermore, along with the switching of the driving frequencies, the power conservation effect can be improved by changing the voltage to be applied to the LSI ex500 or an apparatus including the LSI ex500. For example, when the driving frequency is set lower, the voltage to be applied to the LSI ex500 or the apparatus including the LSI ex500 is probably set to a voltage lower than that in the case where the driving frequency is set higher.

Furthermore, when the processing amount for decoding is larger, the driving frequency may be set higher, and when the processing amount for decoding is smaller, the driving frequency may be set lower as the method for setting the driving frequency. Thus, the setting method is not limited to the ones described above. For example, when the processing amount for decoding video data in conformity with MPEG-4 AVC is larger than the processing amount for decoding video data generated by the moving picture coding method and the moving picture coding apparatus described in each of embodiments, the driving frequency is probably set in reverse order to the setting described above.

Furthermore, the method for setting the driving frequency is not limited to the method for setting the driving frequency lower. For example, when the identification information indicates that the video data is generated by the moving picture coding method and the moving picture coding apparatus described in each of embodiments, the voltage to be applied to the LSI ex500 or the apparatus including the LSI ex500 is probably set higher. When the identification information indicates that the video data conforms to the conventional standard, such as MPEG-2, MPEG-4 AVC, and VC-1, the voltage to be applied to the LSI ex500 or the apparatus including the LSI ex500 is probably set lower. As another example, when the identification information indicates that the video data is generated by the moving picture coding method and the moving picture coding apparatus described in each of embodiments, the driving of the CPU ex502 does not probably have to be suspended. When the identification information indicates that the video data conforms to the conventional standard, such as MPEG-2, MPEG-4 AVC, and VC-1, the driving of the CPU ex502 is probably suspended at a given time because the CPU ex502 has extra processing capacity. Even when the identification information indicates that the video data is generated by the moving picture coding method and the moving picture coding apparatus described in each of embodiments, in the case where the CPU ex502 has extra processing capacity, the driving of the CPU ex502 is probably suspended at a given time. In such a case, the suspending time is probably set shorter than that in the case where when the identification information indicates that the video data conforms to the conventional standard, such as MPEG-2, MPEG-4 AVC, and VC-1.

Accordingly, the power conservation effect can be improved by switching between the driving frequencies in accordance with the standard to which the video data conforms. Furthermore, when the LSI ex500 or the apparatus including the LSI ex500 is driven using a battery, the battery life can be extended with the power conservation effect.

Embodiment 9

There are cases where a plurality of video data that conforms to different standards, is provided to the devices and systems, such as a television and a cellular phone. In order to enable decoding the plurality of video data that conforms to the different standards, the signal processing unit ex507 of the LSI ex500 needs to conform to the different standards. However, the problems of increase in the scale of the circuit of the LSI ex500 and increase in the cost arise with the individual use of the signal processing units ex507 that conform to the respective standards.

Figure 58A:
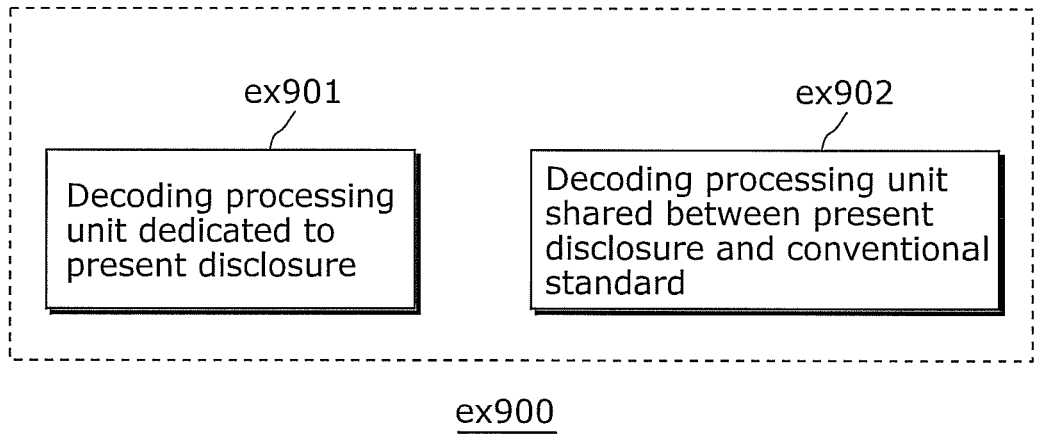
FIG. 58A is a diagram showing an example of a configuration for sharing a module of a signal processing unit.

In order to solve the problem, what is conceived is a configuration in which the decoding processing unit for implementing the moving picture decoding method described in each of embodiments and the decoding processing unit that conforms to the conventional standard, such as MPEG-2, MPEG-4 AVC, and VC-1 are partly shared. Ex900 in FIG. 58A shows an example of the configuration. For example, the moving picture decoding method described in each of embodiments and the moving picture decoding method that conforms to MPEG-4 AVC have, partly in common, the details of processing, such as entropy coding, inverse quantization, deblocking filtering, and motion compensated prediction. The details of processing to be shared probably include use of a decoding processing unit ex902 that conforms to MPEG-4 AVC. In contrast, a dedicated decoding processing unit ex901 is probably used for other processing which is unique to an aspect of the present disclosure and does not conform to MPEG-4 AVC. Since the aspect of the present disclosure is characterized by entropy decoding in particular, for example, the dedicated decoding processing unit ex901 is used for entropy decoding. Otherwise, the decoding processing unit is probably shared for one of the inverse quantization, deblocking filtering, and motion compensation, or all of the processing. The decoding processing unit for implementing the moving picture decoding method described in each of embodiments may be shared for the processing to be shared, and a dedicated decoding processing unit may be used for processing unique to that of MPEG-4 AVC.

Figure 58B:
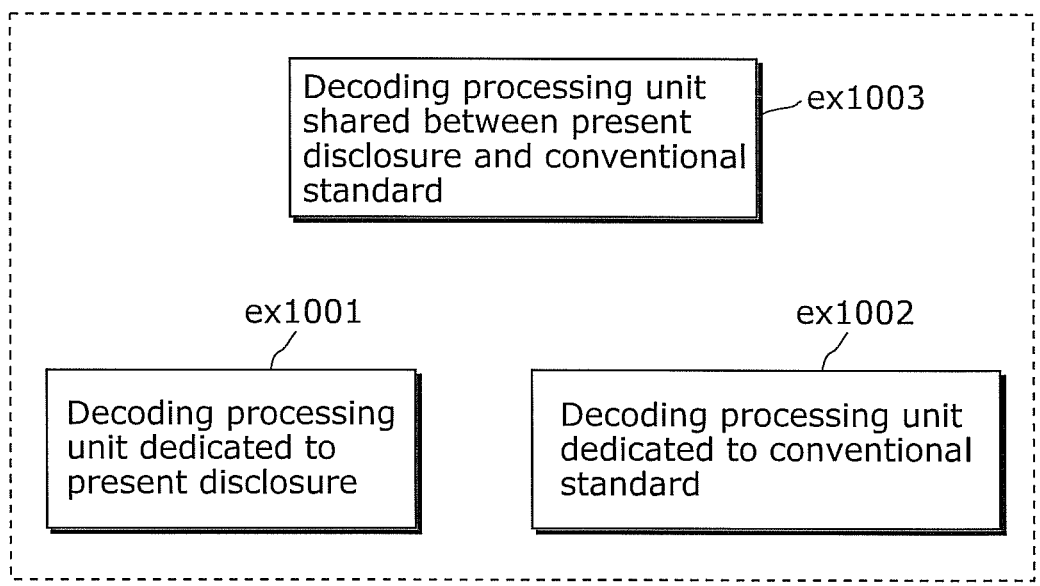
FIG. 58B is a diagram showing another example of a configuration for sharing a module of the signal processing unit.

Furthermore, ex1000 in FIG. 58B shows another example in that processing is partly shared. This example uses a configuration including a dedicated decoding processing unit ex1001 that supports the processing unique to an aspect of the present disclosure, a dedicated decoding processing unit ex1002 that supports the processing unique to another conventional standard, and a decoding processing unit ex1003 that supports processing to be shared between the moving picture decoding method according to the aspect of the present disclosure and the conventional moving picture decoding method. Here, the dedicated decoding processing units ex1001 and ex1002 are not necessarily specialized for the processing according to the aspect of the present disclosure and the processing of the conventional standard, respectively, and may be the ones capable of implementing general processing. Furthermore, the configuration of the present embodiment can be implemented by the LSI ex500.

As such, reducing the scale of the circuit of an LSI and reducing the cost are possible by sharing the decoding processing unit for the processing to be shared between the moving picture decoding method according to the aspect of the present disclosure and the moving picture decoding method in conformity with the conventional standard.

INDUSTRIAL APPLICABILITY

The present disclosure can be applied to image coding methods, image decoding methods, image coding apparatuses, and image decoding apparatuses. The present disclosure is also applicable to high-resolution information display apparatuses or imaging apparatuses such as television sets, digital video recorders, in-vehicle navigation systems, portable phones, digital cameras, and digital camcorders, each of which includes an image coding apparatus.

The invention claimed is:

1. An image coding method using a arithmetic coding, the image coding method
    comprising:
    performing arithmetic coding on a first flag that indicates whether or not an absolute value of a target coefficient in a target coefficient block is greater than 1; and
    performing arithmetic coding on a second flag that indicates whether or not the absolute value is greater than 2,
    wherein, in the performing of the arithmetic coding on the first flag and the performing of the arithmetic coding on the second flag, it is determined whether or not an immediately-prior coefficient block that has been coded immediately prior to the target coefficient block includes a coefficient having an absolute value greater than a threshold value, and a context to be used in the arithmetic coding on the first flag and a context to be used in the arithmetic coding on the second flag are selected based on a result of the determination, and wherein the threshold value is 1.

2. The image coding method according to claim 1,
wherein in the performing of the arithmetic coding on the first flag and the performing of the arithmetic coding on the second flag, the determination is made based on a variable generated in arithmetic coding on the immediately-prior coefficient block.

3. The image coding method according to claim 2, further comprising binarizing a remainder according to a transform table designated by a binarization parameter from among a plurality of transform tables, when the absolute value of the target coefficient is greater than 2, the remainder being a value obtained by subtracting 3 from the absolute value,
wherein the binarization parameter is determined according to whether or not the immediately-prior coefficient block includes a coefficient having an absolute value greater than the threshold value, and
wherein the variable is the binarization parameter.

4. An apparatus comprising:
control circuitry; and
storage accessible from the control circuitry,
wherein the storage working control circuitry cause the apparatus to perform at least the following:
arithmetic encoding of a first flag that indicates whether or not an absolute value of a target coefficient in a target coefficient block is greater than 1; and
arithmetic encoding of a second flag that indicates whether or not the absolute value is greater than 2,
wherein, in the arithmetic coding of the first flag and the arithmetic coding of the second flag, it is determined whether or not an immediately-prior coefficient block that has been encoded immediately prior to the target coefficient block includes a coefficient having an absolute value greater than a threshold value, and a context to be used in the arithmetic encoding of the first flag and a context to be used in the arithmetic encoding of the second flag are selected based on a result of the determination, and
wherein the threshold value is 1.

5. An apparatus, comprising:
control circuitry; and
storage accessible from the control circuitry,
wherein the control circuitry performs:
arithmetic decoding of a first flag that indicates whether or not an absolute value of a target coefficient in a target coefficient block is greater than 1; and
arithmetic decoding of a second flag that indicates whether or not the absolute value is greater than 2,
wherein, in the arithmetic decoding of the first flag and the arithmetic decoding of the second flag, it is determined whether or not an immediately prior coefficient block that has been decoded immediately prior to the target coefficient block includes a coefficient having an absolute value greater than a threshold value, and a context to be used in the arithmetic decoding of the first flag and a context to be used in the arithmetic decoding of the second flag are selected based on a result of the determination, and
wherein the threshold value is 1.

6. The apparatus according to claim 4,
wherein in the performing of the arithmetic encoding of the first flag and the performing of the arithmetic coding of the second flag, the determination is made based on a variable generated in arithmetic coding on the immediately-prior coefficient block.

7. The apparatus according to claim 4, wherein the storage working with the control circuitry cause the apparatus to further perform:
binarizing a remainder according to a transform table designated by a binarization parameter from among a plurality of transform tables, when the absolute value of the target coefficient is greater than 2, the remainder being a value obtained by subtracting 3 from the absolute value,
wherein the binarization parameter is determined according to whether or not the immediately-prior coefficient block includes a coefficient having an absolute value Greater than the threshold value, and
wherein the variable is the binarization parameter.

* * * * *

UNITED STATES PATENT AND TRADEMARK OFFICE
CERTIFICATE OF CORRECTION

PATENT NO. : 9,924,202 B2
APPLICATION NO. : 15/373818
DATED : March 20, 2018
INVENTOR(S) : Terada et al.

Page 1 of 1

It is certified that error appears in the above-identified patent and that said Letters Patent is hereby corrected as shown below:

In the Specification

Column 8, Line 32, change "vale" to --value--

Column 8, Line 33, change "vale" to --value--

Column 8, Line 39, change "vale" to --value--

Column 8, Line 40, change "vale" to --value--

Column 20, Line 23, change "Maltivalue" to --Multivalue--

Column 20, Line 25, change "maltivalue" to --multivalue--

In the Claims

Claim 1, Column 42, Line 53, change "a arithmetic" to --arithmetic--

Claim 4, Column 43, Line 26, change "working control circuitry" to --working with the control circuitry--

Claim 7, Column 44, Line 40, change "Greater" to --greater--

Signed and Sealed this
Sixth Day of November, 2018

Andrei Iancu
*Director of the United States Patent and Trademark Office*